United States Patent
Kinoshita et al.

(10) Patent No.: US 9,299,960 B2
(45) Date of Patent: Mar. 29, 2016

(54) ELECTRONIC DEVICE MANUFACTURING APPARATUS

(71) Applicant: Konica Minolta, Inc., Tokyo (JP)

(72) Inventors: Toshiyuki Kinoshita, Hino (JP); Takeshi Hakii, Sagamihara (JP); Hiroshi Ishidai, Hachioji (JP); Kazuhiro Yoshida, Hachioji (JP); Minako Ono, Hachioji (JP); Takatoshi Tsujimura, Fujisawa (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/395,861

(22) PCT Filed: Apr. 26, 2013

(86) PCT No.: PCT/JP2013/062413
§ 371 (c)(1),
(2) Date: Oct. 21, 2014

(87) PCT Pub. No.: WO2013/162004
PCT Pub. Date: Oct. 31, 2013

(65) Prior Publication Data
US 2015/0128855 A1    May 14, 2015

(30) Foreign Application Priority Data

Apr. 27, 2012  (JP) ................. 2012-102285

(51) Int. Cl.
*B05B 7/06* (2006.01)
*B05C 5/00* (2006.01)
*H01L 51/56* (2006.01)
(Continued)

(52) U.S. Cl.
CPC .............. *H01L 51/56* (2013.01); *B05C 13/00* (2013.01); *C23C 14/12* (2013.01); *C23C 14/18* (2013.01); *C23C 14/20* (2013.01); *C23C 14/568* (2013.01); *H01L 51/5206* (2013.01);
(Continued)

(58) Field of Classification Search
USPC ................. 118/313–315, 325, 302; 257/40
See application file for complete search history.

(56) References Cited

U.S. PATENT DOCUMENTS

2011/0057920 A1    3/2011  Matsuura et al.
2011/0260152 A1*  10/2011  Nakayama et al. ............ 257/40
2012/0319094 A1*  12/2012  Furukawa et al. ............. 257/40

FOREIGN PATENT DOCUMENTS

JP   2002-015623 A   1/2002
JP   2006-049222 A   2/2006
(Continued)

*Primary Examiner* — Yewebdar Tadesse
(74) *Attorney, Agent, or Firm* — Lucas & Mercanti, LLP

(57) ABSTRACT

The electronic device manufacturing apparatus is provided with: a substrate holding member; a first supply source which is provided so as to move relative to the primary surface side of the substrate, and which forms a nitrogen-containing layer by supplying a nitrogen-containing compound towards the primary surface of the substrate; and a second supply source which is disposed downstream of the first supply source in the direction of movement relative to the substrate, which forms a transparent electrode layer by supplying towards the primary surface of the substrate an electrode material having silver as the main component thereof, and which is disposed such that, between starting formation and two minutes after finishing formation of the nitrogen-containing layer at a prescribed position on the substrate, formation of the transparent electrode layer is started at said prescribed position on the substrate.

6 Claims, 12 Drawing Sheets

(51) Int. Cl.
  *H01L 51/52* (2006.01)
  *C23C 14/12* (2006.01)
  *C23C 14/18* (2006.01)
  *C23C 14/20* (2006.01)
  *C23C 14/56* (2006.01)
  *B05C 13/00* (2006.01)
(52) U.S. Cl.
  CPC ....... *H01L 51/5212* (2013.01); *H01L 51/5215* (2013.01); *H01L 51/5234* (2013.01)

(56) References Cited

FOREIGN PATENT DOCUMENTS

| | | |
|---|---|---|
| JP | 2006-164961 A | 6/2006 |
| JP | 2009-151963 A | 7/2009 |
| JP | 2011-077028 A | 4/2011 |
| WO | WO2013/073356 A1 | 5/2013 |
| WO | WO2013/099867 A1 | 7/2013 |

* cited by examiner

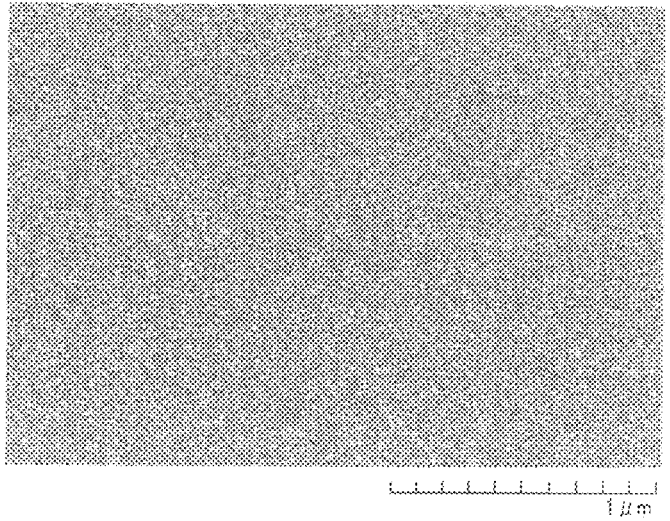
FIG. 16  SAMPLE 1-1 COMPOUND 10 (1min, 8nm)
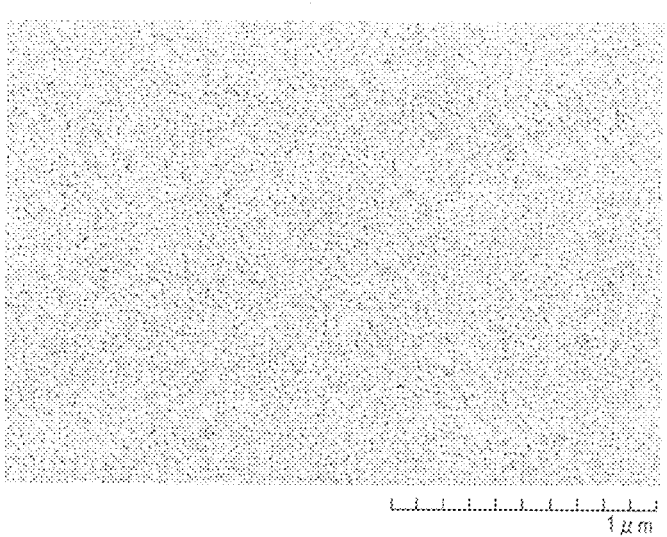
FIG. 17  SAMPLE 1-2 COMPOUND 10 (2min, 8nm)
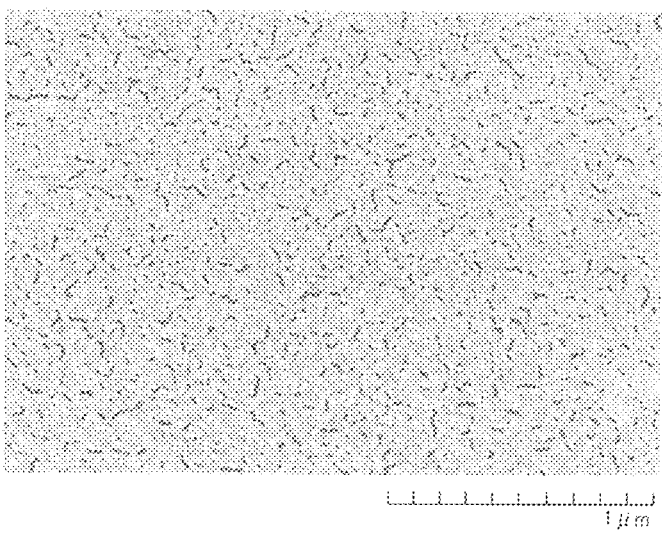
FIG. 18  SAMPLE 1-3 COMPOUND 10 (10min, 8nm)

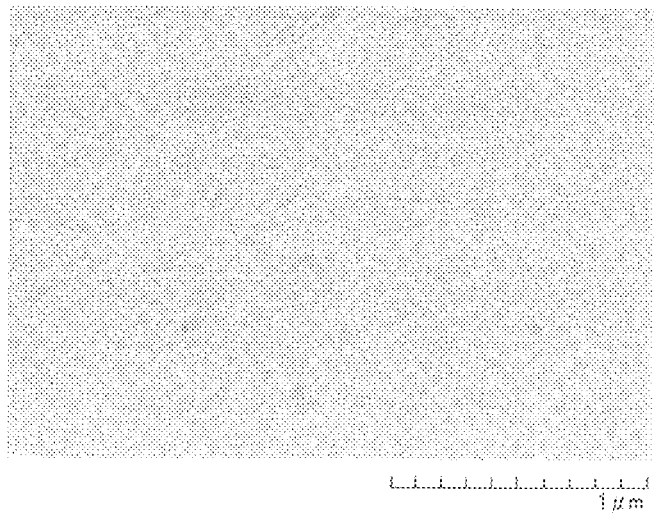
FIG. 19 SAMPLE 1-4 COMPOUND 94 (1min, 12nm)
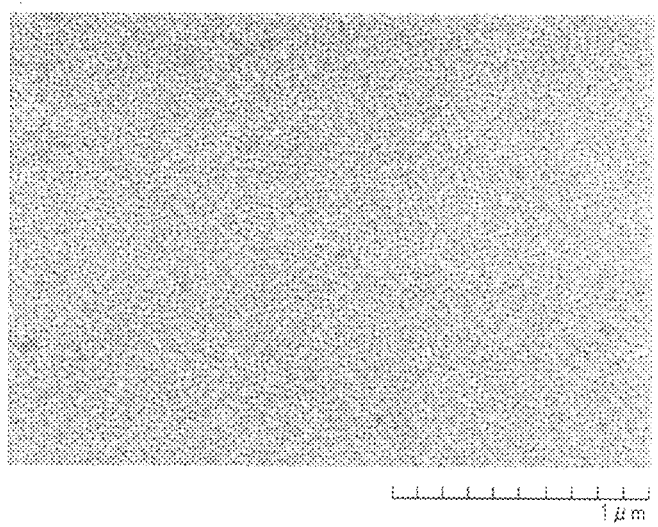
FIG. 20 SAMPLE 1-5 COMPOUND 94 (2min, 12nm)
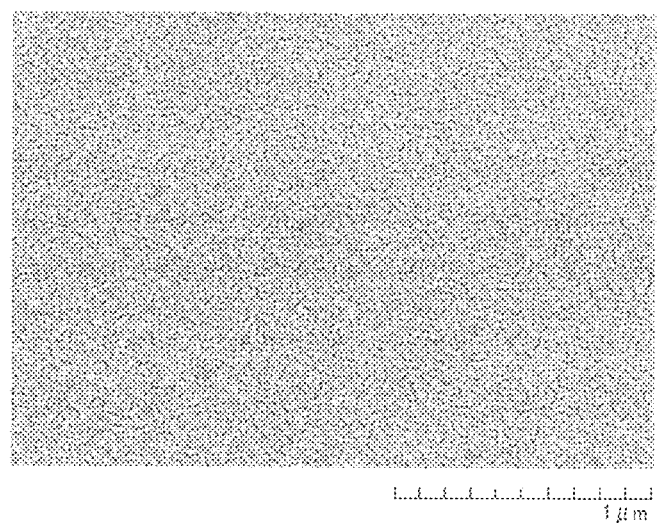
FIG. 21 SAMPLE 1-6 COMPOUND 94 (10min, 12nm)

FIG. 22 SAMPLE 1-7
COMPOUND 99
(1min, 12nm)
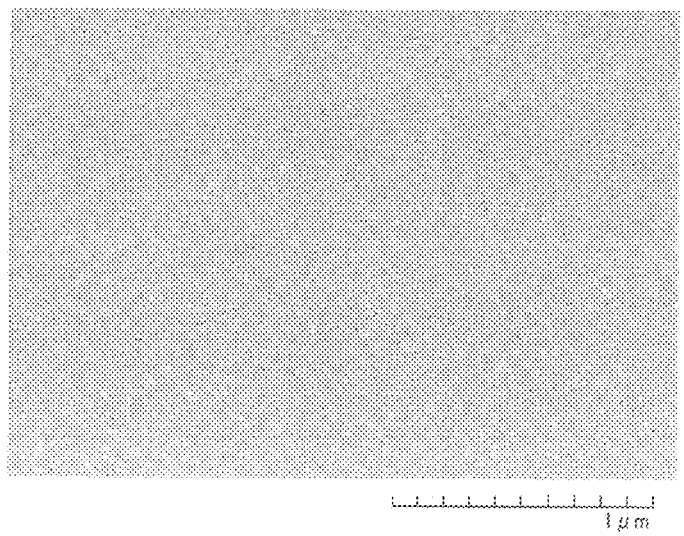
FIG. 23 SAMPLE 1-8
COMPOUND 99
(2min, 12nm)
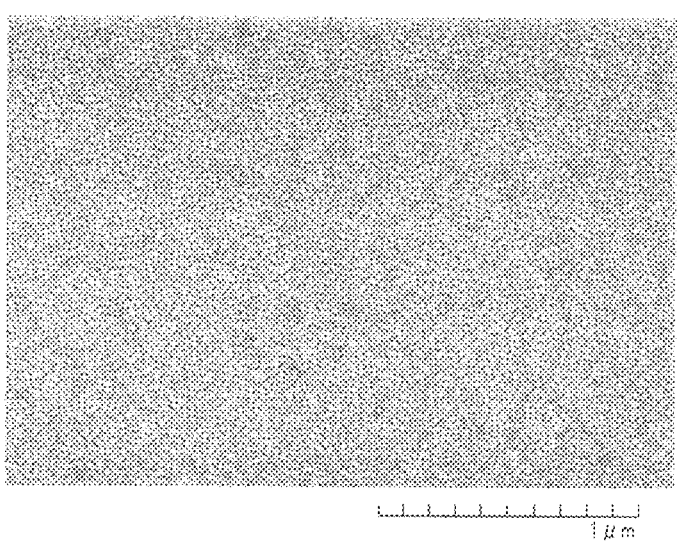
FIG. 24 SAMPLE 1-9
COMPOUND 99
(10min, 12nm)
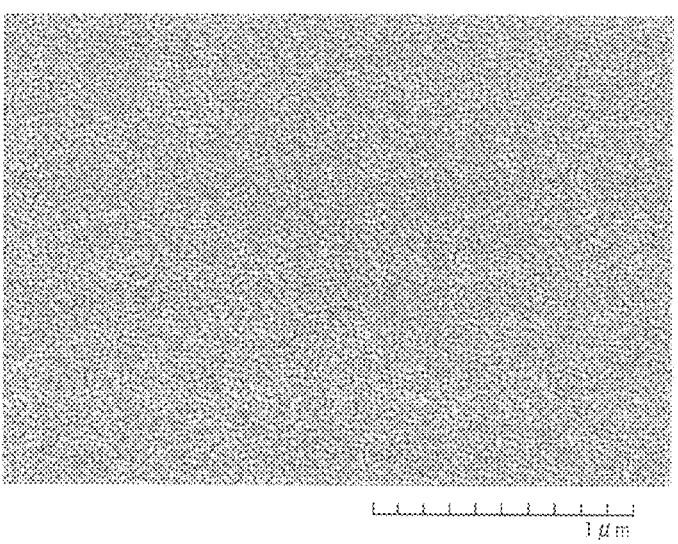

US 9,299,960 B2

ELECTRONIC DEVICE MANUFACTURING APPARATUS

CROSS REFERENCE TO RELATED APPLICATION

This Application is a 371 of PCT/JP2013/062413 filed on Apr. 26, 2013 which, in turn, claimed the priority of Japanese Patent Application No. JP2012-102285 filed on Apr. 27, 2012, both applications are incorporated herein by reference.

TECHNICAL FIELD

The present invention relates to an electronic device manufacturing apparatus, particularly relates to a manufacturing apparatus of an electronic device including a transparent electrode having both electrical conductivity and light transmission property.

BACKGROUND ART

An organic electroluminescent element (hereinafter, referred to as "organic EL element") utilizing electroluminescence (hereinafter, referred to as "EL") of an organic material is a thin-film type completely-solid state element capable of emitting light at a low voltage of several volts to several ten volts, and has many excellent features such as high luminance, high light emission efficiency, small thickness and light weight. Accordingly, in recent years, the element has attracted attention, as backlights for various kinds of displays, display boards such as a signboard and an emergency lamp, and surface emitting bodies such as illumination light sources.

Such an organic electroluminescent element has a configuration obtained by holding a light emitting layer formed of an organic material between two electrodes, the emitted light generated in the light emitting layer is extracted to the outside through the electrode. Therefore, at least one of the two electrodes is constituted as a transparent electrode.

As the transparent electrode, there is used generally a material of an oxide semiconductor type such as indium tin oxide ($SnO_2$-$In_2O_3$:Indium Tin Oxide:ITO), and examination aiming at lowering electric resistance by laminating ITO and silver has been carried out (e.g. referring to the following Patent Literatures 1, 2). However, ITO has a high raw cost because of using a rare metal indium, and is required to be subjected to annealing treatment at about 300° C. after film formation in order to lower its electric resistance. Accordingly, there have been proposed a configuration in which a metallic material such as silver having a high electrical conductivity is made into a thin film, and a configuration in which an electrical conductivity is ensured even at a film thickness smaller than that of silver alone by blending aluminum with silver (for example, referring to the following Patent Literature 3).

CITATION LIST

Patent Literature

PTL 1: Japanese Patent Laid-Open No. 2002-15623has
PTL 2: Japanese Patent Laid-Open No. 2006-164961
PTL 3: Japanese Patent Laid-Open No. 2009-151963

SUMMARY OF INVENTION

Technical Problem

However, even in a transparent electrode constituted using silver and aluminum having a high electrical conductivity, it has been difficult to attain both of sufficient electrical conductivity and light transmission property, and this has been a factor hindering performance improvement in an electronic device such as the organic electroluminescent element.

Accordingly, an object of the present invention is to provide a manufacturing apparatus of an electronic device in which a transparent electrode having both of sufficient conductivity and light transmission property can be formed.

Solution to Problem

The above object of the present invention is achieved by the following configuration.

1. An electronic device manufacturing apparatus including:
   a holding member holding a substrate;
   a first supply source which is provided in a state of moving relative to the substrate on a primary surface side of the substrate in a surface direction of the substrate, and which is also provided for forming a nitrogen-containing layer on a primary surface of the substrate by supplying a nitrogen-containing compound toward the primary surface of the substrate; and
   a second supply source which is provided on a downstream side of the first supply source in a relative movement direction of the substrate, and which is also provided for forming a transparent electrode layer on the primary surface side of the substrate by supplying an electrode material mainly containing silver toward the primary surface of the substrate, wherein spacing between the first supply source and the second supply source is kept so that the formation of the transparent electrode layer is started at a prescribed position on the substrate between starting formation and two minutes after finishing formation of the nitrogen-containing layer at the prescribed position.

2. The electronic device manufacturing apparatus according to the above-mentioned 1, wherein
   relative movement speed between the substrate and the first supply source and second supply source is set to a speed at which the transparent electrode layer is formed in a thickness of 12 nm or less.

3. The electronic device manufacturing apparatus according to the above-mentioned 1 or 2, wherein
   the substrate and the first supply source and second supply source move relatively in one direction at a speed of v, and
   the first supply source and the second supply source are disposed so that spacing d1 between a supply region of the nitrogen-containing compound and a supply region of the electrode material on the primary surface of the substrate holds $d1 \leq v \times 2$ minutes.

4. The electronic device manufacturing apparatus according to any of the above-mentioned 1 to 3, further including
   another supply source that supplies a light emitting functional material toward the primary surface of the substrate, at least on one side of an upstream side of the first supply source in the relative movement direction of the substrate and a downstream side of the second supply source in the relative movement direction of the substrate.

5. The electronic device manufacturing apparatus according to any of the above-mentioned 1 to 4, wherein
   the holding member holds the substrate along a circumference, and
   the first supply source and the second supply source are disposed along another circumference concentric with the circumference.

According to the electronic device manufacturing apparatus constituted as described above, it becomes possible to form a transparent electrode layer constituted of silver or an alloy mainly containing silver adjacent to a nitrogen-containing layer constituted using a nitrogen-containing compound. Therefore, when the transparent electrode layer is formed adjacent to the nitrogen-containing layer, silver atoms constituting the transparent electrode layer interact with the compound containing nitrogen atoms constituting the nitrogen-containing layer, and the transparent electrode layer is easily constituted as a continuous silver film without agglomeration of silver.

Furthermore, in particular, the transparent electrode layer is a layer in which the formation is started adjacent to the nitrogen-containing layer between starting the formation and two minutes after finishing the formation of the nitrogen-containing layer. Thereby, as will be explained in the following example, it is confirmed that the transparent electrode layer is constituted as a film having a high continuity. Accordingly, it becomes possible to form a transparent electrode film having a high continuity in spite of a thin film.

Advantageous Effects of Invention

As explained above, according to the electronic device manufacturing apparatus of the present invention, it becomes possible to form a transparent electrode film having a high continuity in spite of a thin film, and thus it becomes possible to produce an electronic device in which a transparent electrode having both of sufficient conductivity and light transmission property can be formed.

BRIEF DESCRIPTION OF DRAWINGS

FIG. 16 is a SEM image of a transparent electrode in sample 1-1 produced in example 1.

FIG. 17 is a SEM image of a transparent electrode in sample 1-2 produced in example 1.

FIG. 18 is a SEM image of a transparent electrode in sample 1-3 produced in example 1.

FIG. 19 is a SEM image of a transparent electrode in sample 1-4 produced in example 1.

FIG. 20 is a SEM image of a transparent electrode in sample 1-5 produced in example 1.

FIG. 21 is a SEM image of a transparent electrode in sample 1-6 produced in example 1.

FIG. 22 is a SEM image of a transparent electrode in sample 1-7 produced in example 1.

FIG. 23 is a SEM image of a transparent electrode in sample 1-8 produced in example 1.

FIG. 24 is a SEM image of a transparent electrode in sample 1-9 produced in example 1.

DESCRIPTION OF EMBODIMENTS

Figure 1:
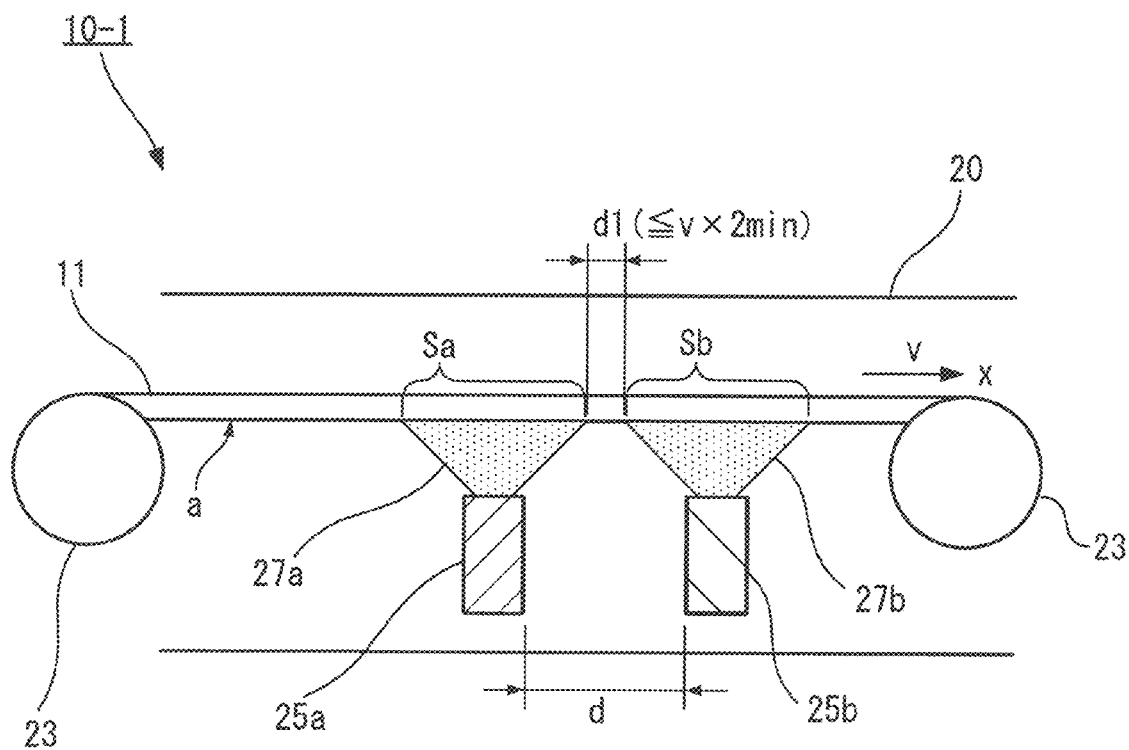
FIG. 1 is a schematic view showing a configuration of an electronic device manufacturing apparatus in a first embodiment.

Hereinafter, embodiments of the present invention will be explained through the use of the drawings in the following order.

1. Electronic device manufacturing apparatus in a first embodiment
2. Modification 1 of the first embodiment
3. Modification 2 of the first embodiment
4. Electronic device manufacturing apparatus in a second embodiment
5. Modification of the second embodiment
6. First example of an organic electroluminescent element produced using a manufacturing apparatus in the embodiments
7. Second example of an organic electroluminescent element produced using a manufacturing apparatus in the embodiments
8. Electronic device manufacturing apparatus in a third embodiment
9. Modification of the third embodiment
10. Electronic device manufacturing apparatus in a fourth embodiment
11. Electronic device manufacturing apparatus in a fifth embodiment Meanwhile, in each of the embodiments and modifications thereof, the same sign is attached to the same constituent element and duplicated explanation will be omitted.

<<1. Electronic Device Manufacturing Device in a First Embodiment>>

Figure 2:
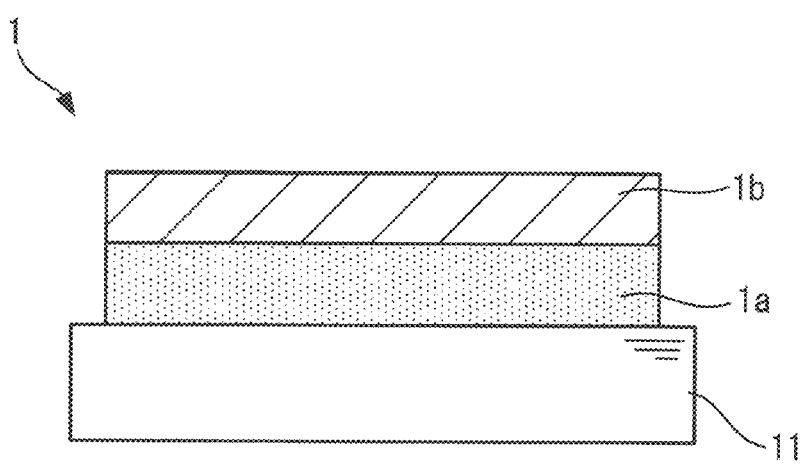
FIG. 2 is a schematic cross-sectional view of an electronic device (transparent electrode) produced by a manufacturing apparatus in a first embodiment.

FIG. 1 is a schematic view showing an electronic device manufacturing apparatus in a first embodiment. Furthermore, FIG. 2 is a schematic cross-sectional view of an electronic device (transparent electrode) produced using the manufacturing apparatus 10-1. Hereinafter, the manufacturing apparatus 10-1 in the first embodiment will be explained on the basis of these drawings.

The manufacturing apparatus 10-1 in the first embodiment is a film formation apparatus used when an electronic device is produced on a primary surface of a substrate 11, is provided with a film formation chamber 20, a holding member 23 of the substrate 11, a first supply source 25a, and a second supply source 25b. Among them, the disposition state of the first supply source 25a and the second supply source 25b is characteristic in the configuration. Hereinafter, details of these constituent elements and details of materials used in the manufacturing apparatus will be explained.

<Film Formation Chamber 20>

The film formation chamber 20 can be put into a reduced pressure state inside thereof and is constituted as a so-called a vacuum tank.

<Holding Member 23>

The holding member 23 is a member for holding the substrate 11 obtained by producing the electronic device through the use of the manufacturing apparatus 10-1 (details will be explained below) in a constant state within the film formation chamber 20. The holding member 23 is constituted also as transfer means for moving the held substrate 11 in one direction. The movement direction of the substrate 11 (movement direction x) is assumed to be any one direction in the extension directions of the primary surface a of the substrate 11 where the electronic device is formed.

For example, as shown in the drawing, when the substrate 11 is a flexibly-bendable elongated material and can be wound up and wound off between two rolls, the two rolls are used as the holding member 23 winding up and winding off the substrate 11. Furthermore, when the substrate 11 has a certain stiffness and is not bendable, the holding member 23 is assumed to be able to transfer the substrate 11 in the movement direcdion x while holding the substrate 11 in a prescribed state within the film formation chamber 20.

The transfer of the substrate 11 by the holding member 23 like this in the movement direcdion x is assumed to be performed at a speed of v. The speed v is assumed to be a speed at which a transparent electrode layer 1b is formed on the primary surface a side of the substrate 11 in a thickness of 12 nm or less by the supply of electrode material 27b from the second supply source 25b to be described below. The speed v like this is set by, for example, a supply amount of the electrode material 27b from the second supply source 25b and a size of a supply region Sb of the electrode material 27b on the primary surface a. Furthermore, the speedy is also a relative movement speed of the substrate 11 with respect to the first supply source 25a and the second supply 25b to be described below.

Meanwhile, when a patterned transparent electrode 1 is produced on the substrate 11 through the use of the manufacturing apparatus 10-1, a mask is disposed facing the substrate 11 transferred by the holding member 23 on the primary surface a side thereof and the mask is also constituted to be transferred in the same direction as the substrate 11.

<First Supply Source 25a>

The first supply source 25a is disposed on the primary surface a side of the substrate 11 which is transferred by the holding member 23, and supplies a nitrogen-containing compound 27a in a gas state toward the primary surface a of the substrate 11. The first supply source 25a is fixed within the film formation chamber 20 and is provided in the width direction of the substrate 11, perpendicular to the movement direction x. Meanwhile, details of the nitrogen-containing compound 27a supplied from the first supply source 25a will be explained below.

The first supply source 25a like this may be, for example, a so-called heating boat for evaporation film formation and may have a configuration in which the nitrogen-containing compound 27a placed within the boat is gasified by heating and is ejected toward the primary surface a of the substrate 11. The first supply source 25a like this is constituted for the formation of a nitrogen-containing layer 1a on the primary surface a of the substrate 11 which is transferred by the holding member 23.

<Second Supply Source 25b>

The second supply source 25b is disposed on the primary surface a side of the substrate 11 which is transferred by the holding member 23, and supplies the electrode material 27b mainly containing silver in a gas state toward the primary surface a of the substrate 11. The second supply source 25b is fixed within the film formation chamber 20, and is provided in the width direction of the substrate 11, perpendicular to the movement direction x. Meanwhile, details of the electrode material 27b supplied from the second supply source 25b will be explained below.

The second supply source 25b like this may be a so-called heating boat for evaporation film formation, for example, and has a configuration in which the electrode material 27b placed within the boat is gasified by heating and is ejected toward the primary surface a of the substrate 11. The second supply source 25b like this is constituted for the formation of the transparent electrode layer 1b mainly containing silver on the primary surface a of the substrate 11 which is transferred by the holding member 23.

The above second supply source 25b is disposed on the downstream side of the first supply source 25a in the movement direcdion x of the substrate 11. In addition, it is characteristic that the second supply source 25b is disposed having a prescribed spacing d from the first supply source 25a. The spacing d is set to have a value where the film formation of the transparent electrode layer 1b by the second supply source 25b is started between starting the formation and to two minutes, preferably one minute, after finishing the formation of the nitrogen-containing layer 1a by the first supply source 25a, at a prescribed position of the moving substrate 11. Here, the spacing d is assumed to be set so that the formation of the transparent electrode layer 1b is started within two minutes (preferably, within one minute) after the formation of the nitrogen-containing layer 1a.

The spacing d like this is represented as follows. That is, it is assumed that the movement speed of the substrate 11 in the movement direcdion x is v, a supply region where the nitrogen-containing compound 27a is supplied to the primary surface a of the substrate 11 from the first supply source 25a is Sa, a supply region where the electrode material 27b is supplied to the primary surface a of the substrate 11 from the second supply source 25b is Sb, and the spacing therebetween in the movement direcdion x is d1. In this case, the spacing d between the first supply source 25a and the second supply source 25b in the movement direcdion x is set in a range of $d1 \leq v \times 2$ min (preferably, $d1 \leq v \times 1$ min).

Through the use of the manufacturing apparatus 10-1 as above, the transparent electrode 1 constituted of the nitrogen-containing layer 1a and the transparent electrode layer 1b provided adjacent thereto are formed as an electronic device on the primary surface a side of the substrate 11.

Next, there will be explained details of the substrate 11, the nitrogen-containing compound 27a, and the electrode material 27b which are used in the manufacturing like this.

<Substrate 11>

The substrate 11 described above can include, for example, glass, plastic and the like, but is not limited thereto. In addition, the substrate 11 may be transparent or may not be transparent. When the transparent electrode 1 of the present invention is used as an electronic device that takes out light from the side of the substrate 11, the substrate 11 is preferably transparent. Preferably used transparent substrate 11 can include glass, quartz, a transparent resin film.

Examples of the glass include silica glass, soda lime silica glass, lead glass, borosilicate glass, non-alkali glass, and the like. From the viewpoints of adhesion to the nitrogen-containing layer 1a, durability, evenness, as necessary, the surface of these glass materials is subjected to physical treatment such as grinding, or a coating film formed of an inorganic material or an organic material, or a hybrid coating film obtained by combining these films is formed on the surface.

Examples of the resin film include polyesters such as polyethylene terephthalate (PET) and polyethylene naphthalate (PEN); polyethylene; polypropylene; cellulose esters or derivative thereof such as cellophane, cellulose diacetate, cellulose triacetate, cellulose acetate butylate, cellulose acetate propionate (CAP), cellulose acetate phthalate (TAC) and cellulose nitrate; polyvinylidene chloride; polyvinyl alcohol; polyethylene vinyl alcohol; syndiotactic polystyrene; polycarbonate; norbornen resin; polymethylpenten; polyether ketone; polyimide; polyether sulphone (PES); polyphenylene sulfide; polysulphones; polyether imide; polyether ketone imide; polyamide; fluoro resin; Nylon; polymethyl methacrylate; acryl or polyallylates; cycloolefins-based resins such as Alton (commercial name of JSR) or APEL (commercial name of Mitsui Chemicals).

A coating film formed of an inorganic material or an organic material, or a hybrid coating film obtained by combining those films may be formed on the surface of the resin film. Such a coating film and a hybrid coating film are each preferably a barrier film (also referred to as barrier membrane or the like) having a water vapor permeability (25±0 0.5° C., relative humidity 90±2% RH) measured in accordance with the method of JIS-K-7129-1992 of 0.01 g/(m²·24 hr) or less. Furthermore, the coating films are each preferably a high barrier film having an oxygen permeability measured in accordance with the method of JIS-K-7126-1987 of $10^{-3}$ ml/(m²·24 hrs·atm) or less and a water vapor permeability of $10^{-5}$ g/(m²·24 hr) or less.

A material for forming the barrier film as described above may be a material having a function of suppressing penetration of water vapor, oxygen and the like which cause deterioration of the element, and for example, there can be used silicon oxide, silicon dioxide, silicon nitride and the like. Furthermore, in order to improve fragility of the barrier film, it is more preferable to have a laminated structure of the inorganic layer and a layer formed of organic materials (organic layer). The order of lamination of the inorganic layer and the organic layer is not particularly limited, and it is preferable to laminate alternately both of the layers a plurality of times.

The method for forming the barrier film is not particularly limited, and there can be used, for example, vacuum evaporation method, spattering method, reactive spattering method, molecular beam epitaxial method, cluster ion beam method, ion platting method, plasma polymerization method, atmospheric pressure plasma polymerization method, plasma CVD method, laser CVD method, thermal CVD method, coating method, and the like. The atmospheric pressure plasma polymerization method described in Japanese Patent Application Laid-Open Publication No. 2004-68143 is particularly preferable.

In contrast, when the substrate 11 is opaque, there can be used, for example, a metal substrate such as an aluminum or stainless steel, an opaque resin substrate, a ceramic substrate and the like. These substrates may be in the form of films which can be flexibly bended.

<Nitrogen-Containing Compound 27a>

The nitrogen-containing compound 27a is a compound containing nitrogen atoms and is not especially limited as long as the compound contains a nitrogen atom within the molecule, and the one that has a hetero ring containing a nitrogen atom as a hetero atom is preferable. Examples of the hetero ring having the nitrogen atom as the hetero atom include aziridine, azirine, azetidine, azete, azolidine, azole, azinane, pyridine, azepane, azepine, imidazole, pyrazole, oxazole, thiazole, imidazoline, pyrazine, morpholine, thiazine, indole, isoindole, benzimidazole, purine, quinoline, isoquinoline, quinoxaline, cinnoline, pteridine, acridine, carbazole, benzo-c-cinnoline, porphyrin, chlorine, choline and the like.

In addition, the most preferred compound that has the hetero ring containing a nitrogen atom as the hetero atom as described above is the one represented by any of the following the general formulae (1) to (3):

[General Formula (1)]

$$(Ar1)n1-Y1 \hspace{3cm} \text{General Formula (1)}$$

In the general formula (1), n1 represents integer of 1 or more, Y1 represents a substituent when n1 is 1, and represents simply a bond or a linking group having a valence of n1 when n1 is 2 or more. Ar1 represents a group of the general formula (A) described below, and a plurality of Ar1s may be the same or different from one another when n1 is 2 or more. However, the compound of the general formula (1) has at least two condensed aromatic heterocycles each of which is formed by the condensation of three or more rings in a molecule.

In the general formula (1), examples of the substituent represented by Y1 include an alkyl group (for example, methyl group, ethyl group, propyl group, isopropyl group, tert-butyl group, pentyl group, hexyl group, octyl group, dodecyl group, tridecyl group, tetradecyl group, pentadecyl group and the like), a cycloalkyl group (for example, cyclopentyl group, cyclohexyl group and the like), an alkenyl group (for example, vinyl group, allyl group and the like), an alkynyl group (for example, ethynyl group, propargyl group and the like), an aromatic hydrocarbon group (also referred to as an aromatic carbon ring group, an aryl group or the like, for example; phenyl group, p-chlorophenyl group, mesityl group, tolyl group, xylyl group, naphthyl group, anthryl group, azulenyl group, acenaphthenyl group, fluorenyl group, phenanthryl group, indenyl group, pyrenyl group, biphenyryl group and the like), an aromatic heterocyclic ring group (for example, furyl group, thienyl group, pyridyl group, pyridazinyl group, pyrimidinyl group, pyrazinyl group, triazinyl group, imidazolyl group, pyrazolyl group, thiazolyl group, quinazolinyl group, carbazolyl group, carbolinyl group, diazacarbazolyl group (a group in which a certain carbon atom constituting the carboline ring of the carbolinyl group is substituted with a nitrogen atom), phtharazinyl group and the like), a ring group (for example, pyrrolidyl group, imidazolidyl group, morpholyl group, oxazolidyl group and the like), an alkoxy group (for example, methoxy group, ethoxy group, propyloxy group, pentyloxy group, hexyloxy group, octyloxy group, dodecyloxy group and the like), a cycloalkoxy group (for example, cyclopentyloxy group, cyclohexyloxy group and the like), an aryloxy group (for example, phenoxy group, naphthyloxy group and the like), an alkylthio group (for example, methylthio group, ethylthio group, propylthio group, pentylthio group, hexylthio group, octylthio group, dodecylthio group and the like), a cycloalkylthio group (for example, cyclopentylthio group, cyclohexylthio group and the like), an arylthio group (for example, phenylthio group, naphthylthio group and the like), an alkoxycarbonyl group (for example, methyloxycarbonyl group, ethyloxycarbonyl group, butyloxycarbonyl group, octyloxycarbonyl group, dodecyloxycarbonyl group and the like), an aryloxycarbonyl group (for example, phenyloxycarbonyl group, naphthyloxycarbonyl group and the like), a sulfamoyl group (for example, aminosulfonyl group, methylaminosulfonyl group, dimethylaminosulfonyl group, butylaminosulfonyl group, hexylaminosulfonyl group, cyclohexylaminosulfonyl group, octylaminosulfonyl group, dodecylaminosulfonyl group, phenylaminosulfonyl group, naphthylaminosulfonyl group, 2-pyridylaminosulfonyl group and the like), an acyl group (for example, acetyl group, ethylcarbonyl group, propylcarbonyl group, pentylcarbonyl group, cyclohexylcarbonyl group, octylcarbonyl group, 2-ethylhexylcarbonyl group, dodecylcarbonyl group, phenylcarbonyl group, naphthylcarbonyl group, pyridylcarbonyl group and the like), an acyloxy group (for example, acetyloxy group, ethylcarbonyloxy group, butylcarbonyloxy group, octylcarbonyloxy group, dodecylcarbonyloxy group, phenylcarbonyloxy group and the like), an amido group (for example, methylcarbonylamino group, ethylcarbonylamino group, dimethylcarbonylamino group, propylcarbonylamino group, pentylcarbonylamino group, cyclohexylcarbonylamino group, 2-ethylhexylcarbonylamino group, octylcarbonylamino group, dodecylcarbonylamino group, phenylcarbonylamino group, naphthylcarbonylamino group and the like), a carbamoyl group (for example, aminocarbonyl group, methylaminocarbonyl group, dimethylaminocarbonyl group, propylaminocarbonyl group, pentylaminocarbonyl group, cyclohexylaminocarbonyl group, octylaminocarbonyl group, 2-ethylhexylaminocarbonyl group, dodecylaminocarbonyl group, phenylaminocarbonyl group, naphthylaminocarbonyl group, 2-pyridylaminocarbonyl group and the like), an ureido group (for example, methylureido group, ethylureido group, pentylureido group, cyclohexylureido group, octylureido group, dodecylureido group, phenylureido group, naphthylureido group, 2-pyridylaminoureido group and the like), a sulfinyl group (for example, methylsulfinyl group, ethylsulfinyl group, butylsulfinyl group, cyclohexylsulfinyl group, 2-ethylhexylsulfinyl group, dodecylsulfinyl group, phenylsulfinyl group, naphthylsulfinyl group, 2-pyridylsulfinyl group and the like), an alkylsulfonyl group (for example, methylsulfonyl group, ethylsulfonyl group, butylsulfonyl group, cyclohexylsulfonyl group, 2-ethylhexylsulfonyl group, dodecylsulfonyl group and the like), an arylsulfonyl group or a heteroarylsulfonyl group (for example, phenylsulfonyl group, naphthylsulfonyl group, 2-pyridylsulfonyl group and the like), an amino group (for example, amino group, ethylamino group, dimethylamino group, butylamino group, cyclopentylamino group, 2-ethylhexylamino group, dodecylamino group, anilino group, naphthylamino group, 2-pyridylamino group, piperidyl group (also referred to as piperidinyl group), 2,2,6,6-tetramethylpiperidinyl group and the like), a halogen atom (for example, fluorine atom, chlorine atom, bromine atom and the like), a fluorinated hydrocarbon group (for example, fluoromethyl group, trifluoromethyl group, pentafluoroethyl group, pentafluorophenyl group and the like), cyano group, nitro group, hydroxyl group, mercapto group, a silyl group (for example, trimethylsilyl group, triisopropylsilyl group, triphenylsilyl group, phenyldiethylsilyl group and the like), a phosphate group (for example, dihexylphosphoryl group and the like), a phosphite group (for example, diphenylphosphinyl group and the like), phosphono group and the like.

Some of these substituents may further be substituted by the aforementioned substituent. In addition, two or more of these substituents may bind to each other to form a ring.

In the general formula (1), the linking group having a valence of n1, represented by Y1, specifically includes divalent, trivalent, tetravalent linking groups and the like.

Examples of the divalent linking group represented by Y1 in the general formula (1) include: an alkylene group (for example, ethylene group, trimethylene group, tetramethylene group, propylene group, ethylethylene group, pentamethylene group, hexamethylene group, 2,2,4-trimethylhexamethylene group, heptamethylene group, octamethylene group, nonamethylene group, decamethylene group, undecamethylene group, dodecamethylene group, a cyclohexylene group (for example, 1,6-cyclohexanediyl group and the like) and a cyclopenthylene group (for example, 1,5-cyclopentanediyl group and the like)), an alkenylene group (for example, vinylene group, propenylene group, butenylene group, pentenylene group, 1-methylvinylene group, 1-methylpropenylene group, 2-methylpropenylene group, 1-methylpentenylene group, 3-methylpentenylene group, 1-ethylvinylene group, 1-ethylpropenylene group, 1-ethylbutenylene group, 3-ethylbutenylene group and the like), an alkynylene group (for example, ethynylene group, 1-propynylene group, 1-butynylene group, 1-pentynylene group, 1-hexynylene group, 2-butynylene group, 2-pentynylene group, 1-methylethynylene group, 3-methyl-1-propynylene group, 3-methyl-1-butynylene group and the like), an arylene group (for example, o-phenylene group, p-phenylene group, naphthalenediyl group, anthracenediyl group, naphthacenediyl group, pyrenediyl group, naphthylnaphthalenediyl group, a biphenyldiyl group (for example, [1,1'-biphenyl]-4,4'-diyl group, 3,3'-biphenyldiyl group, 3,6-biphenyldiyl group and the like), terphenyldiyl group, quaterphenyldiyl group, quinquephenyldiyl group, sexiphenyldiyl group, septiphenyldiyl group, octiphenyldiyl group, nobiphenyldiyl group, deciphenyldiyl group and the like), a heteroarylene group (for example, a divalent group derived from a group consisting of carbazole group, carboline ring, diazacarbazole ring (also referred to as monoazacarboline group, exhibiting a ring structure obtained by substituting one carbon atom constituting the carboline ring, with a nitrogen atom), triazole ring, pyrrole ring, pyridine ring, pyrazine ring, quinoxaline ring, thiophene ring, oxadiazole ring, dibenzofuran ring, dibenzothiophene ring, indole ring and the like), a chalcogen atom such as oxygen or sulfur, a group or the like derived from a condensed aromatic heterocyclic ring obtained by condensing three or more rings (here, the condensed aromatic heterocyclic ring formed by condensing three or more rings preferably contains a hetero atom selected from N, O and S as an element constituting a condensed ring, for example, acridine ring, benzoquinoline ring, carbazole ring, phenazine ring, phenanthridine ring, phenanthroline ring, carboline ring, cycladine ring, quindoline ring, thebenidine ring, quinindoline ring, triphenodithiazine ring, triphenodioxazine ring, phenanthrazine ring, anthrazine ring, perimizine ring, diazacarbazole ring (exhibiting a ring obtained by substituting optional one of carbon atoms constituting the carboline ring, with a nitrogen atom), phenanthroline ring, dibenzofuran ring, dibenzothiophene ring, naphthofuran ring, naphthothiophene ring, benzodifuran ring, benzodithiophene ring, naphthodifuran ring, naphthodithiophene ring, anthrafuran ring, anthradifuran ring, anthrathiophene ring, anthradithiophene ring, thianthrene ring, phenoxathiin ring, thiophanthrene ring (naphthothiophene ring) and the like).

Examples of the trivalent linking group represented by Y1 in the general formula (1) include ethanetriyl group, propanetriyl group, butanetriyl group, pentanetriyl group, hexanetriyl group, heptanetriyl group, octanetriyl group, nonanetriyl group, decanetriyl group, undecanetriyl group, dodecanetriyl group, cyclohexanetriyl group, cyclopentanetriyl group, benzenetriyl group, naphthalenetriyl group, pyridinetriyl group, carbazoletriyl group and the like.

The tetravalent linking group represented by Y1 in the general formula (1) is a group having a combining group added to the above-mentioned trivalent linking group. Examples include propandiylidene group, 1,3-propandiyl-2-ylidene group, butanediylidene group, pentanediylidene group, hexanediylidene group, heptanediylidene group, octanediylidene group, nonanediylidene group, decanediylidene group, undecanediylidene group, dodecanediylidene group, cyclohexanediylidene group, cyclopentanediylidene group, benzenetetrayl group, naphthalenetetrayl group, pyridinetetrayl group, carbazoletetrayl group and the like.

Meanwhile, each of the aforementioned divalent, trivalent and tetravalent linking groups may further have a substituent represented by Y1 of the general formula (1).

As the preferable aspect of the compound represented by the general formula (1), it is preferable that Y1 represent a group which is derived from a condensed aromatic heterocyclic ring formed by condensing three or more rings. Examples of the condensed aromatic heterocyclic ring formed by condensing three or more rings preferably include dibenzofuran ring or dibenzothiophene ring. In addition, n1 is preferably 2 or more.

Furthermore, the compound represented by the general formula (1) has, in the molecule, at least two condensed aromatic heterocyclic rings formed by condensing three or more rings, described above.

Moreover, when Y1 represents an n1-valent linking group, Y1 is preferably non-conjugated in order to keep the triplet excitation energy of the compound represented by the general formula (1) high, and is preferably constituted of aromatic rings (aromatic hydrocarbon ring+aromatic heterocyclic ring) from the viewpoint of improving Tg (also referred to as glass transition point, or glass transition temperature).

Here, the "non-conjugated" means a case in which a linking group cannot be expressed by repetition of a single bond (single bond) and a double bond, or a case in which a conjugation of aromatic rings constituting a linking group is sterically broken.

[Group Represented by the General Formula (A)]

Ar1 in the general formula (1) represents the group represented by the general formula (A) below.

[Chem. 1]

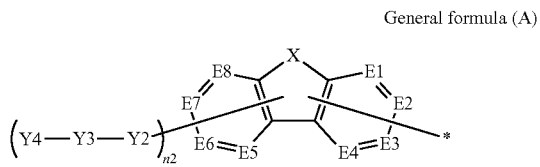

General formula (A)

Where, X represents —N(R)—, —O—, —S— or —Si(R)(R')—, E1 to E8 each represent —C(R1)═ or —N═, R, R' and R1 each represent hydrogen atom, a substituent or a linking moiety with Y1. The symbol * represents a linking moiety with Y1. Y2 represents simply a bond or a divalent linking group. Y3 and Y4 each represent a group derived from a five-membered or six-membered aromatic ring, and at least one represents a group derived from an aromatic heterocyclic ring containing a nitrogen atom as a ring constituent atom. n2 represents an integer of 1 to 4.

Here, in —N(R)— or —Si(R)(R')— represented by X of the general formula (A), and further in —C(R1)═ represented by E1 to E8, a substituent represented by each of R, R' and R1 has the same meaning as the substituent represented by R11, R12 of the general formula (1).

In addition, a divalent linking group represented by Y2 in the general formula (A) has the same meaning as the divalent linking group represented by Y1 in the general formula (1).

Furthermore, examples of a five-membered or six-membered aromatic ring which is used for the formation of a group derived from a five-membered or six-membered aromatic ring represented by each of Y3 and Y4 in the general formula (A) include benzene ring, oxazole ring, thiophene ring, furan ring, pyrrole ring, pyridine ring, pyridazine ring, pyrimidine ring, pyrazine ring, diazine ring, triazine ring, imidazole ring, isoxazole ring, pyrazole ring, triazole ring and the like.

Moreover, at least one of the groups derived from five-membered or six-membered aromatic rings each represented by Y3 and Y4 represents a group derived from the aromatic heterocyclic ring containing a nitrogen atom as a ring constituent atom, and examples of the aromatic heterocyclic ring containing a nitrogen atom as a ring constituent atom include oxazole ring, pyrrole ring, pyridine ring, pyridazine ring, pyrimidine ring, pyrazine ring, diazine ring, triazine ring, imidazole ring, isoxazole ring, pyrazole ring, triazole ring, and the like.

(Preferred Aspect of the Group Represented by Y3)

In the general formula (A), the group represented by Y3 is preferably a group derived from the aforementioned six-membered aromatic ring, and is more preferably a group derived from a benzene ring.

(Preferred Aspect of the Group Represented by Y4)

In the general formula (A), the group represented by Y4 is preferably a group derived from the aforementioned six-membered aromatic ring, is more preferably a group derived from the aromatic heterocyclic ring containing a nitrogen atom as a ring constituent atom, and is particularly preferably a group derived from a pyridine ring.

(Preferred Aspect of the Group Represented by the General Formula (A))

The preferable aspect of the group represented by the general formula (A) includes a group represented by any of the general formulae (A-1), (A-2), (A-3) or (A-4).

[Chem. 2]

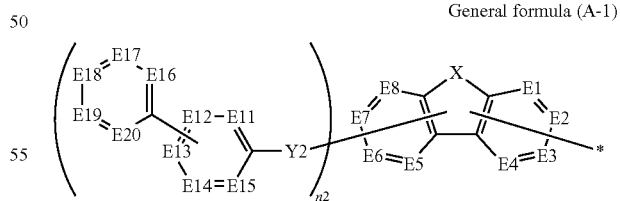

General formula (A-1)

In the general formula (A-1), X represents —N(R)—, —O—, —S— or —Si(R)(R')—, E1 to E8 each represent —C(R1)═ or —N═, and R, R' and R1 each represent hydrogen atom, a substituent or a linking moiety with Y1. Y2 represents simply a bond or a divalent linking group. E11 to E20 each represent —C(R2)═ or —N═, and at least one represents —N═. R2 represents hydrogen atom, a substituent or a linking moiety. However, at least one of E11 and E12 represents —C(R2)═, and R2 represents a linking moiety. n2 represents an integer of 1 to 4. The symbol * represents a linking moiety with Y1 in the general formula (1).

[Chem. 3]

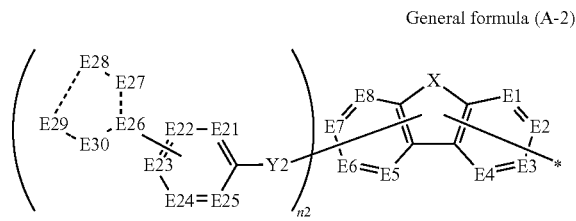

General formula (A-2)

In the general formula (A-2), X represents —N(R)—, —O—, —S— or —Si(R)(R')—, E1 to E8 each represent —C(R1)= or —N=, and R, R' and R1 each represent a hydrogen atom, a substituent or a linking moiety with Y1. Y2 represents simply a bond or a divalent linking group. E21 to E25 each represent —C(R2)= or —N=, E26 to E30 each represent —C(R2)=, —N=, —O—, —S— or —Si(R3)(R4)-, and at least one of E21 to E30 represents —N=. R2 represents a hydrogen atom, a substituent or a linking moiety, and R3 and R4 each represent a hydrogen atom or a substituent. However, at least one of E21 or E22 represents —C(R2)= and R2 represents a linking moiety. n2 represents an integer of 1 to 4. The symbol * represents a linking moiety with Y1 in the general formula (1).

[Chem. 4]

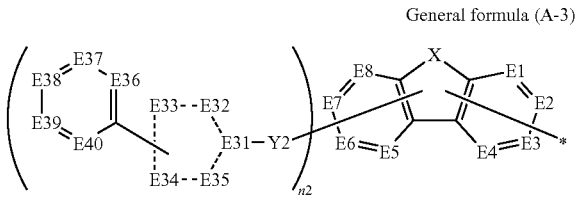

General formula (A-3)

In the general formula (A-3), X represents —N(R)—, —O—, —S— or —Si(R)(R')—, E1 to E8 each represent —C(R1)= or —N=, and R, R' and R1 each represent a hydrogen atom, a substituent or a linking moiety with Y1. Y2 represents simply a bond or a divalent linking group. E31 to E35 each represent —C(R2)=, —N=, —O—, —S— or —Si(R3)(R4)-, and E36 to E40 each represent —C(R2)= or —N=, and at least one of E31 to E40 represents —N=. R2 represents a hydrogen atom, a substituent or a linking moiety, and R3 and R4 each represent a hydrogen atom or a substituent. However, at least one of E32 or E33 represents —C(R2)= and R2 represents a linking moiety. n2 represents an integer of 1 to 4. The symbol * represents a linking moiety with Y1 in the general formula (1).

[Chem. 5]

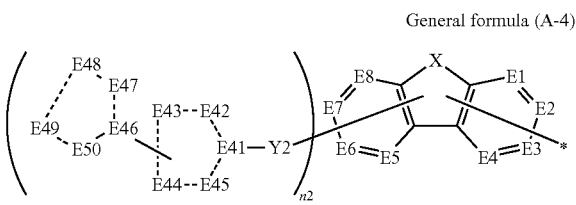

General formula (A-4)

In the general formula (A-4), X represents —N(R)—, —O—, —S— or —Si(R)(R')—, E1 to E8 each represent —C(R1)= or —N=, and R, R' and R1 each represent a hydrogen atom, a substituent or a linking moiety with Y1. Y2 represents simply a bond or a divalent linking group. E41 to E50 each represent —C(R2)=, —N=, —O—, —S— or —Si(R3)(R4)-, and at least one represents —N=. R2 represents a hydrogen atom, a substituent or a linking moiety, and R3 and R4 each represent a hydrogen atom or a substituent. However, at least one of E42 or E43 represents —C(R2)= and R2 represents a linking moiety. n2 represents an integer of 1 to 4. The symbol * represents a linking moiety with Y1 in the general formula (1).

Hereinafter, the group represented by any of the general formulae (A-1) to (A-4) will be explained.

In —N(R)— or —Si(R)(R')— represented by X in any of the group represented by the general formulae (A-1) to (A-4), and further in —C(R1)= represented by E1 to E8, a substituent represented by each of R, R' and R1 has the same meaning as the substituent represented by Y1 of the general formula (1).

In any of the group represented by the general formulae (A-1) to (A-4), the divalent linking group represented by Y2 has the same meaning as the divalent linking group represented by Y1 of the general formula (1).

The substituent represented by R2 in —C(R2)= represented by each of E11 to E20 in the general formula (A-1), each of E21 to E30 in the general formula (A-2), each of E31 to E40 in the general formula (A-3) and each of E41 to E50 in the general formula (A-4) has the same meaning as the substituent represented by Y1 of the general formula (1).

Next, more preferable embodiments of the compound represented by the general formula (1) according to the present invention will be explained.

[Compound Represented by the General Formula (2)]

According to the present invention, among the compounds represented by the aforementioned the general formula (1), the compound represented by the following the general formula (2) is preferable. Hereinafter, the compound represented by the general formula (2) will be explained.

[Chem. 6]

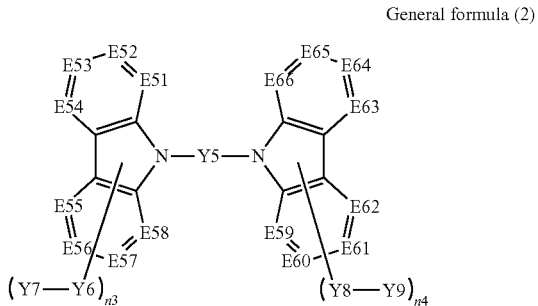

General formula (2)

In the general formula (2), Y5 represents a divalent linking group formed of an arylene group, a heteroarylene group or a combination thereof. E51 to E66 each represent —C(R3)= or —N=, and R3 represents a hydrogen atom or a substituent. Y6 to Y9 each represent a group derived from an aromatic hydrocarbon ring or a group derived from an aromatic heterocyclic ring, and at least one of Y6 or Y7 and at least one of Y8 or Y9 each represent a group derived from an aromatic heterocyclic ring containing an N atom. n3 and n4 each represent an integer of 0 to 4, but the sum of n3 and n4 is an integer of 2 or more.

The arylene and heteroarylene groups represented by Y5 in the general formula (2) have the same meaning as arylene and heteroarylene groups defined as an example of the divalent linking group represented by Y1 in the general formula (1).

A preferred aspect of the divalent linking group represented by Y5, including the arylene or heteroarylene group, or a combination thereof, preferably includes the group derived from the condensed aromatic heterocycle obtained by the condensation of three or more rings among the heteroarylene groups, and a preferable example of the group derived from the condensed aromatic heterocycle obtained by the condensation of three or more rings is the group derived from a dibenzofuran or dibenzothiophene ring.

In the general formula (2), the substituent represented by R3 in —C(R3)═ of each of E51 to E66 has the same meaning as the substituent represented by Y1 in the general formula (1).

In the general formula (2), it is preferable that as groups represented by E51 to E66, six or more among E51 to E58 and six or more among E59 to E66 each represent —C(R3)═.

In the general formula (2), examples of the aromatic hydrocarbon ring which is used for the formation of a group derived from the aromatic hydrocarbon ring represented by Y6 to Y9 include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring and the like.

Furthermore, the aromatic hydrocarbon ring may also have a substituent represented by Y1 of the general formula (1).

In the general formula (2), examples of the aromatic heterocyclic ring used for the formation of a group derived from the aromatic heterocyclic ring represented by each of Y6 to Y9 include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, indazole ring, benzimidazole ring, benzothiazole ring, benzoxazole ring, quinoxaline ring, quinazoline ring, cinnoline ring, quinoline ring, isoquinoline ring, phthalazine ring, naphthylidine ring, carbazole ring, carboline ring, diazacarbazole ring (represents a ring obtained by further substituting one of carbon atoms constituting the carboline ring by a nitrogen atom) and the like.

Moreover, the aromatic hydrocarbon ring may have the substituent represented by Y1 of the general formula (1).

In the general formula (2), examples of the aromatic heterocyclic ring containing an N atom which is used for the formation of a group derived from the aromatic heterocyclic ring containing an N atom represented by at least one of Y6 or Y7 and at least one of Y8 or Y9 include oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, indazole ring, benzimidazole ring, benzothiazole ring, benzoxazole ring, quinoxaline ring, quinazoline ring, cinnoline ring, quinoline ring, isoquinoline ring, phthalazine ring, naphthylidine ring, carbazole ring, carboline ring, diazacarbazole ring (represents a ring obtained by further substituting one of carbon atoms constituting the carboline ring by a nitrogen atom) and the like.

In the general formula (2), it is preferable that the group each represented by Y7, Y9 is represented by a group derived from each pyridine ring.

In addition, in the general formula (2), it is preferable that the group each represented by Y6 and Y8 is represented by a group derived from each benzene ring.

Moreover, a more preferred aspect among the compounds represented by the general formula (2) according to the present invention will be explained.

[Compound Represented by the General Formula (3)]

In the present invention, the compound of the following the general formula (3) is more preferred among the compounds of the general formula (2). Hereinafter, the compound represented by the general formula (3) will be explained.

[Chem. 7]

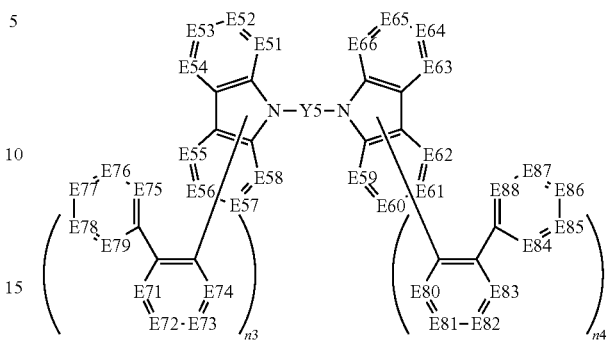

General formula (3)

In the general formula (3), Y5 represents a divalent linking group formed of a arylene or heteroarylene group, or a combination thereof. E51 to E66 and E71 to E88 each represent —C(R3)═ or —N═, and R3 represents a hydrogen atom or substituent. However, at least one of E71 to E79 and at least one of E80 to E88 each represent —N═. n3 and n4 each represent an integer of 0 to 4, but n3+n4 is an integer of 2 or more.

The arylene and heteroarylene groups represented by Y5 in the general formula (3) have the same meaning as arylene and heteroarylene groups defined as an example of the divalent linking group represented by Y1 in the general formula (1).

A preferred aspect of the divalent linking group represented by Y5, including the arylene or heteroarylene group, or a combination thereof, preferably includes the group derived from the condensed aromatic heterocycle obtained by the condensation of three or more rings among the heteroarylene groups, and a preferable example of the group derived from the condensed aromatic heterocycle obtained by the condensation of three or more rings is the group derived from a dibenzofuran or dibenzothiophene ring.

In the general formula (2), the substituent represented by R3 in —C(R3)═ of each of E51 to E66 and E71 to E88 has the same meaning as the substituent represented by Y1 in the general formula (1).

In the general formula (3), it is preferable that six or more among E51 to E58 and six or more among E59 to E66 each represent —C(R3)═.

In the general formula (3), it is preferable that at least one of E75 to E79 and at least one of E84 to E88 each represent —N═.

Furthermore, in the general formula (3), it is preferable that any one of E75 to E79 and any one of E84 to E88 each represent —N═.

In addition, in the general formula (3), a preferable aspect in which E71 to E74 and E80 to E83 each represent —C(R3)═ is included.

Moreover, in the compound represented by the general formula (2) or (3), it is preferable that E53 represents —C(R3)═ and R3 represents the linking moiety, while it is preferable that E61 also represents —C(R3)═ and R3 represents the linking moiety.

Furthermore, it is preferable that E75 and E84 individually present —N═, and E71 to E74 and E80 to E83 each represent —C(R3)═, respectively.

In addition, a compound represented by the following the general formula (4) is used as another example of the compound constituting the nitrogen-containing layer 1a.

[Chem. 8]

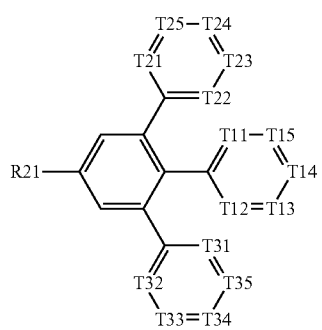

General formula (4)

In the above general formula (4), R21 represents a substituent group. Furthermore, each of T11, T12, T21 to E25, and T31 to T35 represents —C(R22)= or —N=. Moreover, each of T13 to T15 represents —C(R22)=. R22 therein represents a hydrogen atom (H) or a substituent group. Furthermore, at least one of T11 and T12 represents —N=, at least one of T21 to T25 represents N=, and at least one of T31 to T35 represents —N=.

Examples of the substituent groups represented by R21 and R22 include the same substituent group as one represented by Y1 of the general formula (1). A part of each of these substituent groups may be further substituted by the above substituent group.

[Specific Examples Of Compounds]

Specific examples (1 to 125) of the compound represented by the general formula (1), (2), (3), or (4) according to the present invention and the other nitrogen-containing compound will be shown below, but not limited thereto.

[Chem. 9]

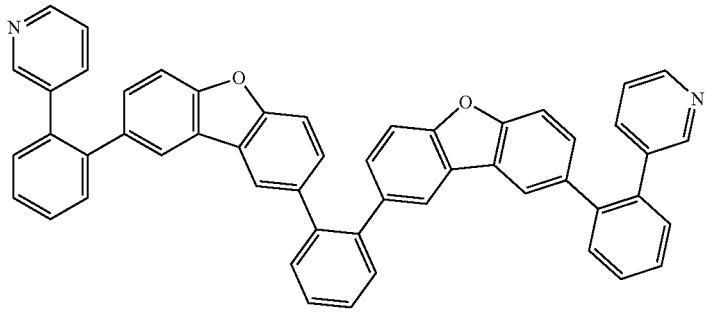

1

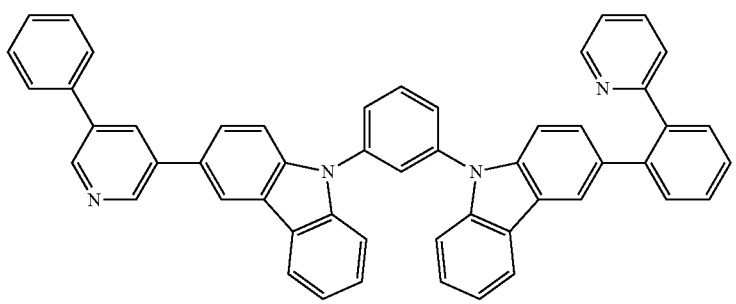

2

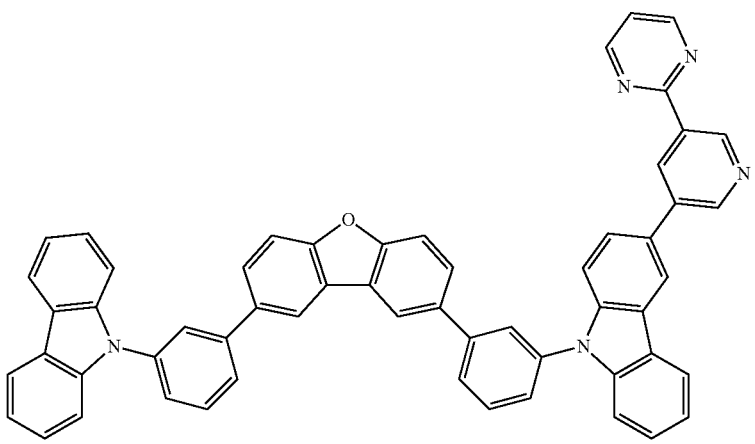

3

4
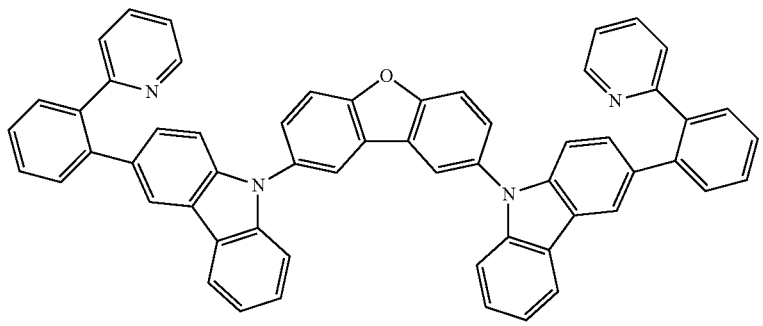
5
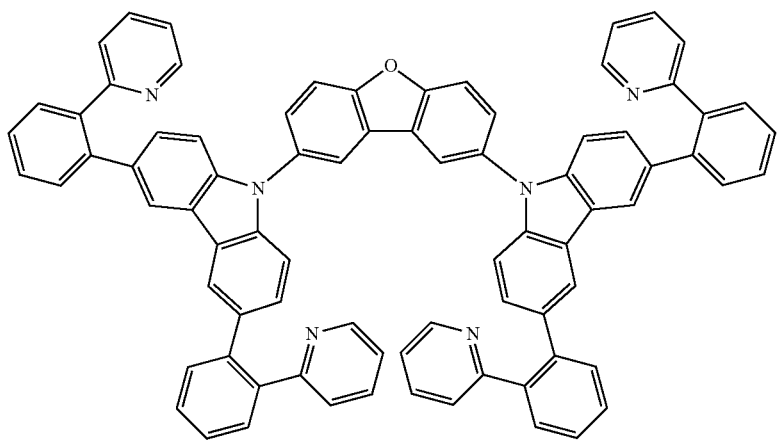
[Chem. 10]
6
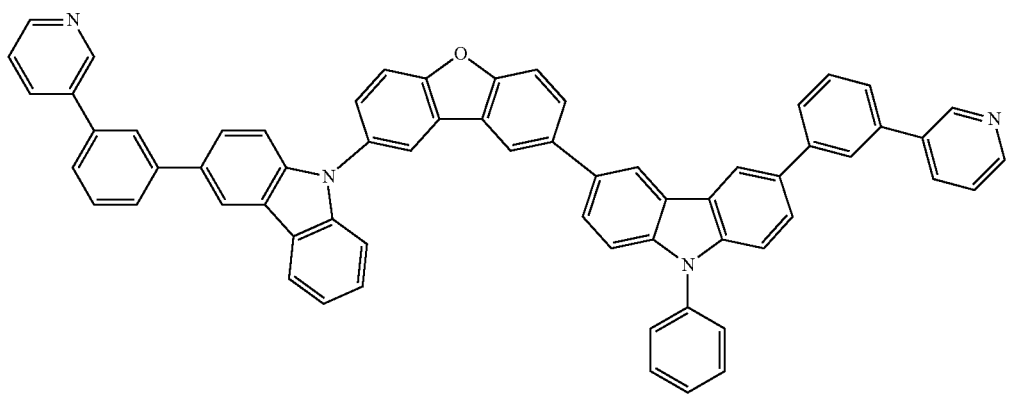
7
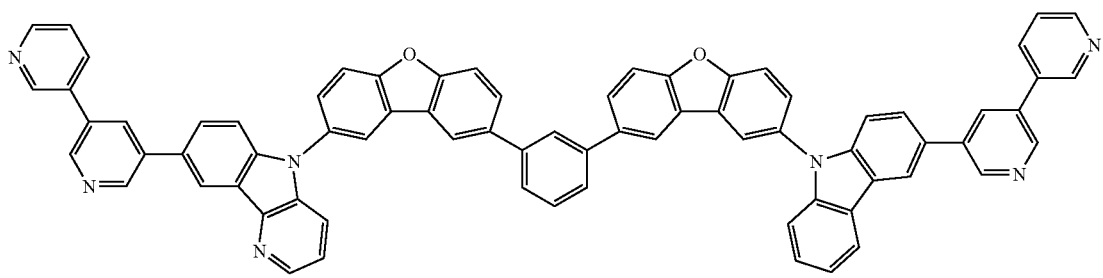

-continued
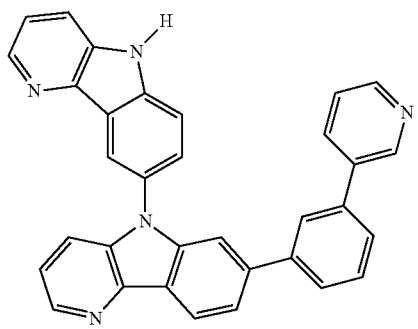
8
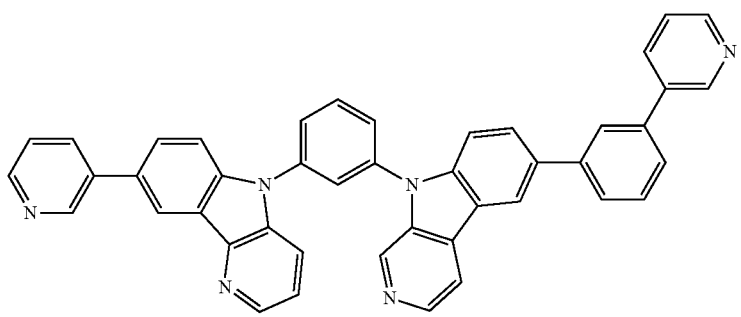
9
[Chem. 11]
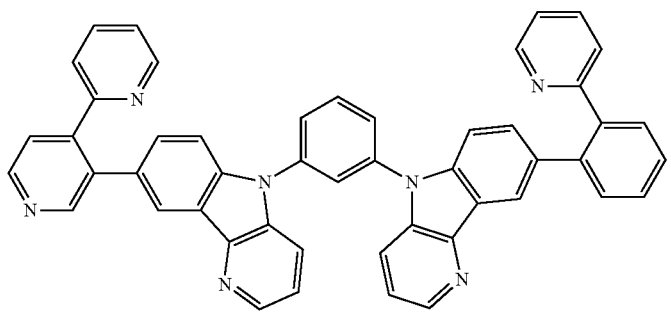
10
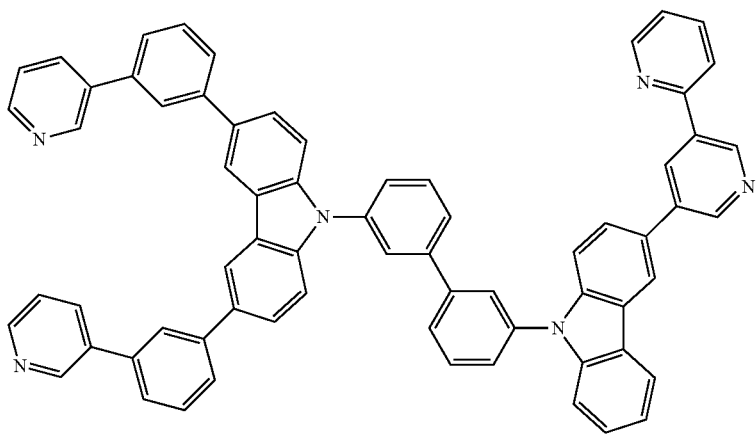
11

-continued
12
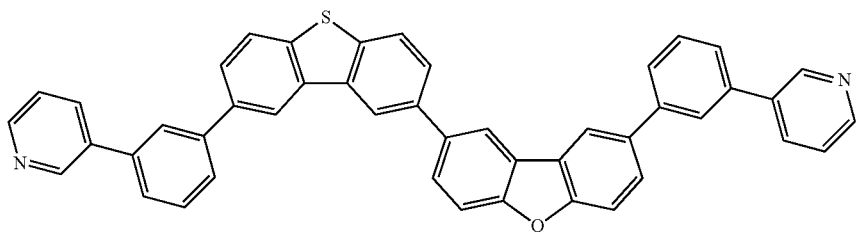
13
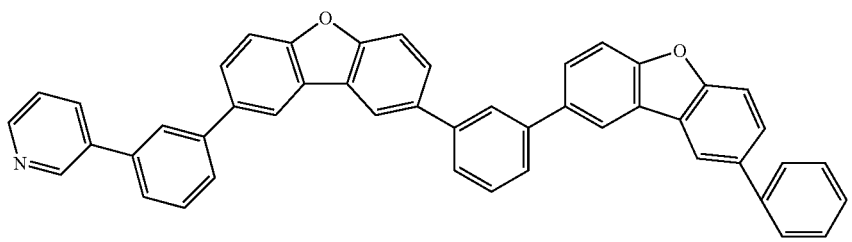
14
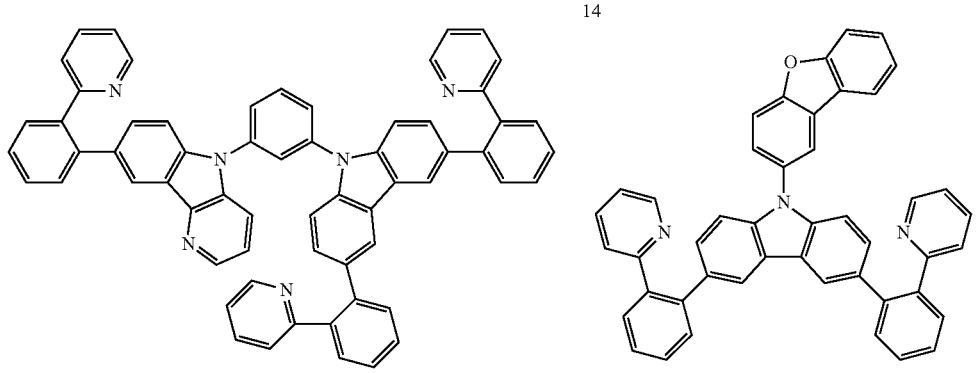
15
[Chem. 12]
16
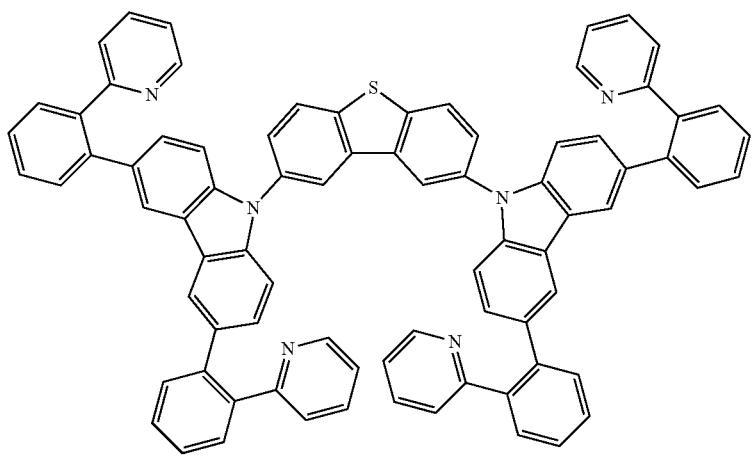
17
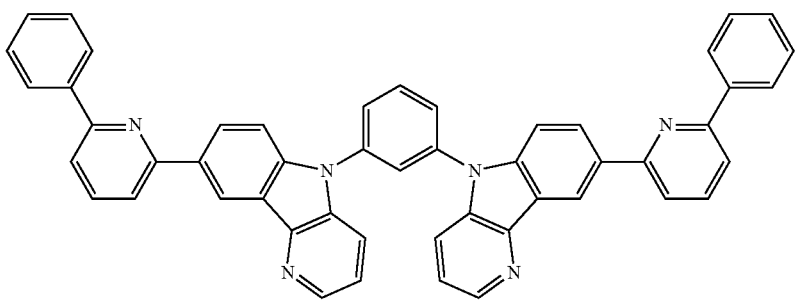

-continued
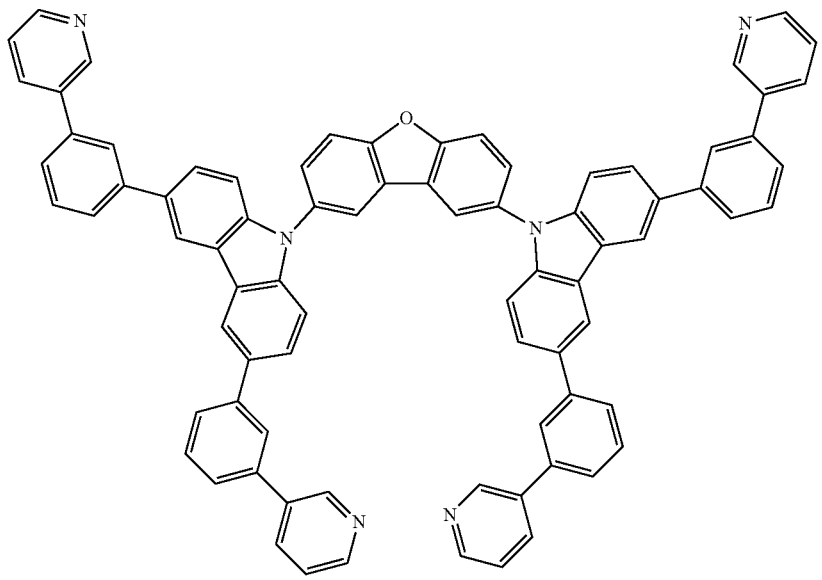
18
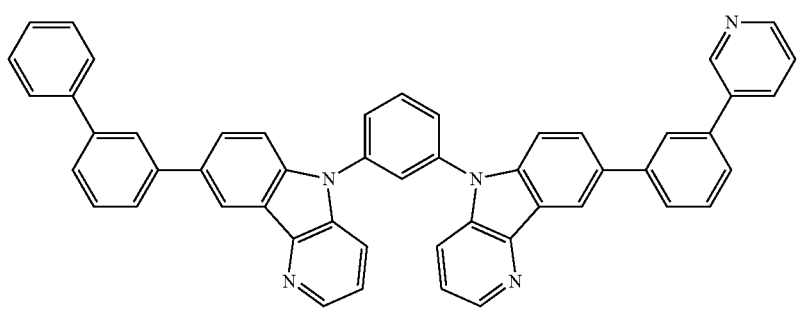
19
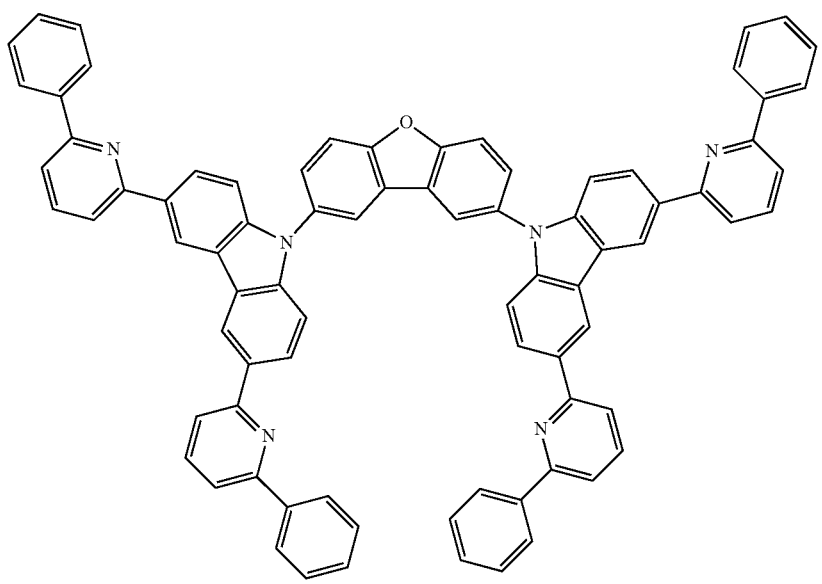
20
[Chem. 13]

-continued
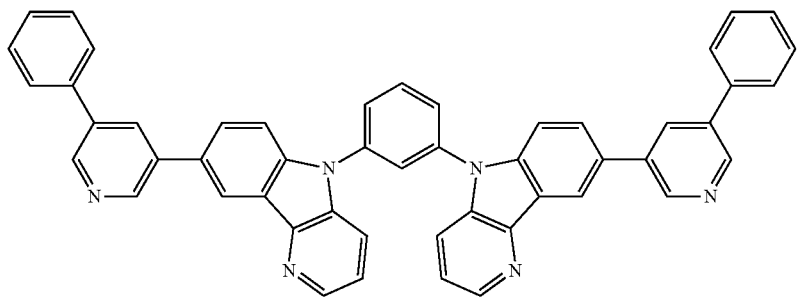
21
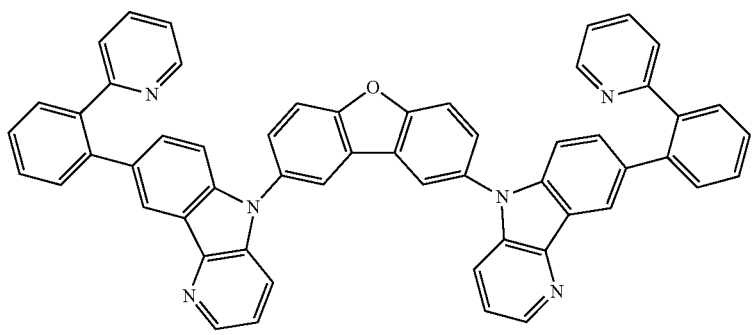
22
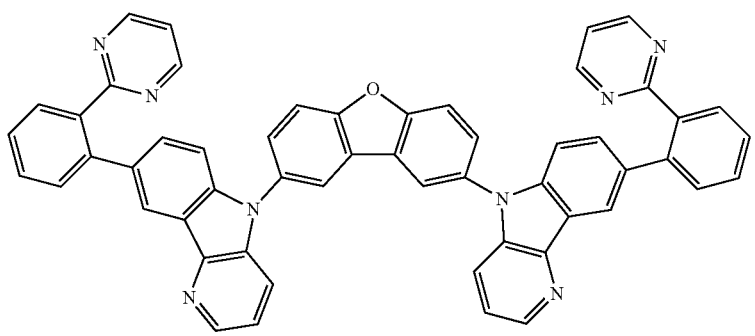
23
[Chem. 14]
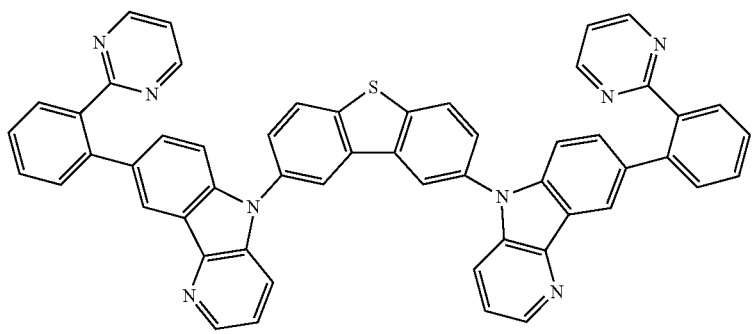
24

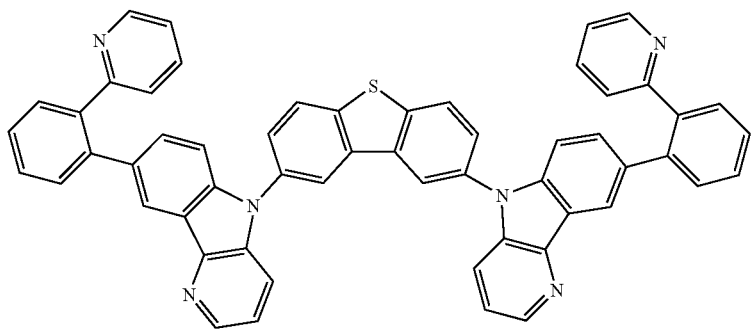
25
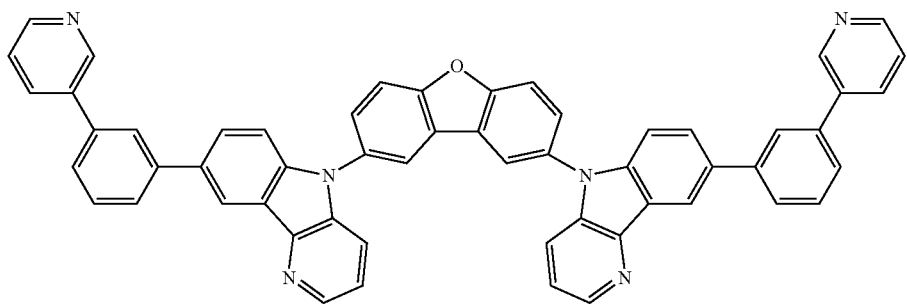
26
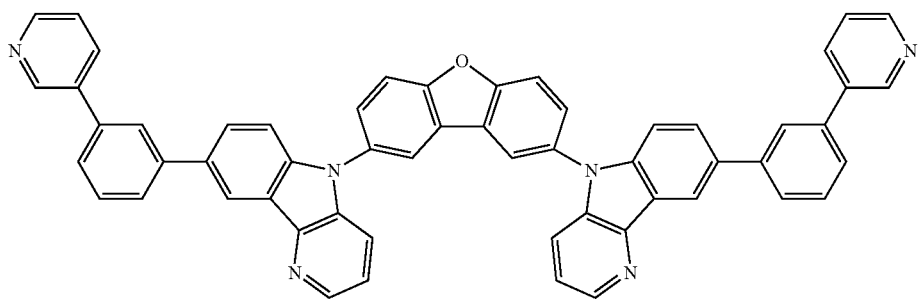
27
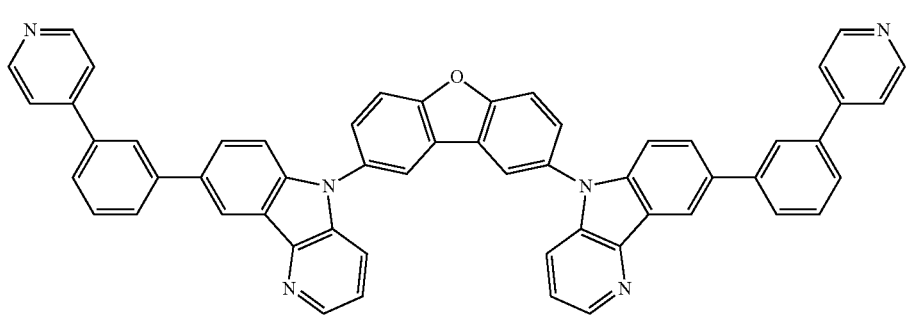
28
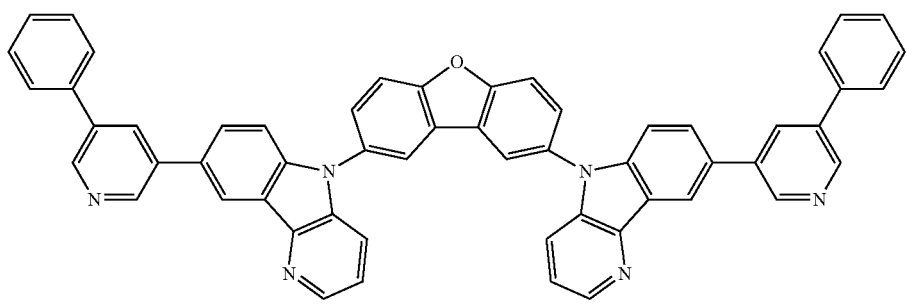
29

-continued
[Chem. 15]
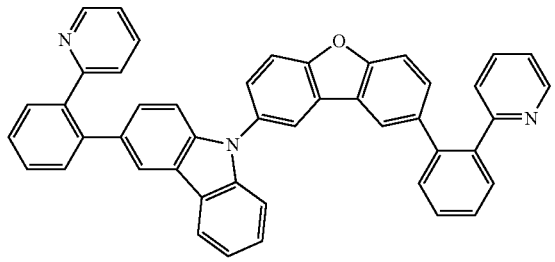
30
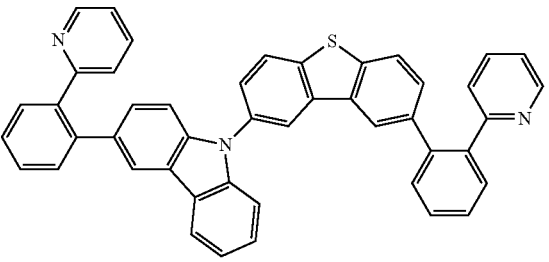
31
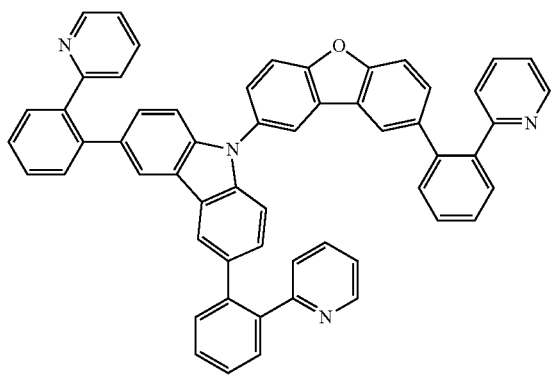
32
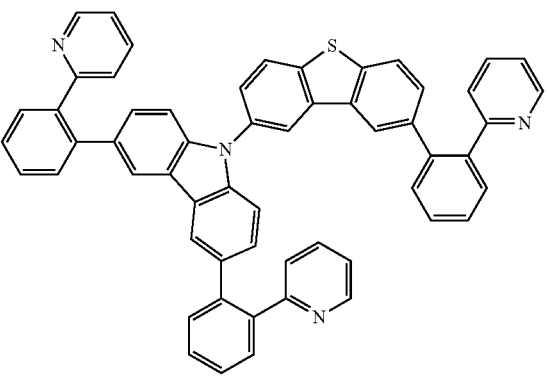
33
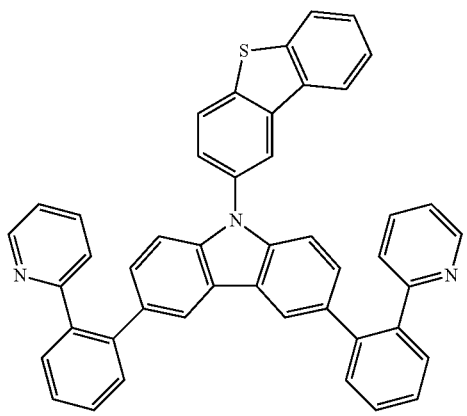
34
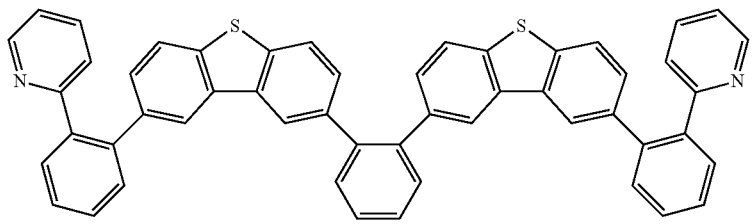
35
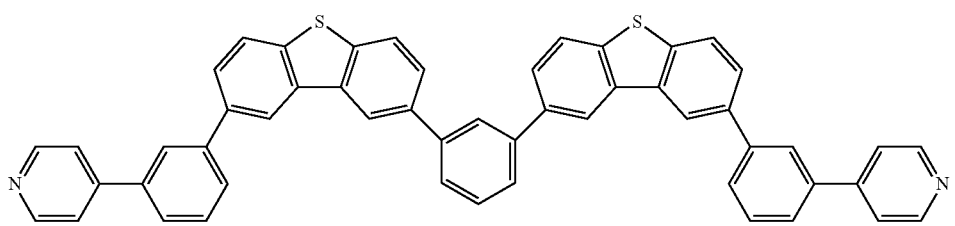
36

[Chem. 16]
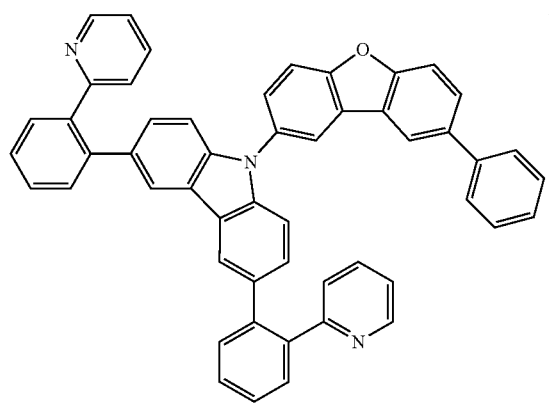
37
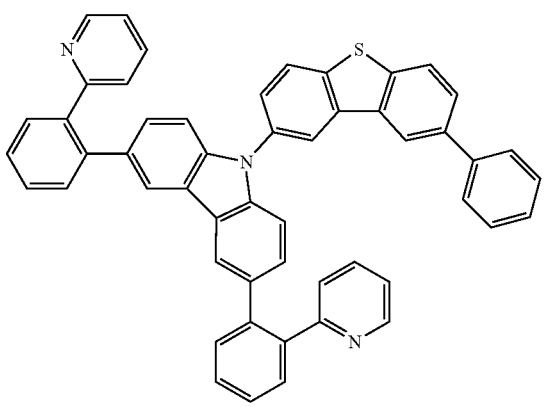
38
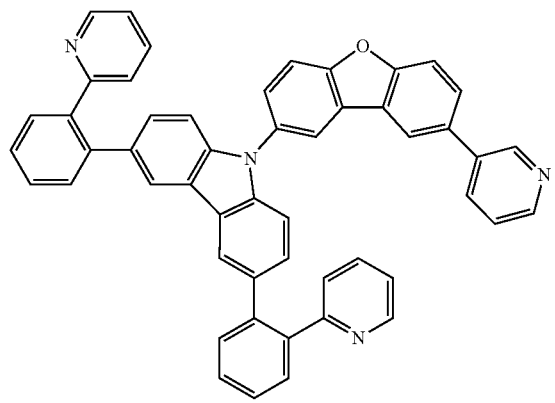
39
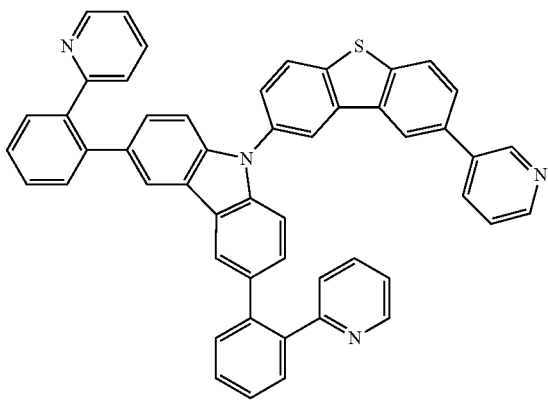
40
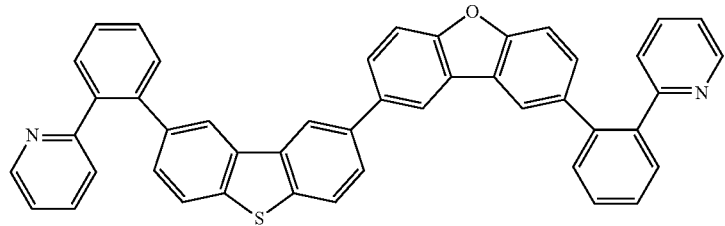
41
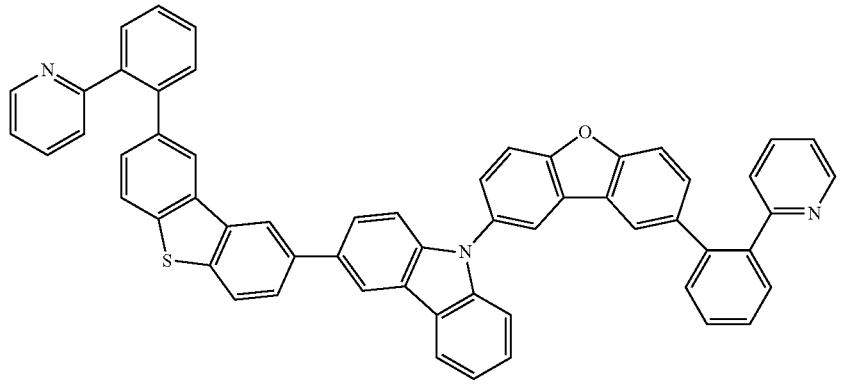
42

[Chem. 17]
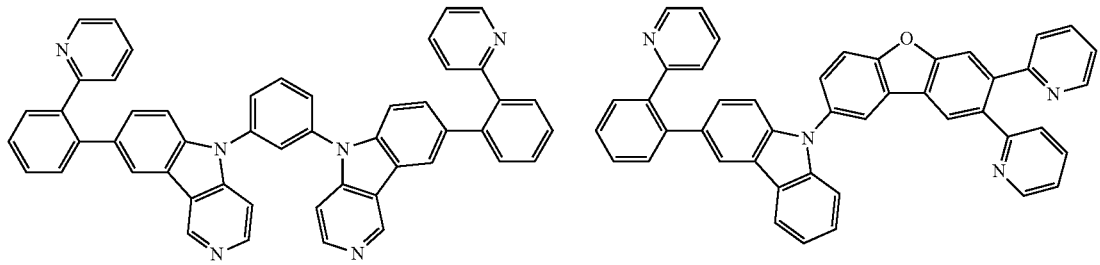
43 44
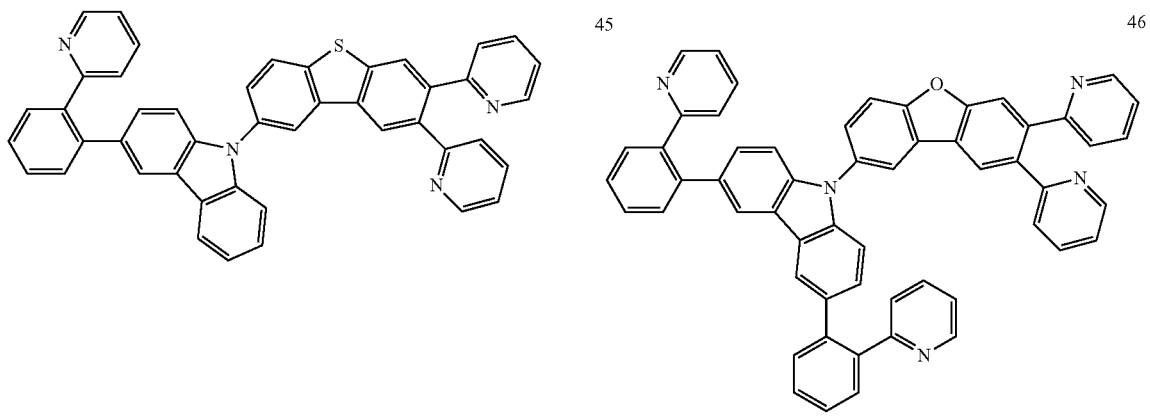
45 46
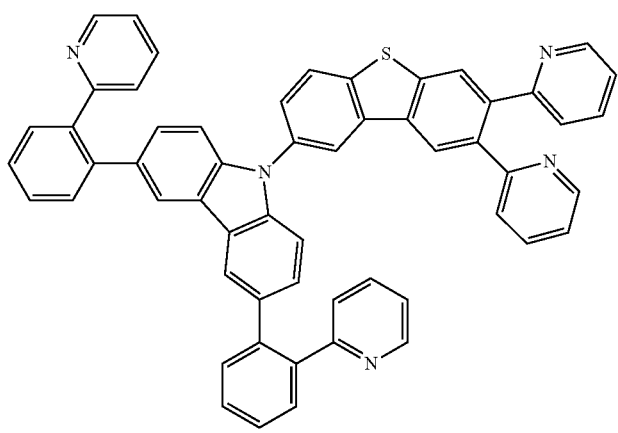
47
[Chem. 18]
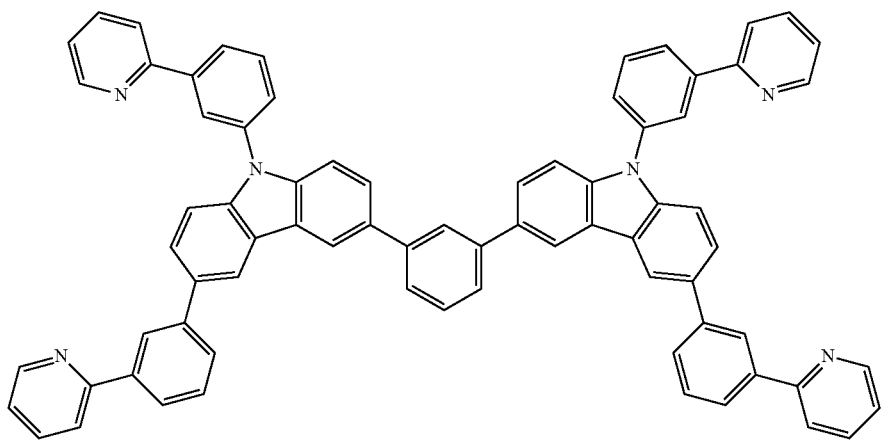
48

49
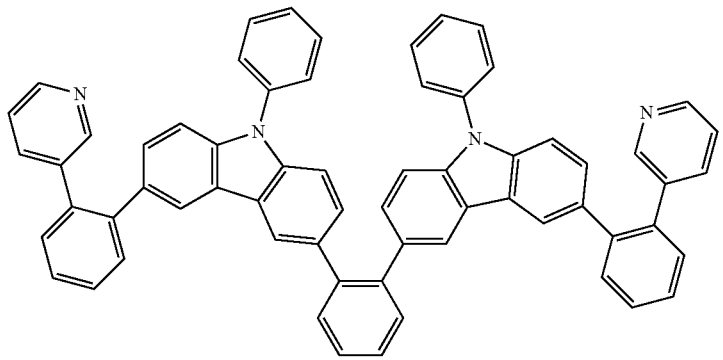
50
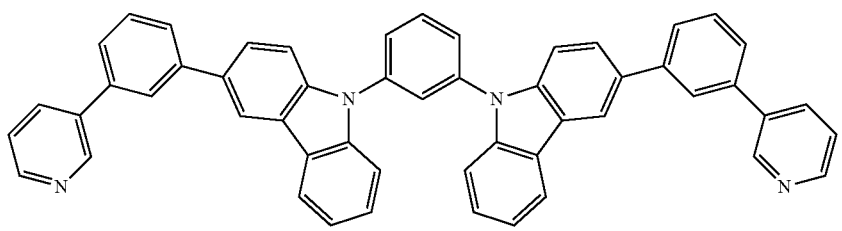
51
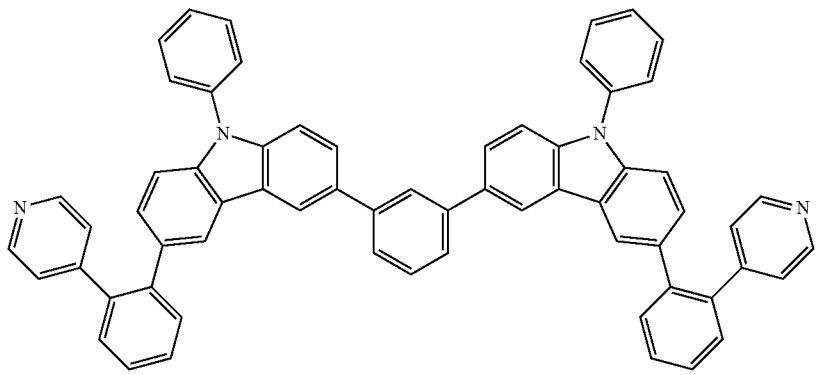
52
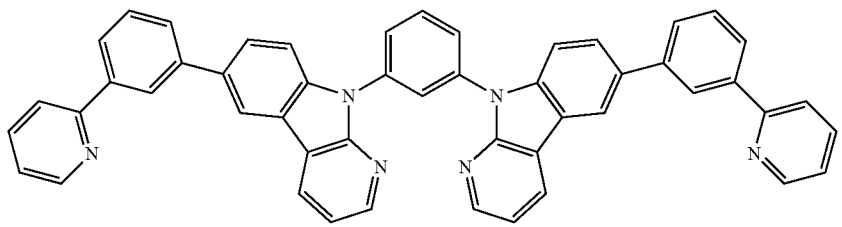
[Chem. 19]
53
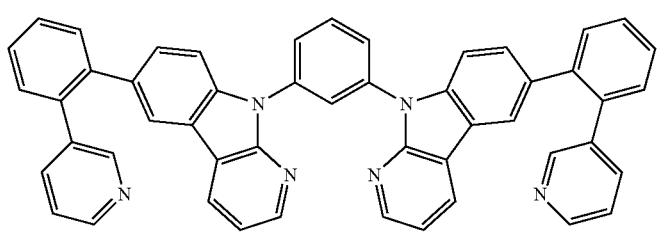

54
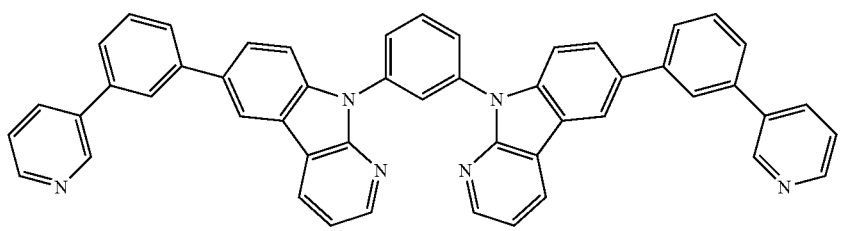
55
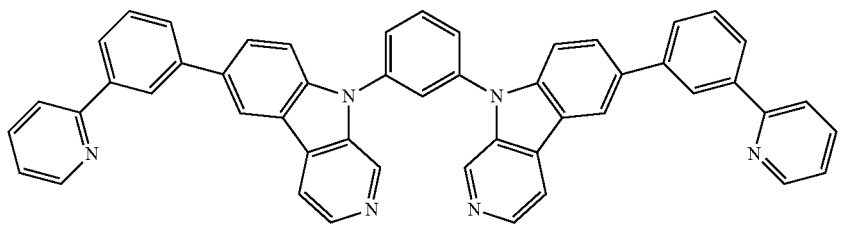
56
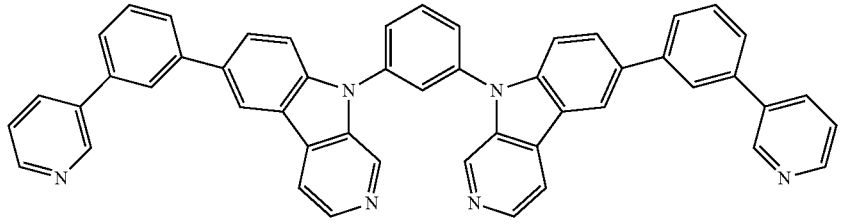
57
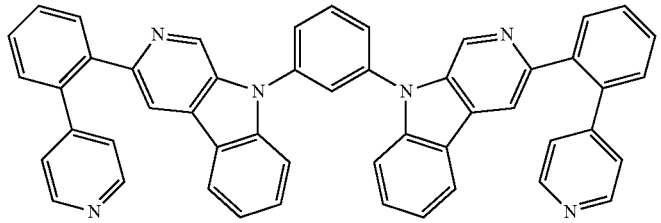
58
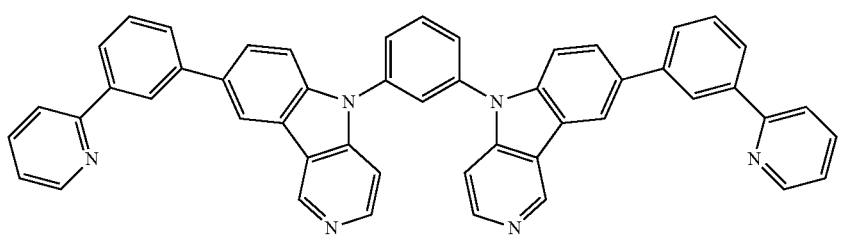
[Chem.20]
59
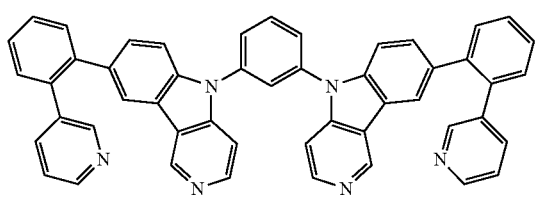
60
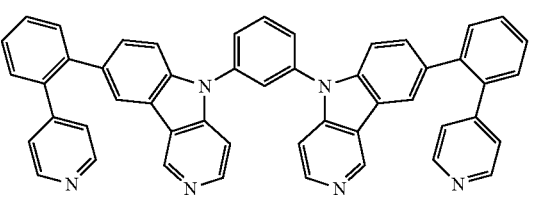
61
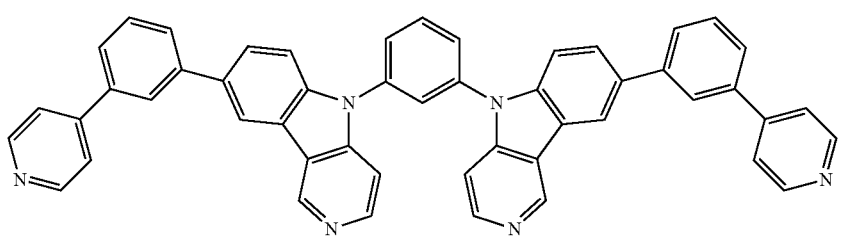

-continued
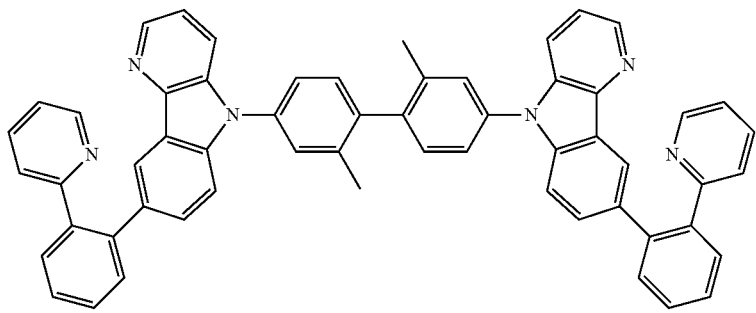
62
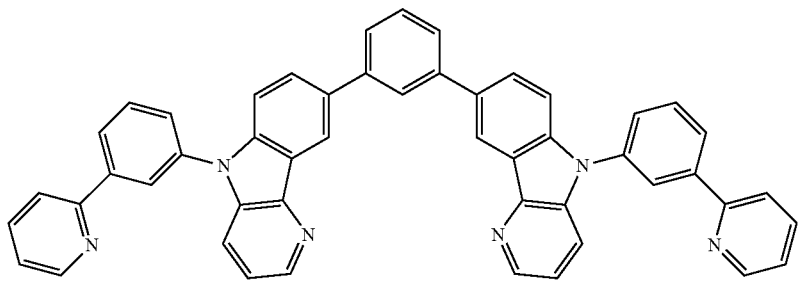
63
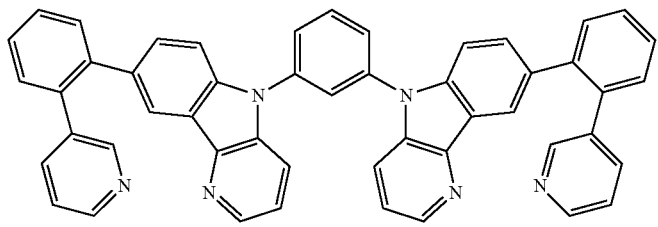
64
[Chem. 21]
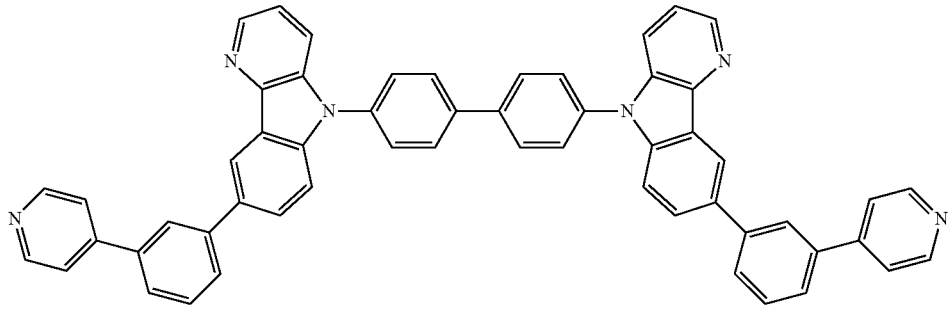
65
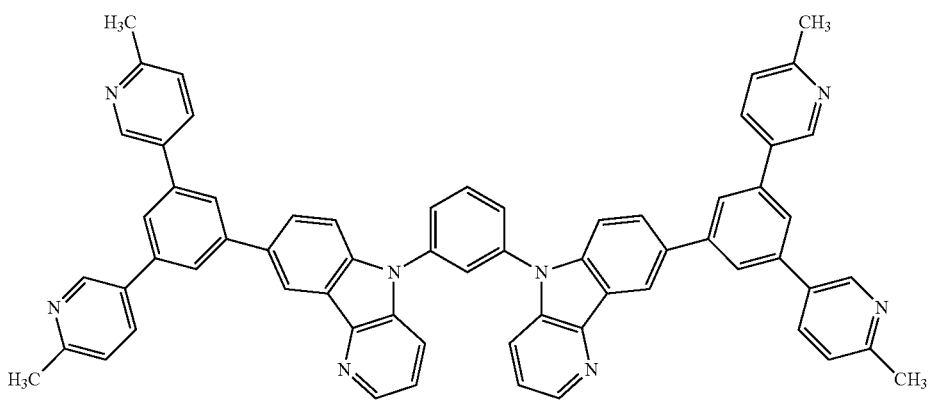
66

-continued
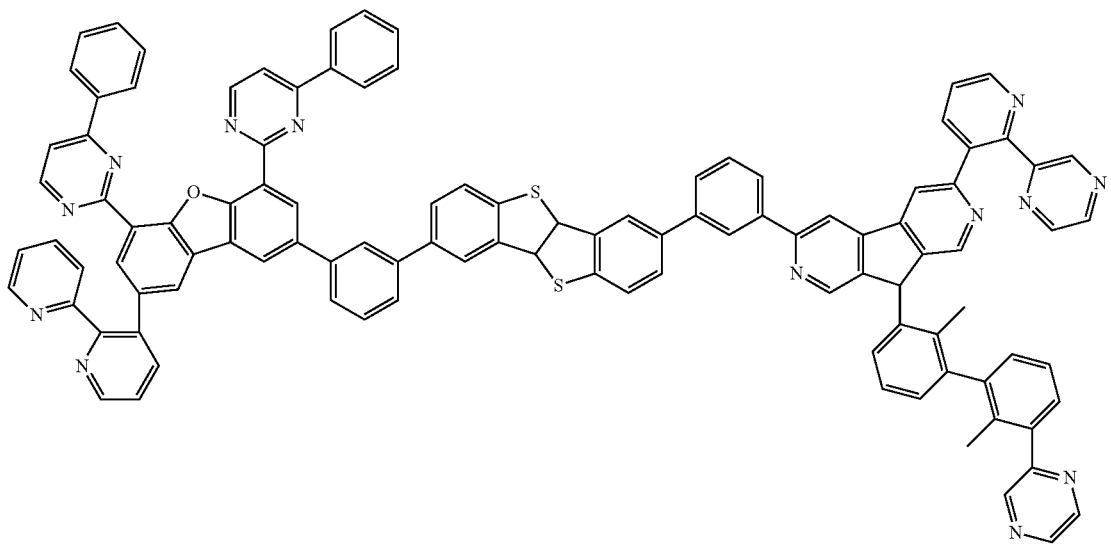
67
[Chem. 22]
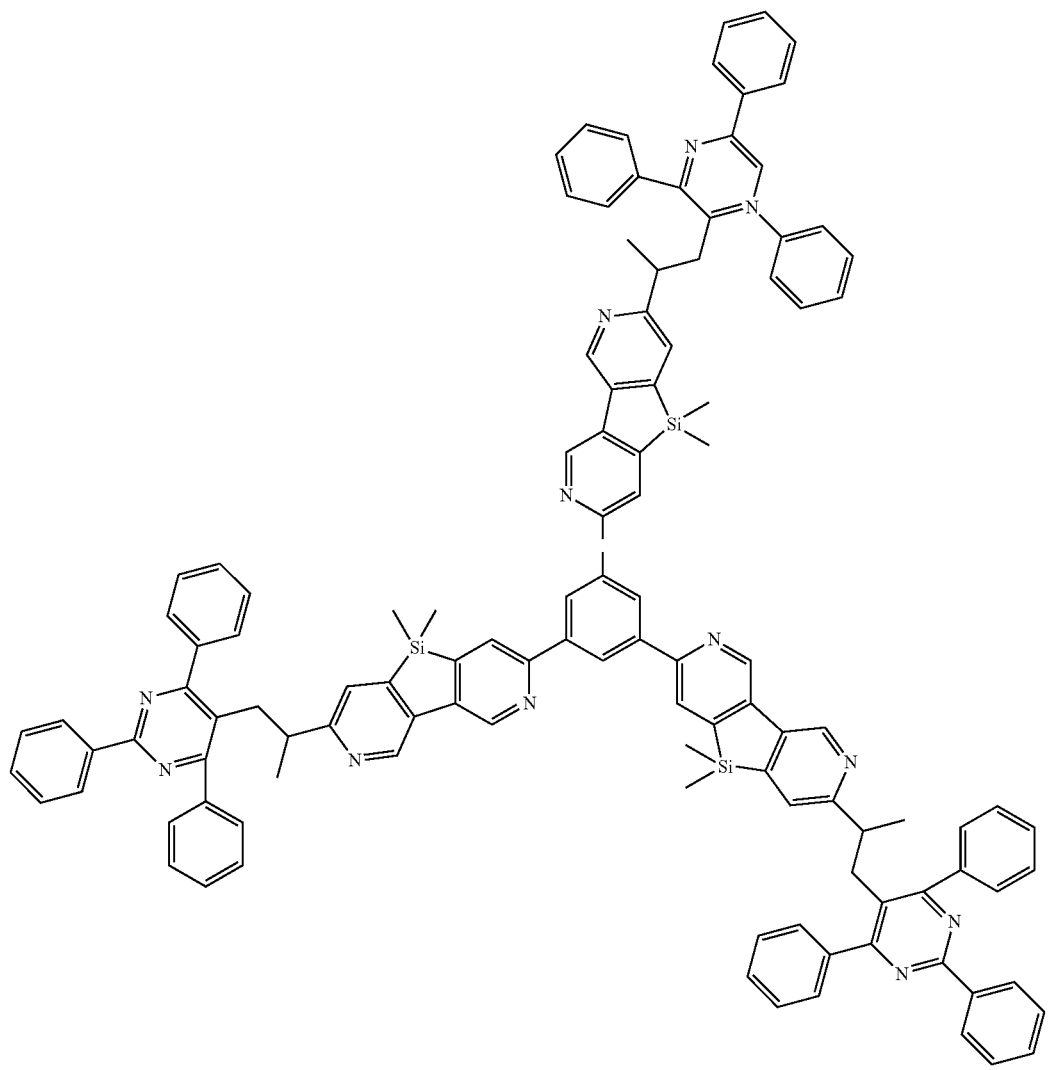
68

-continued
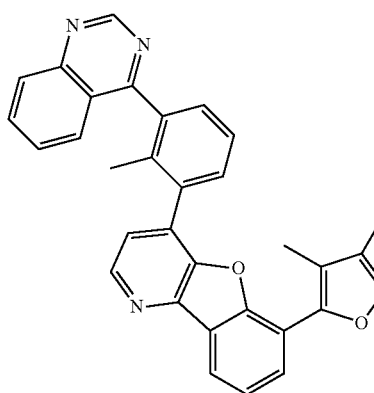
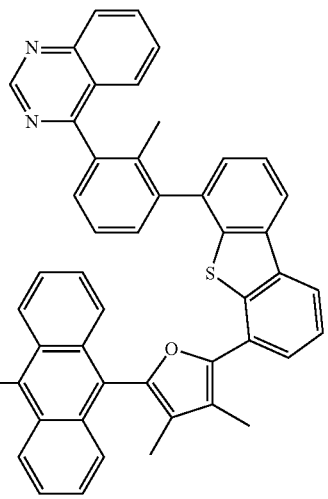
[Chem. 23]
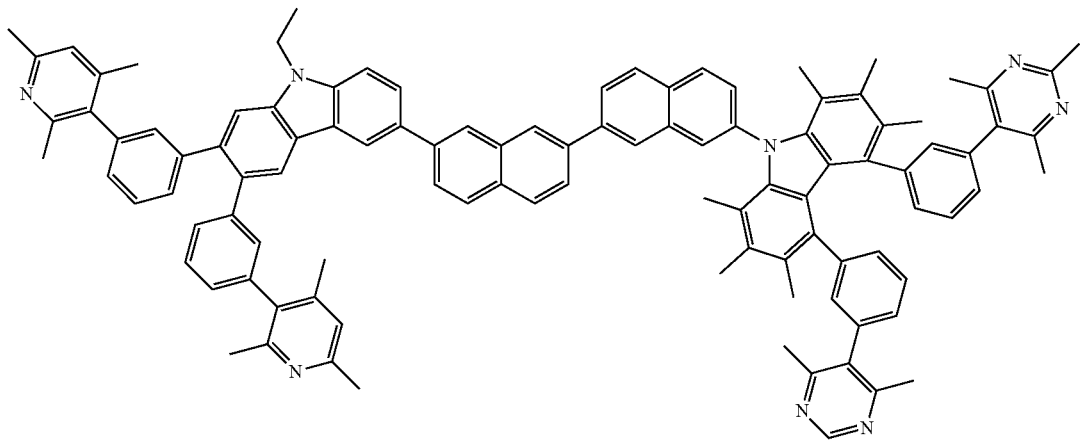
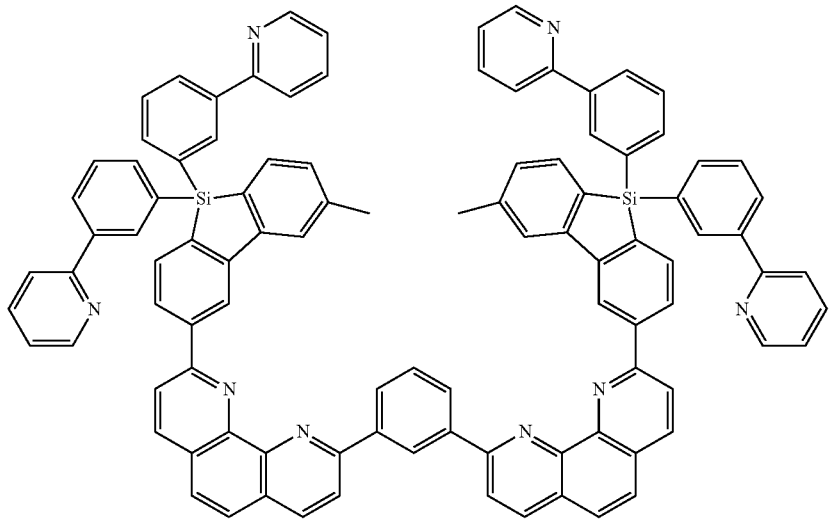

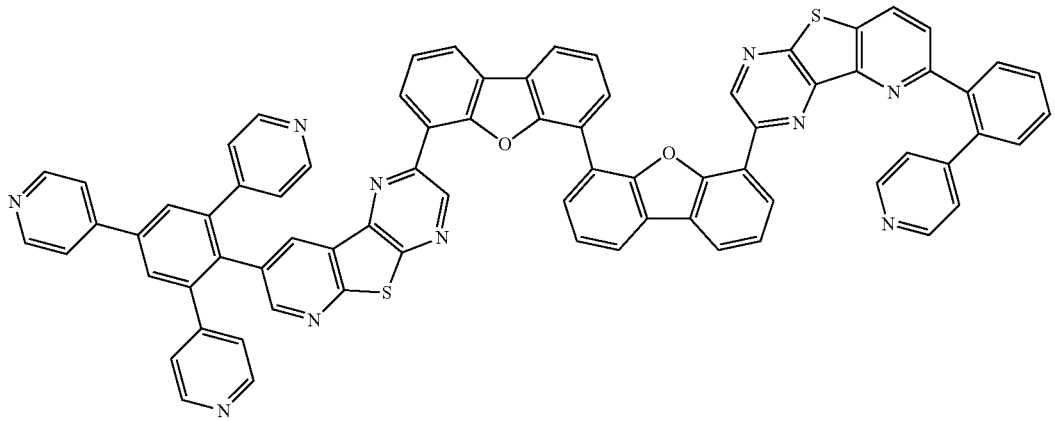
72
[Chem. 24]
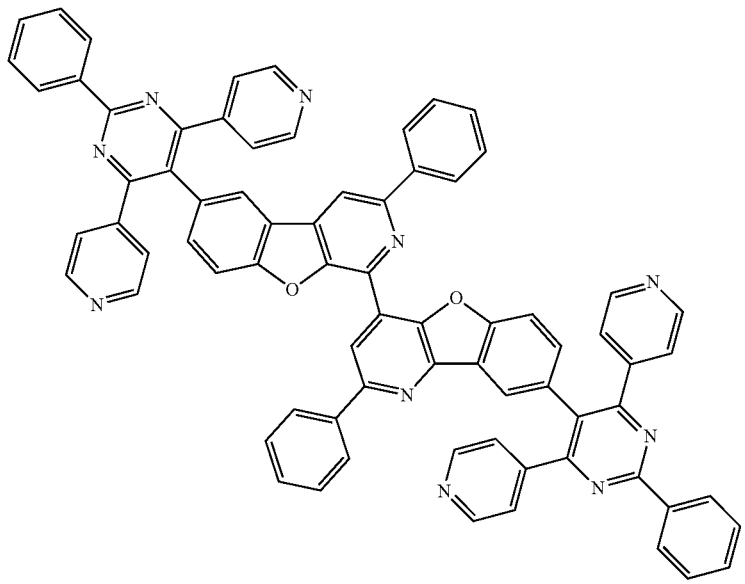
73
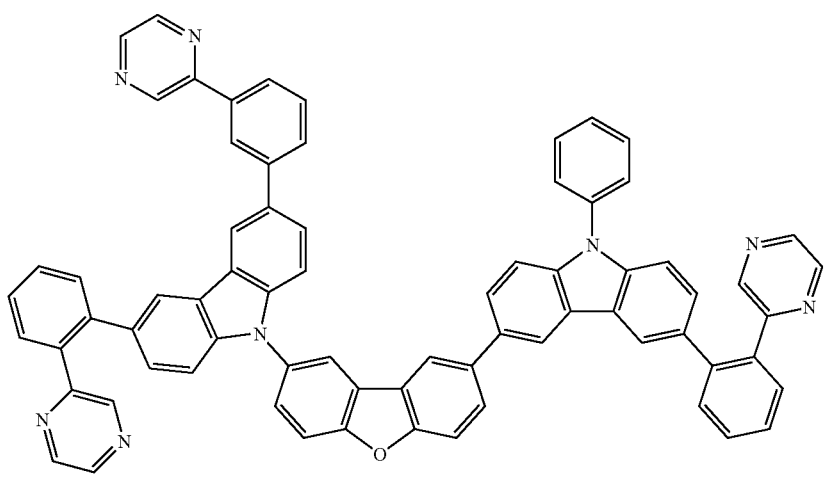
74

-continued
75
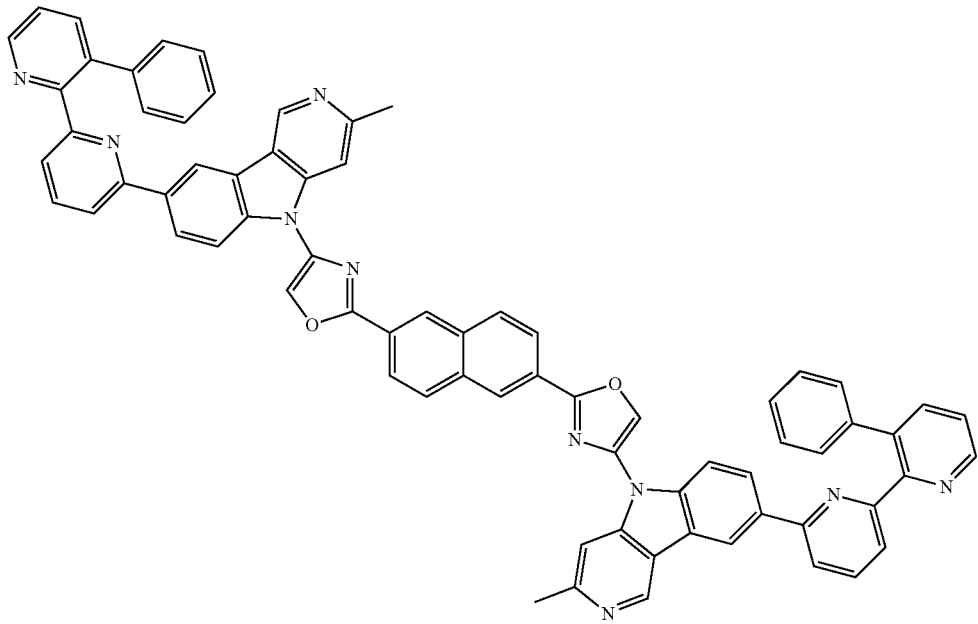
[Chem. 25]
76
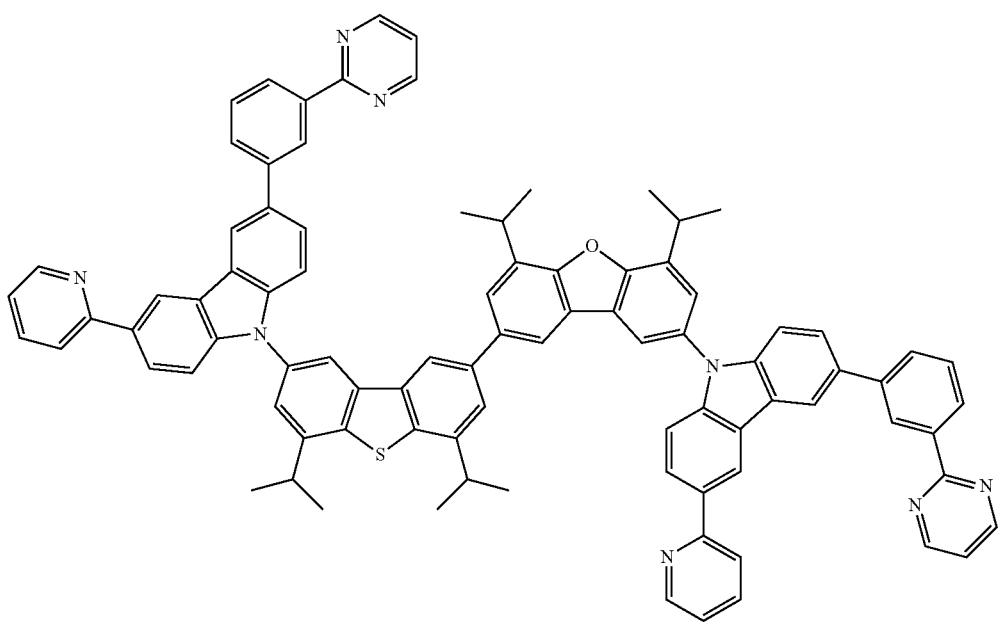
77
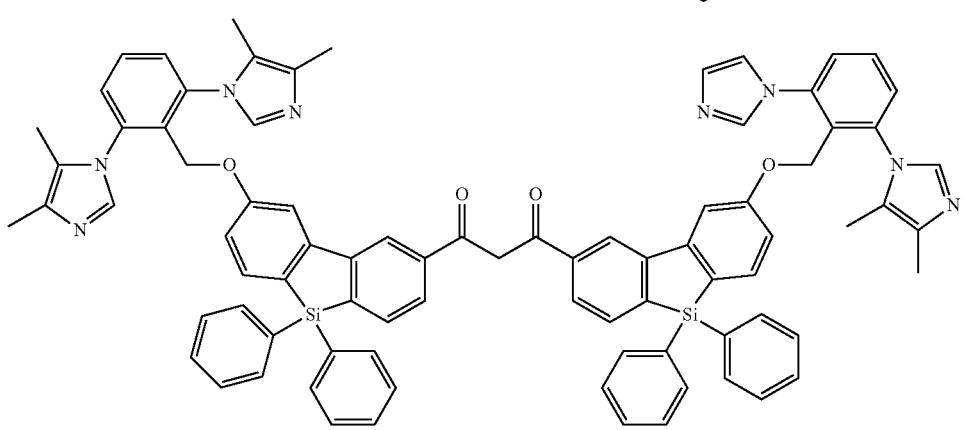

-continued
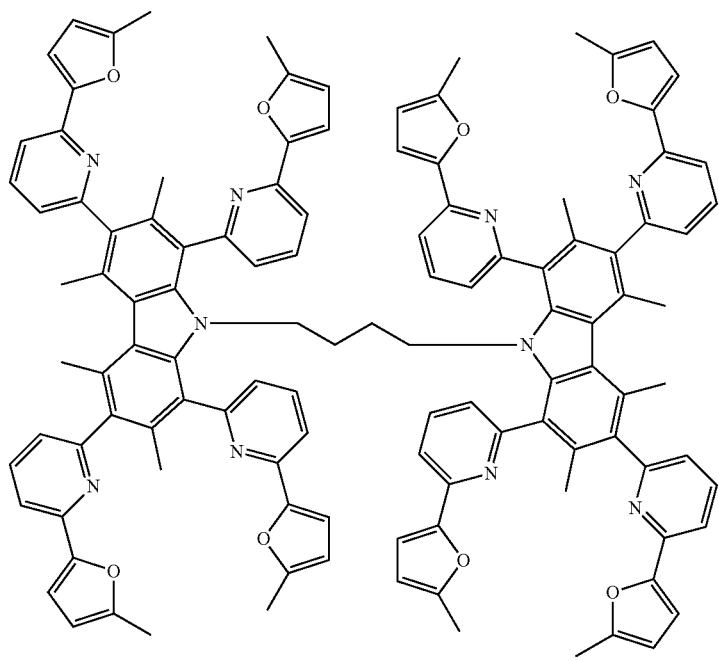
78
[Chem. 26]
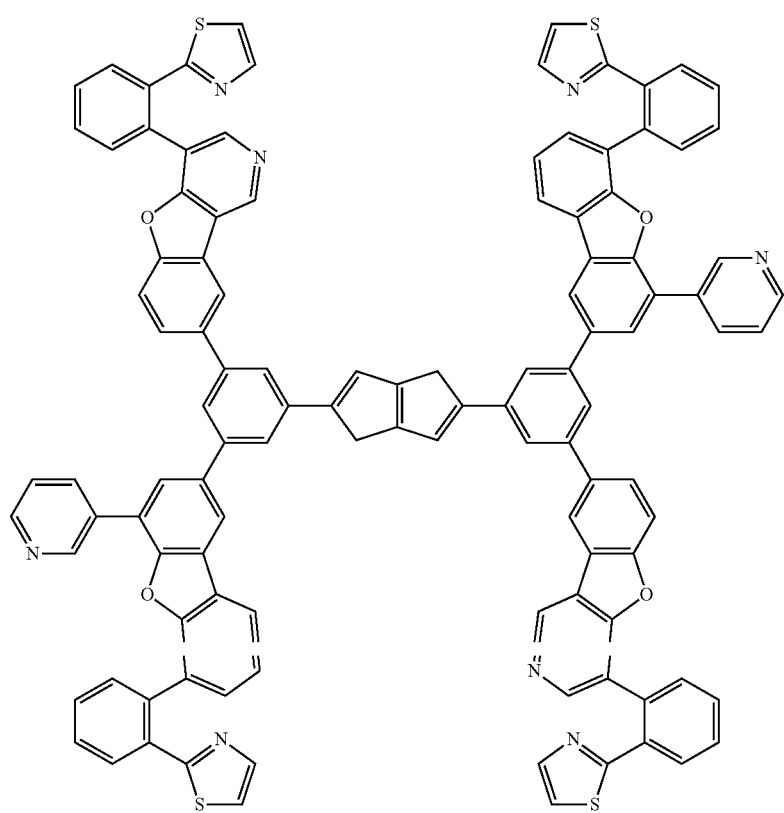
79

-continued
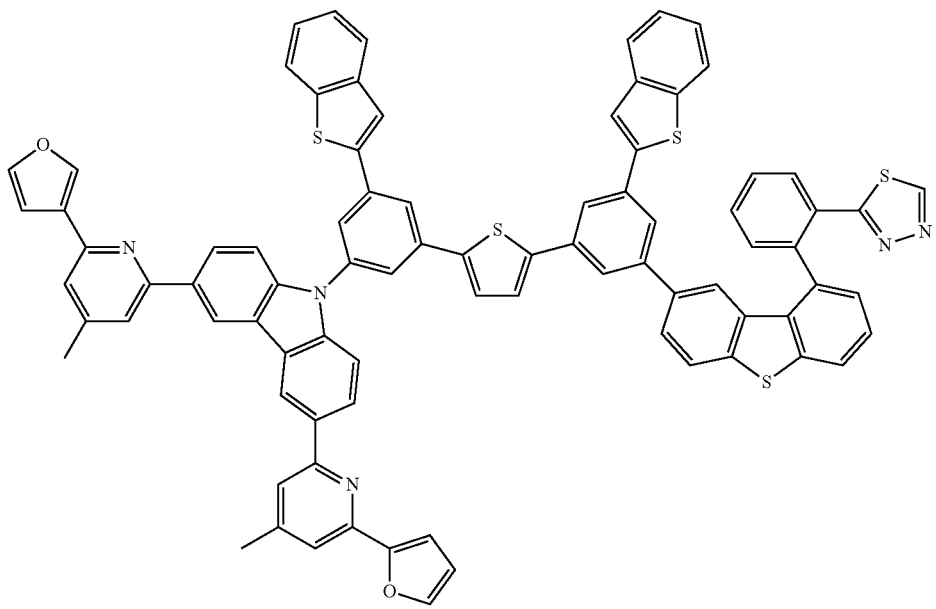
80
[Chem. 27]
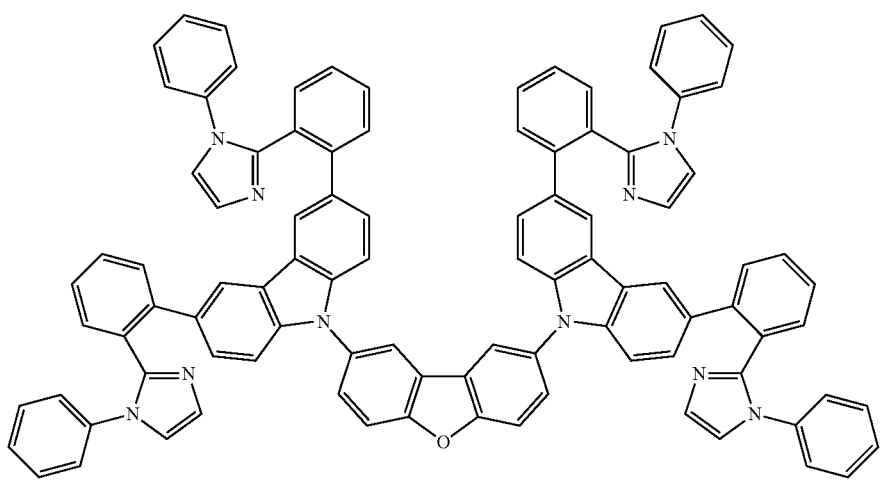
81
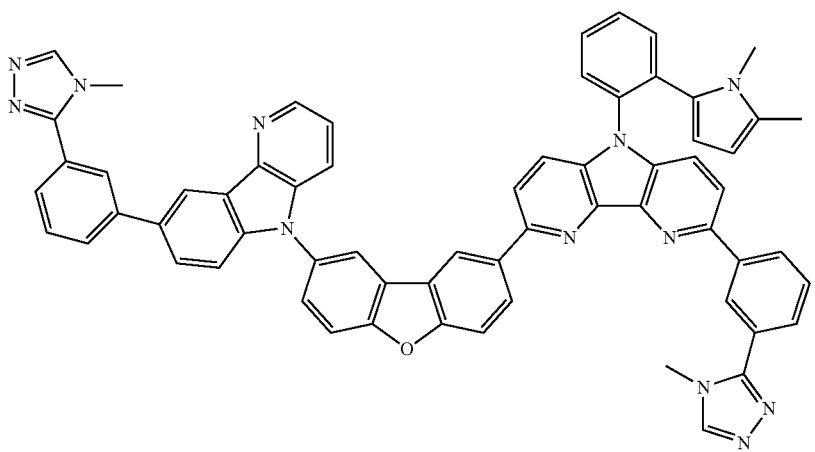
82

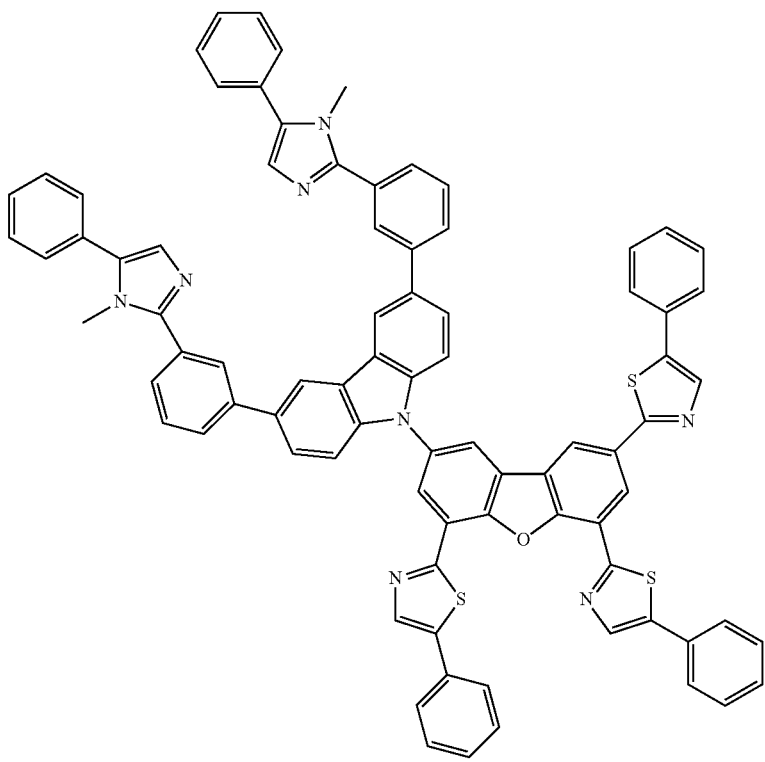
83
[Chem. 28]
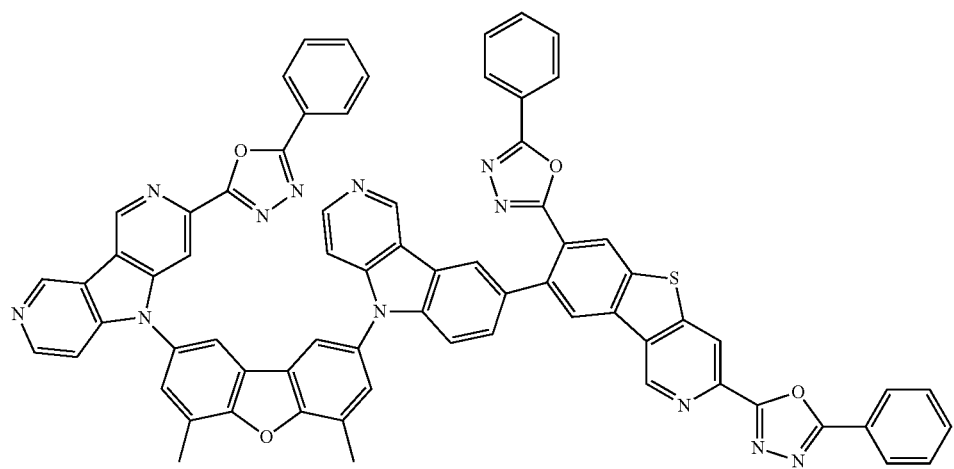
84

-continued
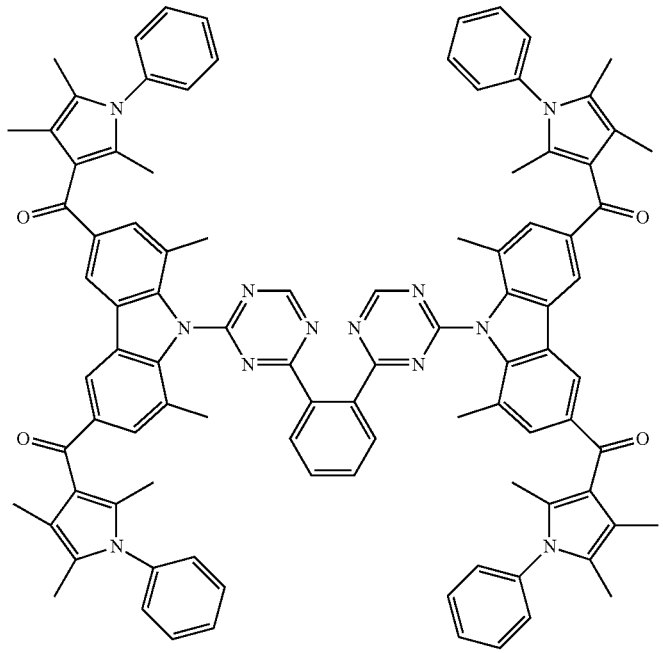
85
[Chem. 29]
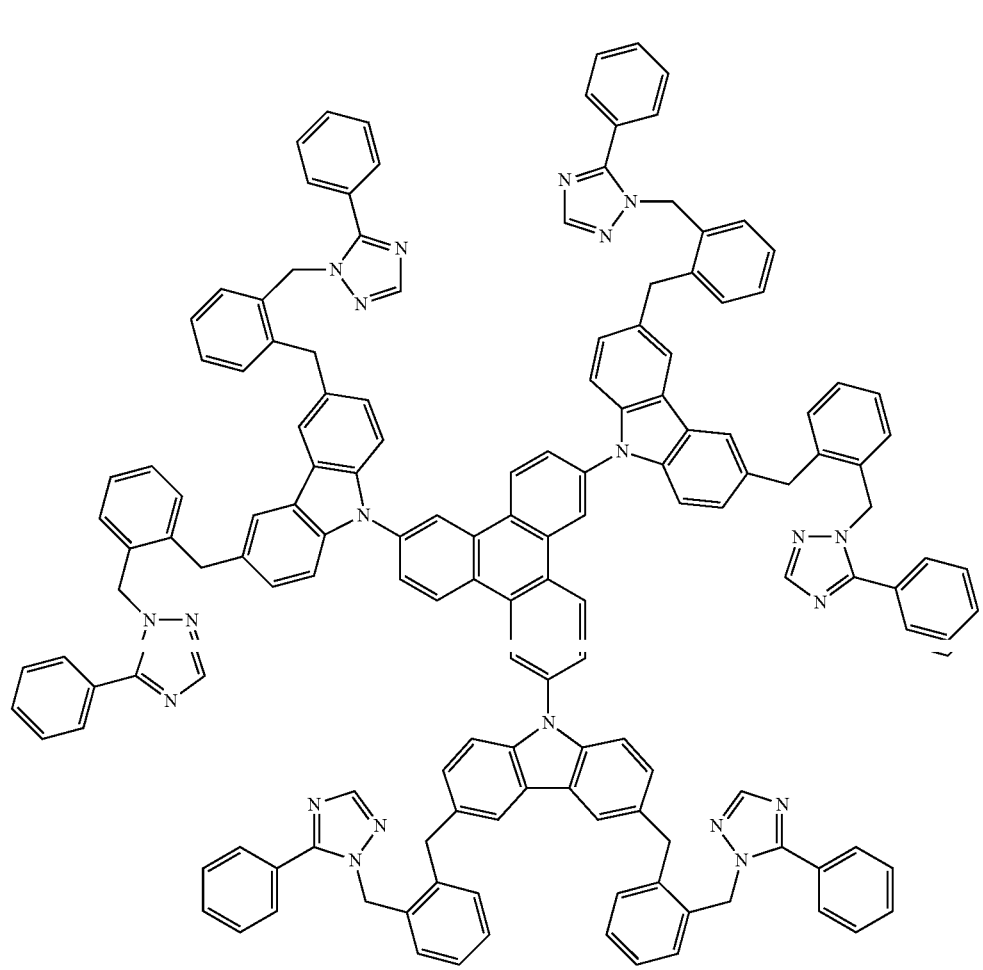
86

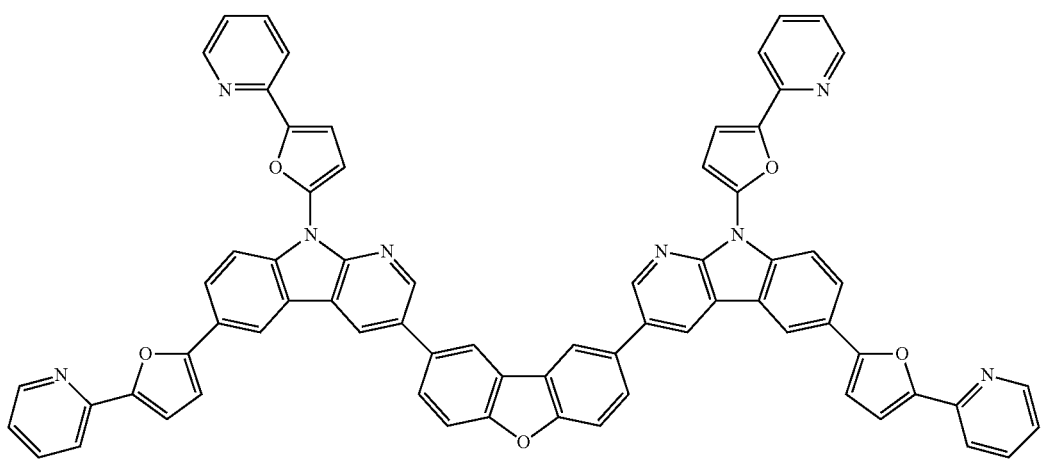
87
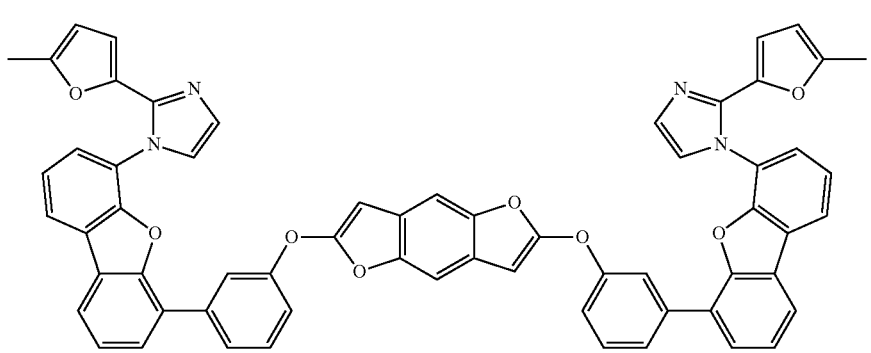
88
[Chem. 30]
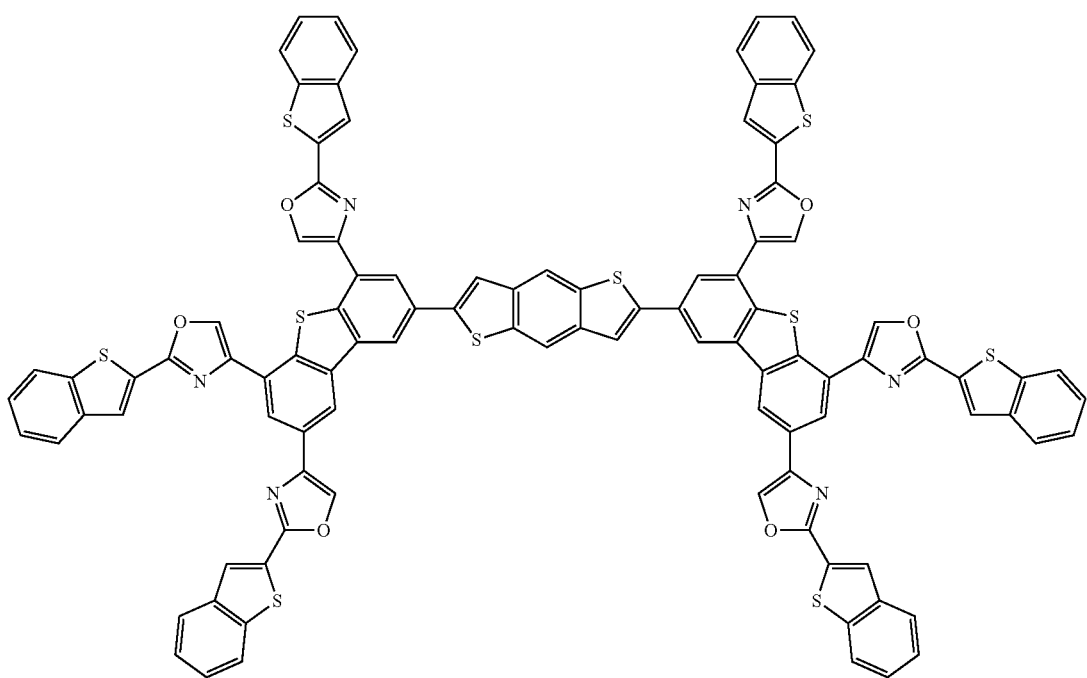
89

-continued
90
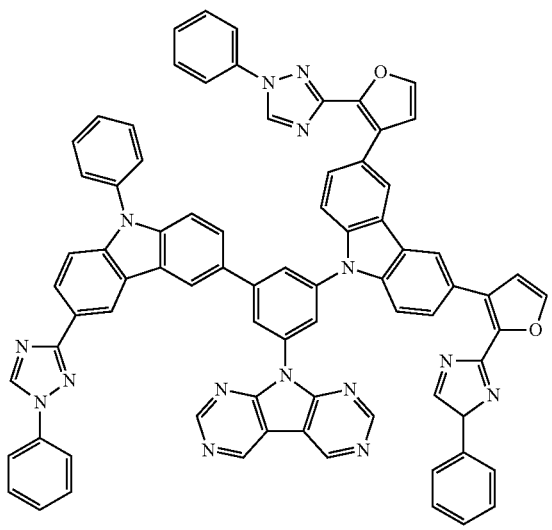
91
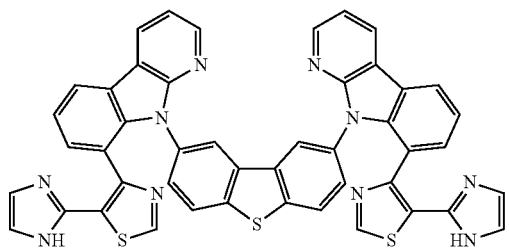
[Chem. 31]
92
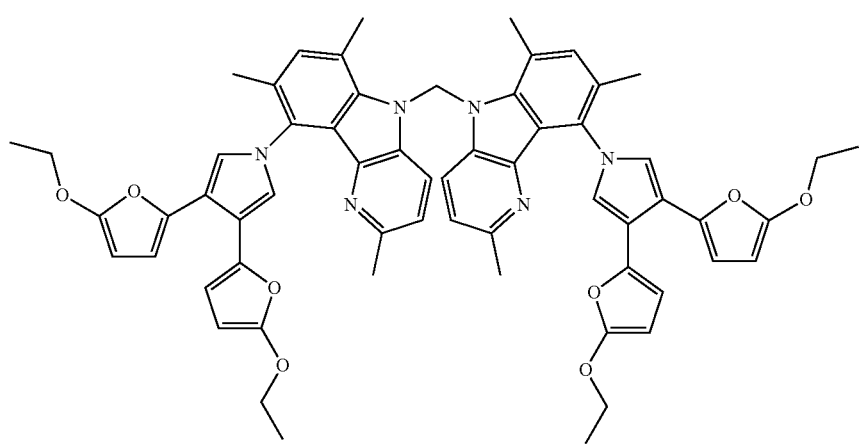
93
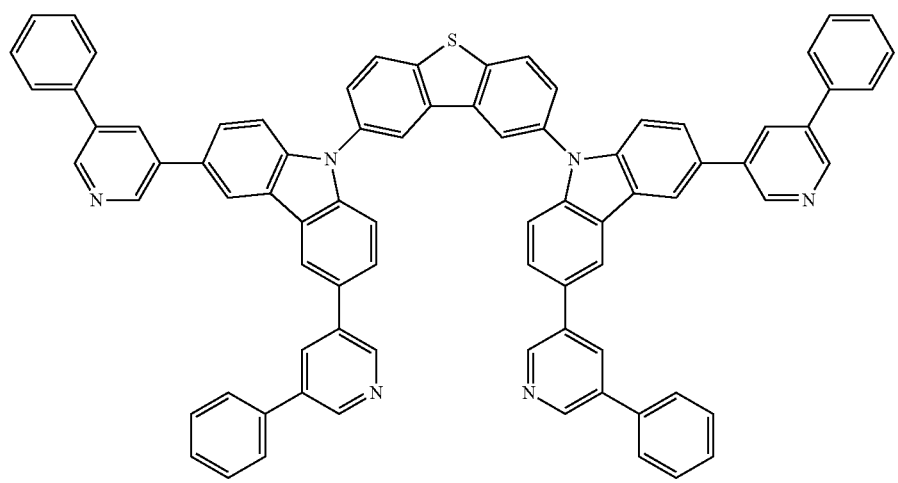

-continued
94
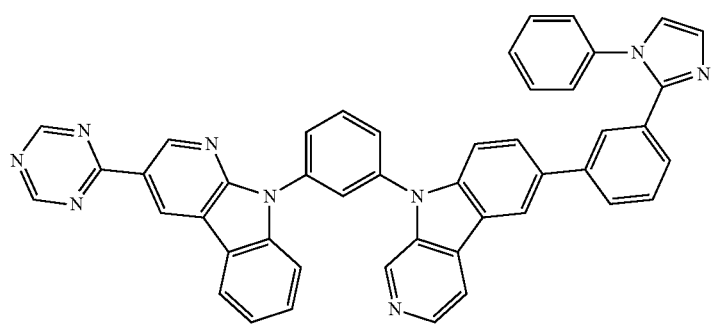
95
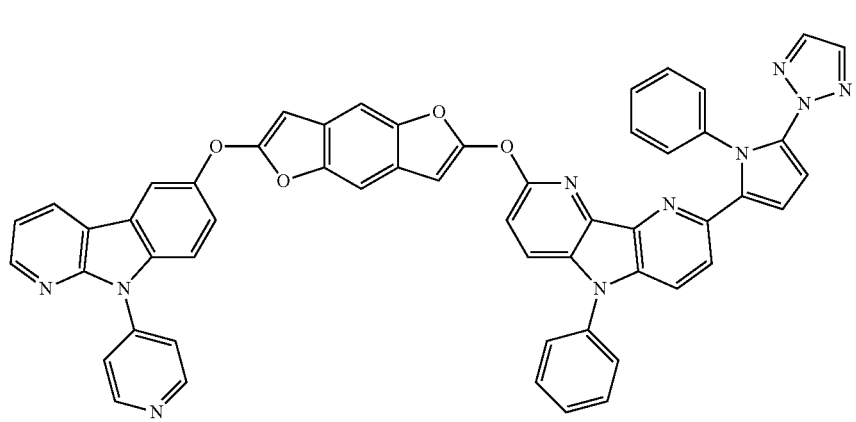
[Chem. 32]
96
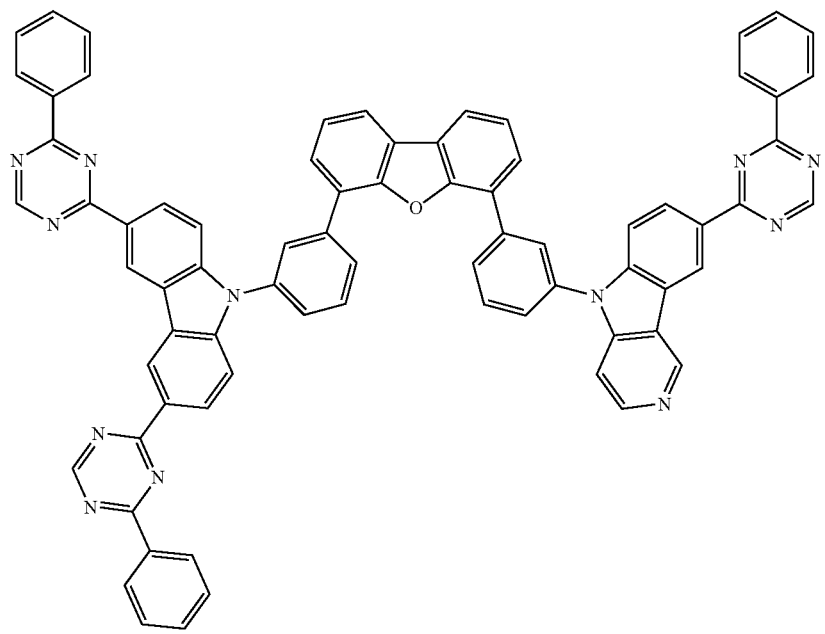

97
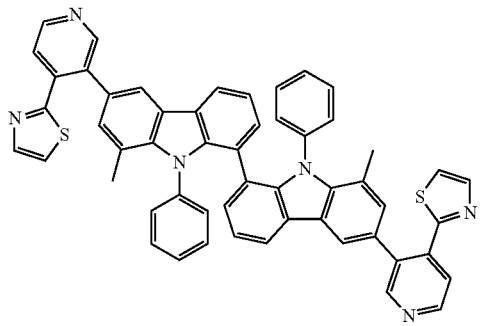
98
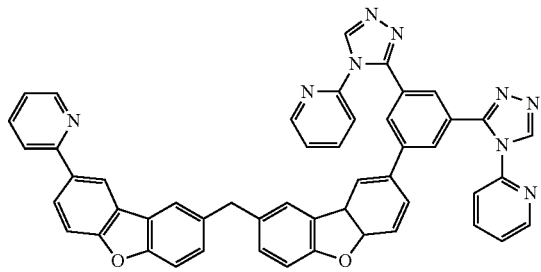
99
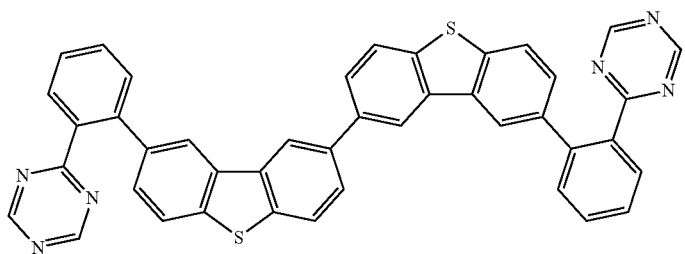
[Chem. 33]
100
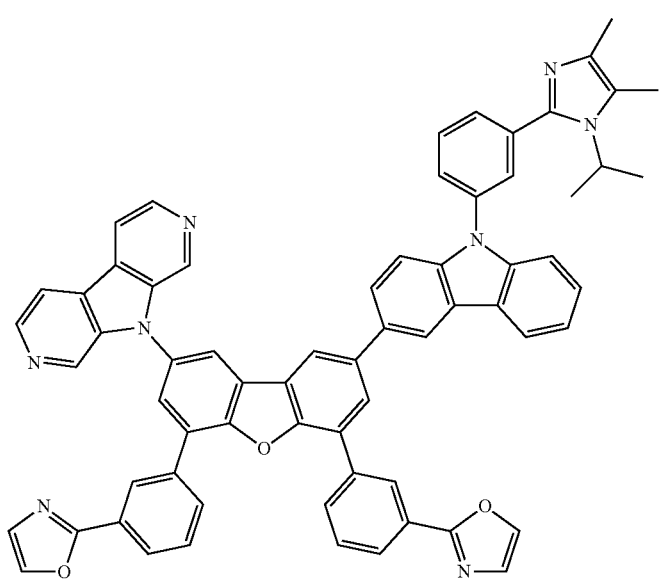

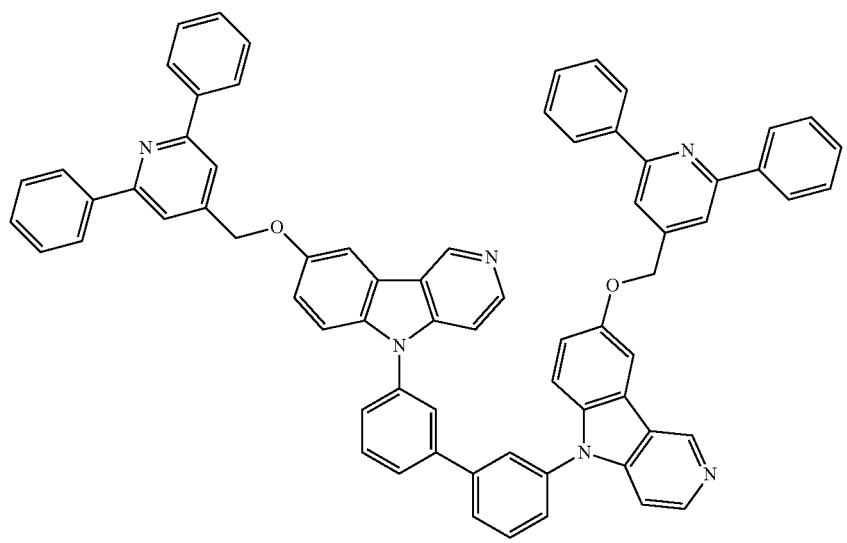
101
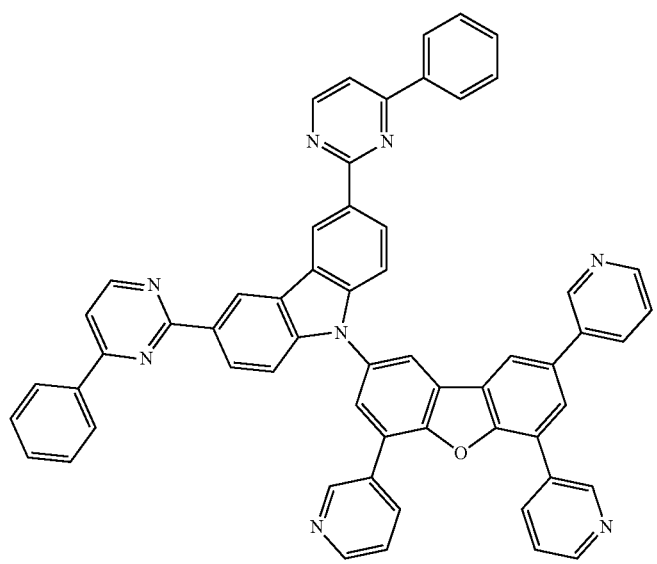
102
[Chem. 34]
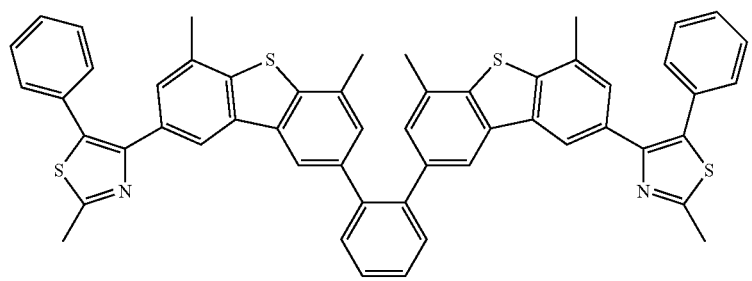
103

104
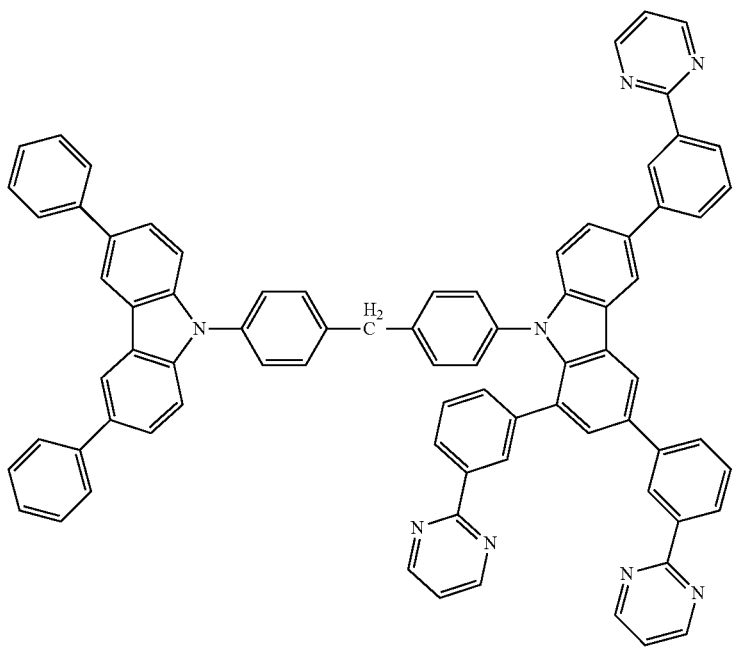
105
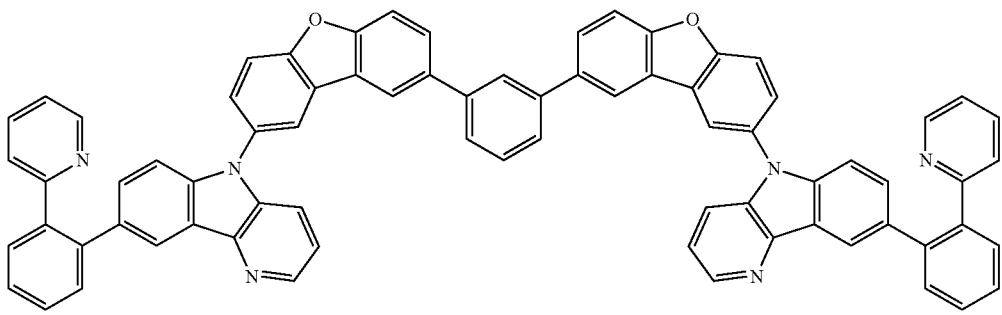
106
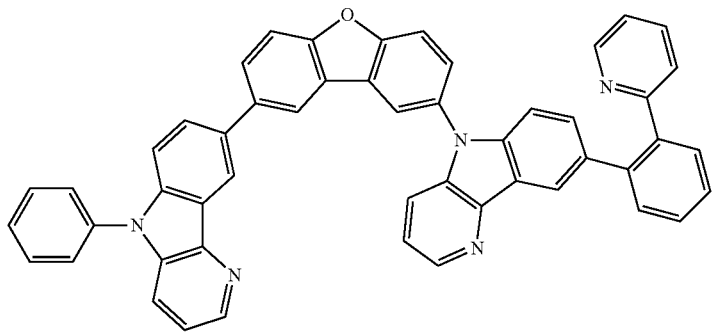

[Chem. 35]
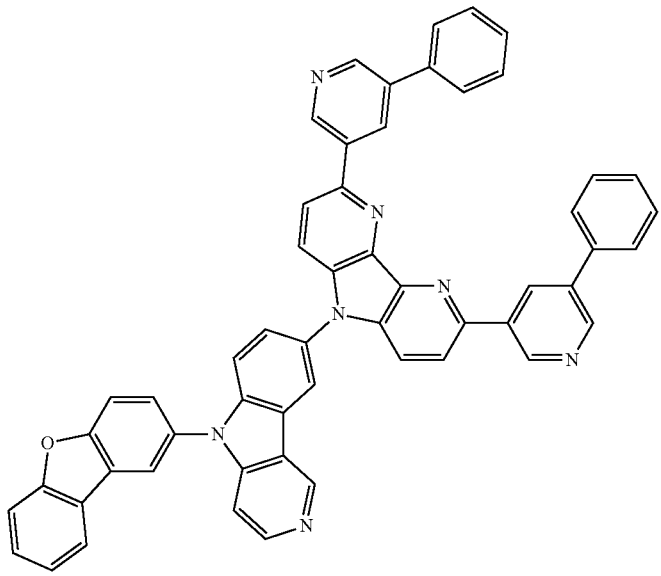
107
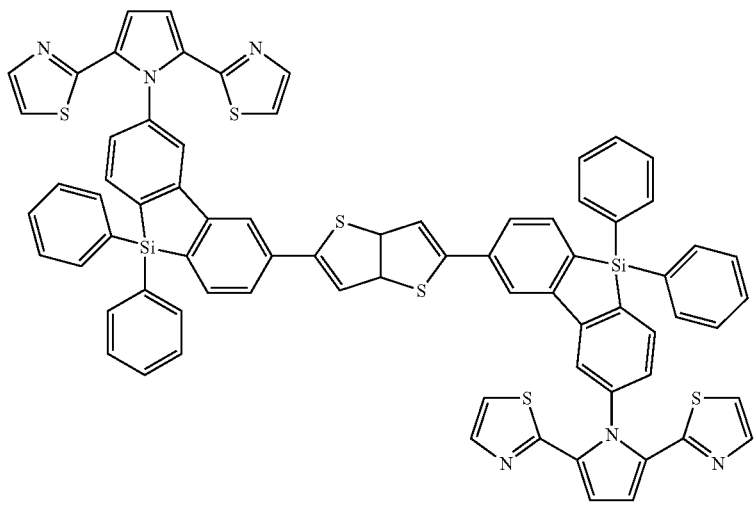
108
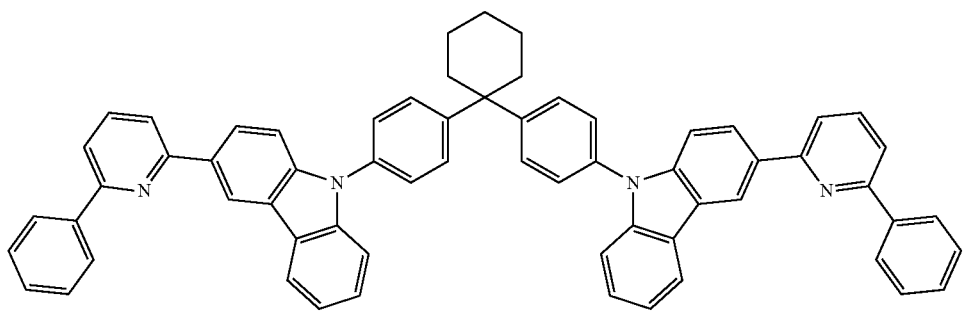
109

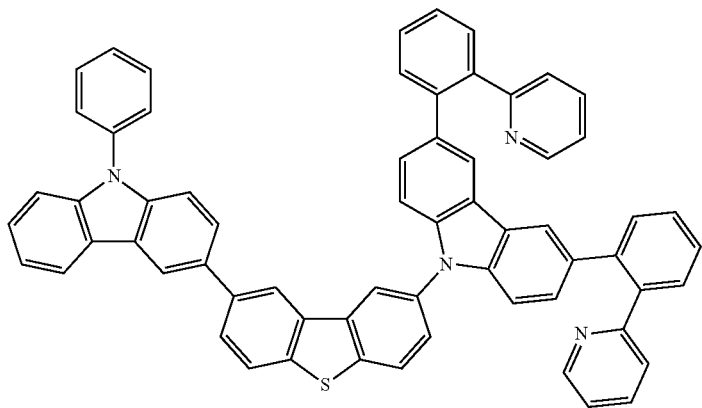
110
[Chem. 36]
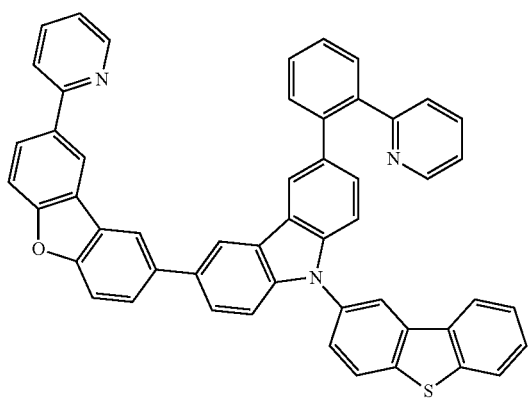
111
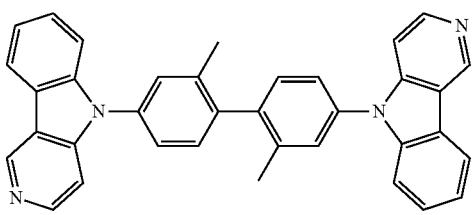
112
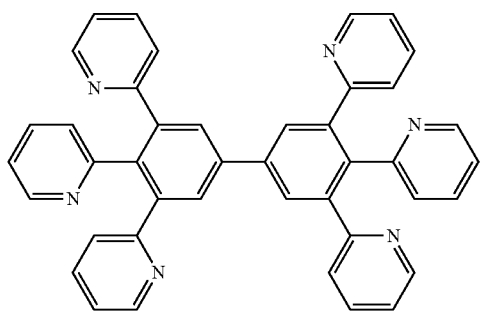
113
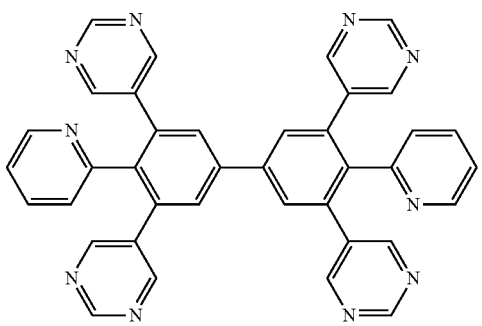
114
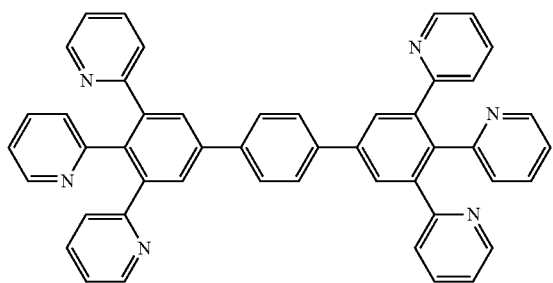
115
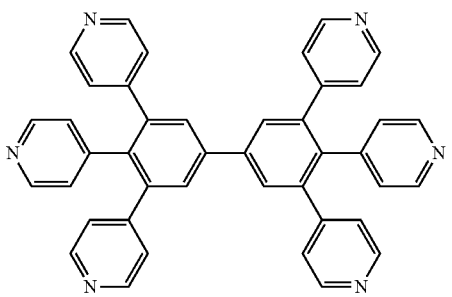
116

-continued
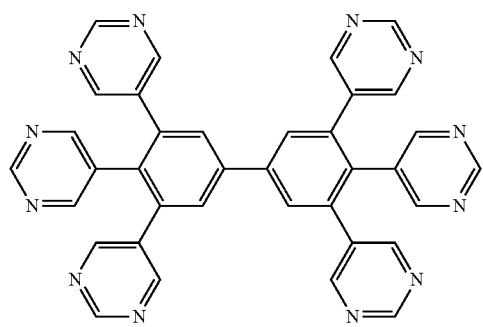
117
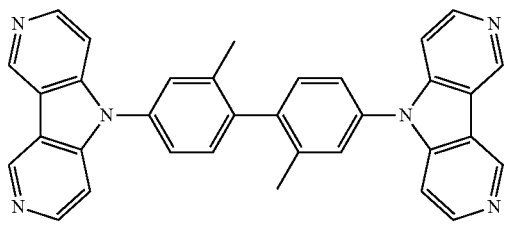
118
[Chem. 37]
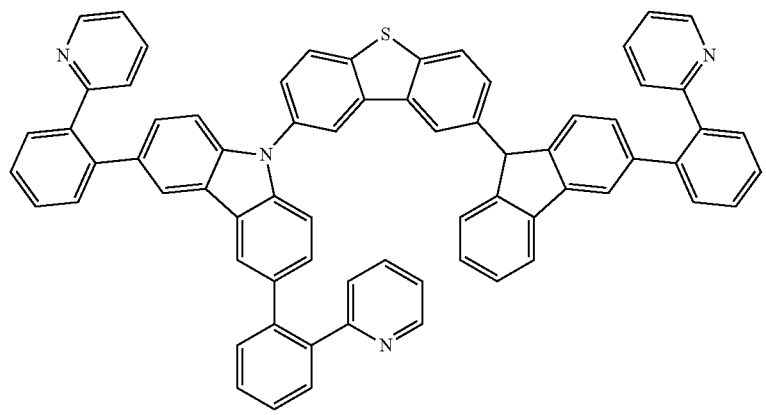
119
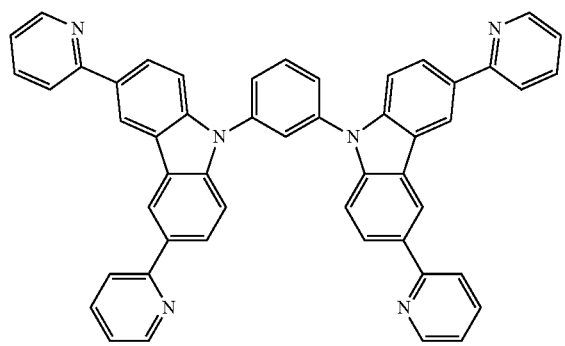
120
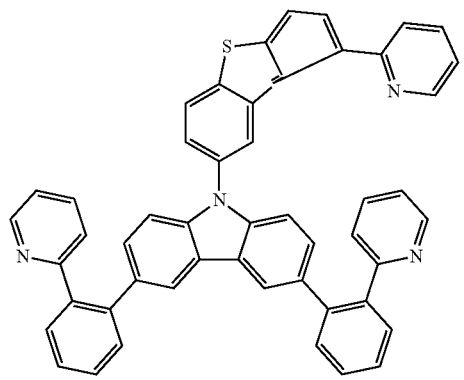
121
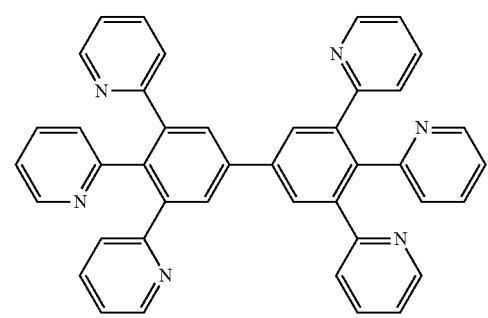
122
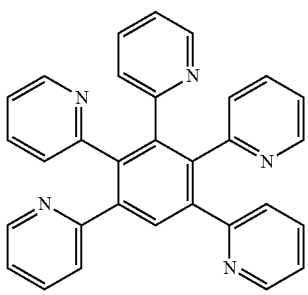
123

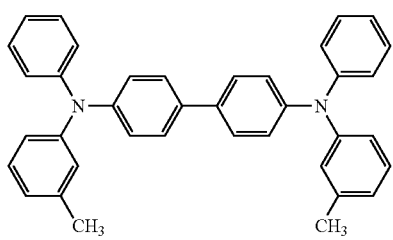
124
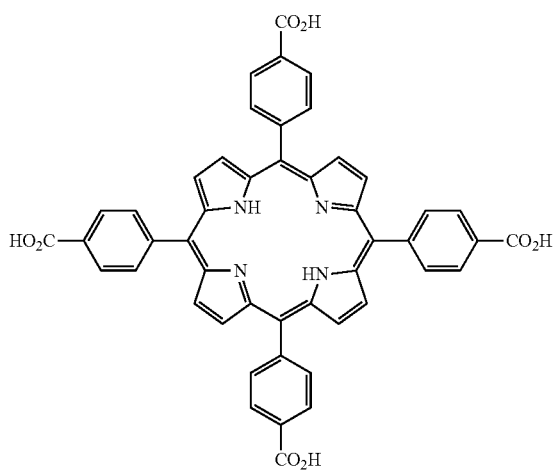
125
[Synthetic Example of Compounds]
Hereinafter, as a synthetic example of a typical compound, a specific synthetic example of Compound 5 will be described, but the present invention is not limited thereto.
Synthesis of Compound 5
[Chem. 38]
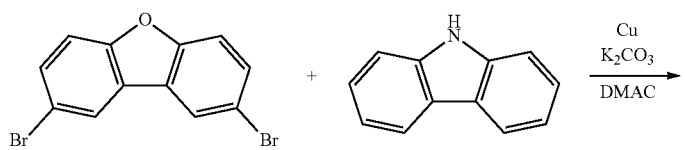
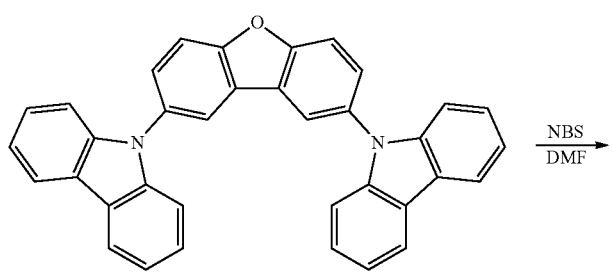
Intermediate 1
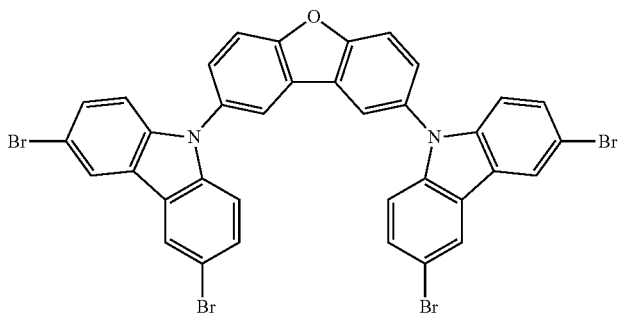
Intermediate 2

-continued

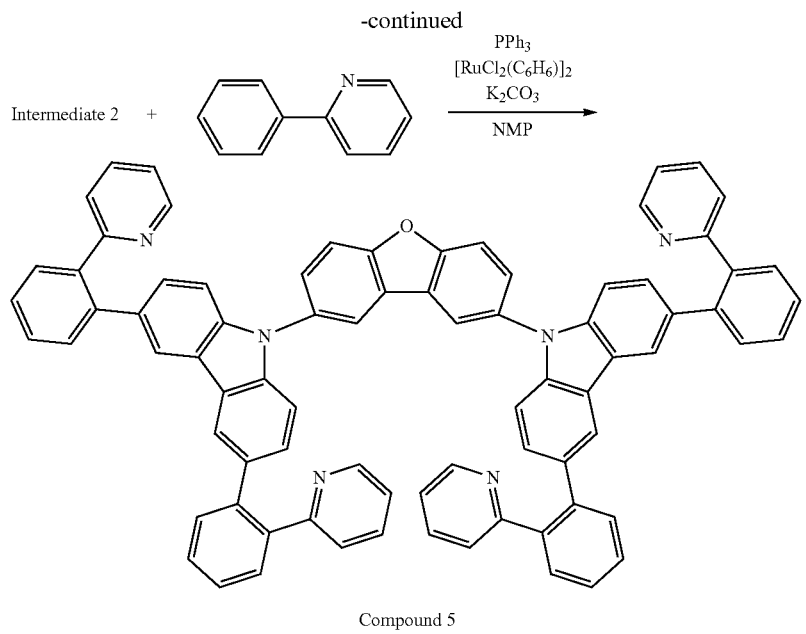

Compound 5

Process 1: (Synthesis of Intermediate 1)
Under nitrogen atmosphere, 2,8-dibromodibenzofuran (1.0 mole), of carbazole (2.0 moles), copper powder (3.0 moles), potassium carbonate (1.5 moles) were mixed in 300 ml of DMAc (dimethylacetamide) and then stirred for 24 hours at 130° C. After the reaction liquid thus obtained was cooled to room temperature, 1 L of toluene was added to the liquid, the resultant liquid was washed three times with distilled water, the solvent was distilled away from the washed layer under reduced pressure, and purification of the residue with silica gel flash chromatography (n-heptane:toluene=4:1 to 3:1) gave Intermediate 1 at a yield of 85%.

Process 2: (Synthesis of Intermediate 2)
At room temperature under atmospheric pressure, Intermediate 1 (0.5 mole) was dissolved into 100 ml of DMF (dimethylformamide), NBS (N-bromosuccinic acid imide) (2.0 moles) was added, and then stirred over one night at room temperature. The obtained precipitate was filtered and washed with methanol, and thus Intermediate 2 was obtained at a yield of 92%.

Process 3: (Synthesis of Compound 5)
Under nitrogen atmosphere, Intermediate 2 (0.25 mole), 2-phenylpyridine (1.0 mole), ruthenium complex [(η6-C6H6)RuCl2]2 (0.05 mole), triphenylphosphine (0.2 mole), potassium carbonate (12 moles) were mixed in 3 L of NMP (N-methyl-2-pyrrolidone), and then stirred over one night at 140° C.

After the reaction liquid was cooled to room temperature, 5 L of dichloromethane was added, and then the liquid was filtered. The solvent was distilled away from the filtrate under reduced pressure (800 Pa, 80° C.), and the residue was purified with silica gel flash chromatography (CH2Cl2:Et3N=20:1 to 10:1).

After the solvent was distilled away under reduced pressure, the residue was again dissolved into dichloromethane and washed three times with water. After the substance obtained by the washing was dried with anhydrous magnesium sulfate, the solvent was distilled away under reduced pressure from the dried substance and thus Compound 5 was obtained at a yield of 68%.

<Electrode Material 27b>
The electrode material 27b is silver or an alloy mainly containing silver. Silver (Ag) may contain palladium (Pd), Copper (Cu), Gold (Au) or the like, which is added for ensuring the stability of silver, and the purity of silver is 99% or more. Furthermore, the alloy mainly containing silver is an alloy having a silver content rate of 50% or more. Example of such an alloy include silver magnesium (AgMg), silver copper (AgCu), silver palladium (AgPd), silver palladium copper (AgPdCu), silver indium (AgIn), silver gold (AgAu), silver aluminum (AgAl), silver zinc (AgZn), silver tin (AgSn), silver platinum (AgPt), silver titanium (AgTi), silver bismuth (AgBi), and the like.

<Transparent Electrode 1>
The transparent electrode 1 produced through the use of the above manufacturing apparatus 10-1 of the first embodiment and the above-described materials has a two-layer laminated structure of the nitrogen-containing layer 1a and the transparent electrode layer 1b formed adjacent thereto. In particular, the transparent electrode layer 1b constituted to contain silver as the main component is a layer for which the film formation is started adjacent to the nitrogen-containing layer 1a between starting the formation and two minutes after finishing the formation of the nitrogen-containing layer 1a, and has a thickness of 12 nm or more.

<Effects of the First Embodiment>
According to the above-explained manufacturing apparatus 10-1 of the first embodiment, it is possible to form the transparent electrode layer 1b mainly containing silver adjacent to the nitrogen-containing layer 1a constituted of the nitrogen-containing compound, after having started the formation of the nitrogen-containing layer 1a and within two minutes after the film formation has been finished. Therefore, effects as follows can be obtained.

That is, the transparent electrode layer 1b mainly containing silver is formed adjacent to the nitrogen-containing layer 1a. Therefore, in the formation of the electrode layer 1b, silver atoms constituting the electrode layer 1b interact with the compound containing nitrogen atoms constituting the nitrogen-containing layer 1a to thereby reduce a diffusion length of the silver atoms on the surface of the nitrogen-containing layer 1a, which causes the suppression of agglomeration of silver. As a result, generally, a silver thin film that is easily isolated in the form of island due to film growth through Volumer-Weber (VW) type (nucleas growth type) is formed due to film growth through Frank-van der Merwe (FM) type (mono-layer growth type). Therefore, an electrode layer having a uniform thickness can be obtained even though the layer is thin. Accordingly, an electrode layer 1b having a uniform thickness can be obtained even though the layer is thin.

Furthermore, the transparent electrode layer 1b is formed adjacent to the nitrogen-containing layer 1a within two minutes (preferably within one minute) after the formation of the nitrogen-containing layer 1a. Thereby, as will be explained in detail in the following example, it is confirmed that the transparent electrode layer 1b becomes a film having a higher continuity.

Moreover, the transparent electrode layer 1b constituting the transparent electrode 1 is formed having a thickness of 12 nm or less in which the sheet resistance can be measured. Thereby, the transparent electrode layer 1b mainly containing silver also has a low light absorption component and a low light reflection component while securing practicability as an electrode film. Moreover, the transparent electrode layer 1b having such a small thickness has a preferable continuity, since, as described above, the film formation is started adjacent to the nitrogen-containing layer 1a within two minutes after the formation of the nitrogen-containing layer 1a. Accordingly, although the transparent electrode layer 1b has an extremely thin film having a thickness of 12 nm or less as described above, the transparent electrode layer 1b has a measurable sheet resistance and has a conductivity. As will be explained in detail in the following example, it is confirmed that, in the transparent electrode layer 1b formed adjacent to the nitrogen-containing layer 1a within two minutes after the formation of the nitrogen-containing layer 1a in this way, the sheet resistance measurement can be performed in spite of the extremely thin film.

As a result of the above, by using the manufacturing apparatus 10-1 of the first embodiment, it becomes possible to form the transparent electrode layer 1b which substantially functions as an electrode, as a film having an excellent electric conductivity while maintaining a high light transmission property, because of a film having a high continuity in spite of a thin film.

<<2. Modification 1 of the First Embodiment>>

Figure 3:
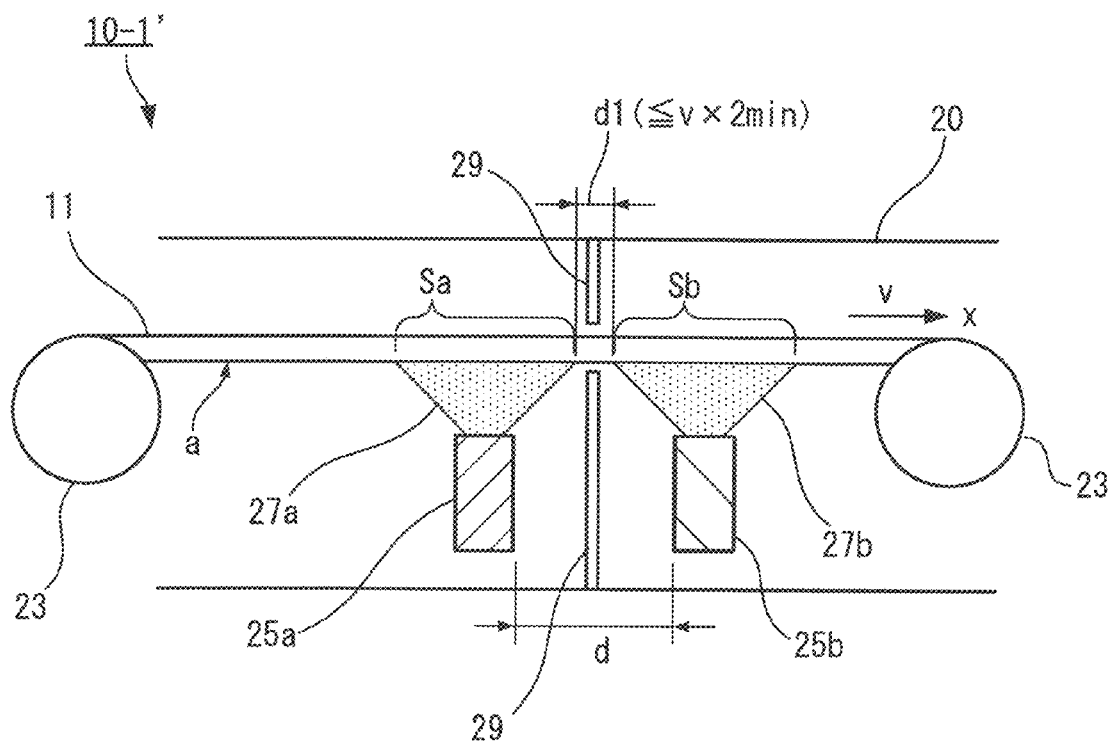
FIG. 3 is a schematic view showing a configuration of modification 1 in a first embodiment.

FIG. 3 is a schematic view for explaining modification 1 of the above electronic device manufacturing apparatus in the first embodiment. As shown in FIG. 3, the manufacturing apparatus 10-1' has a configuration in which a separation wall 29 is provided in the film formation chamber 20, and other configuration is the same as that of the first embodiment.

The separation wall 29 is provided between the first supply source 25a and the second supply source 25b at a position where the supply region Sa of the nitrogen-containing compound 27a from the first supply source 25a and the supply region Sb of the electrode material 27b from the second supply source 25b are separated from each other. Furthermore, the separation wall 29 is provided in a state without disturbing the transfer of the substrate 11 by the holding member 23.

In the manufacturing apparatus 10-1' like this in modification 1, the nitrogen-containing compound 27a from the first supply source 25a and the electrode material 27b from the second supply source 25b are prevented from adhering to one another at each part of the inner wall of the film formation chamber 20 by provision of the separation wall 29, and thus the prevention of cross-contamination within the film formation chamber 20 becomes possible. As a result, the nitrogen-containing layer 1a and the transparent electrode layer 1b each having a preferable film quality are formed, and the production of an electronic device having secured excellent performance becomes possible.

<<3. Modification 2 of the First Embodiment>>

Figure 4:
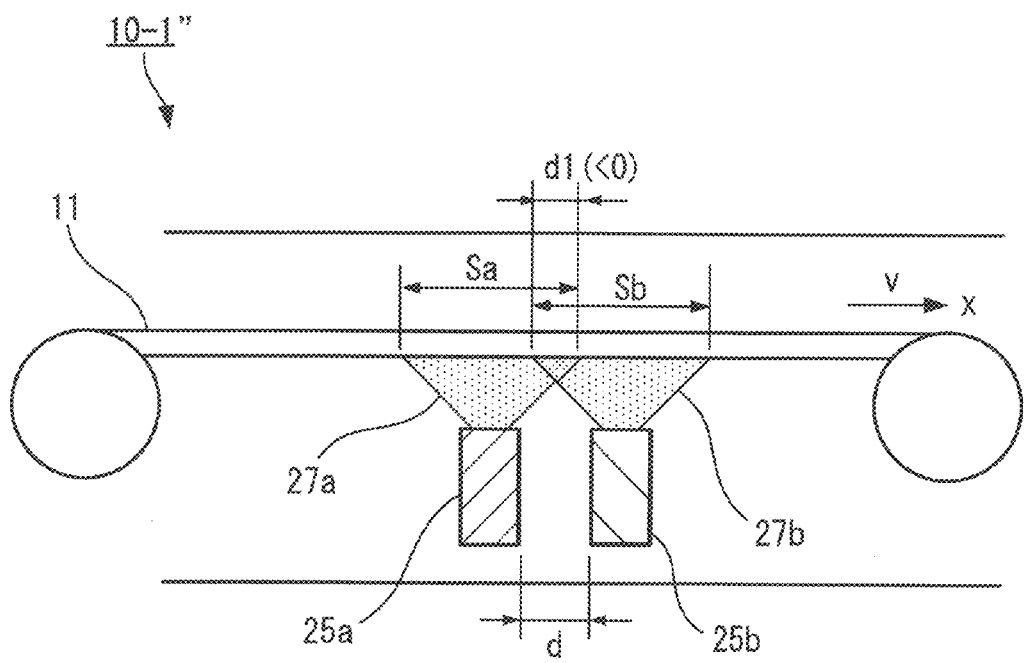
FIG. 4 is a schematic view showing a configuration of modification 2 in a first embodiment.

FIG. 4 is a schematic view for explaining modification 2 of the above electronic device manufacturing apparatus in the first embodiment. As shown in FIG. 4, the manufacturing apparatus 10-1" has configuration in which the first supply source 25a and the second supply source 25b are disposed so that the supply region Sa of the nitrogen-containing compound 27a and the supply region Sb of the electrode material 27b partially overlap with each other. The other configuration is the same as that of the first embodiment.

In this case, in the same way as in the first embodiment, the spacing d between the first supply source 25a and the second supply source 25b is set so as to cause the second supply source 25b to start the formation of the transparent electrode layer 1b with respect to a prescribed position of the moving substrate 11, during the time between starting the formation and two minutes, preferably one minute, after finishing the formation of the nitrogen-containing layer 1a by the first supply source 25a.

However, the spacing d1 between the supply region Sa and the supply region Sb in the movement direcdion x of the substrate 11 is set to be in a range in which $|d1| \leq v \times 2$ min (preferably, $d1 \leq 1$ min) and also $d1 \leq 0$ hold. Here, the absolute value of the spacing d1 does not exceed the supply region Sb of the electrode material 27b and $|d1| < Sb$ is assumed in the movement direction x. Meanwhile, in this case (d1<0), $|d1| < Sa$ also holds in the movement direction x. Therefore, the configuration is such that the formation of the transparent electrode layer is started by the supply of the electrode material 27b after the formation of the nitrogen-containing layer by the supply of the nitrogen-containing compound 27a has been started.

Here, the supply region Sa of the nitrogen-containing compound 27a and the supply region Sb of the electrode material 27b overlap each other partially, and thus a mixed region of the nitrogen-containing compound 27a and the electrode material 27b is formed between the nitrogen-containing layer formed by the supply of the nitrogen-containing compound 27a and the transparent electrode layer formed by the supply of the electrode material 27b. Therefore, the magnitude of the spacing d1 with respect to the supply region Sb of the electrode material 27b is set so that the thickness of the transparent electrode layer 1b formed only by the electrode material 27b is not smaller than a thickness in which sheet resistance measurement can be performed (for example, 2 nm), within a range of 12 nm or less.

In the manufacturing apparatus 10-1" like this of modification 2, as described above, it becomes possible to form a co-evaporation layer mixing the nitrogen-containing compound 27a and the electrode material 27b between the nitrogen-containing layer constituted of the nitrogen-containing compound 27a and the transparent electrode layer constituted of the electrode material 27b. Thereby, it becomes possible to produce a transparent electrode (electronic device) having a preferable adhesion between the nitrogen-containing layer and the transparent electrode layer, in addition to the same effect as that in the first embodiment.

<<4. Electronic Device Manufacturing Apparatus in a Second Embodiment>>

Figure 5:
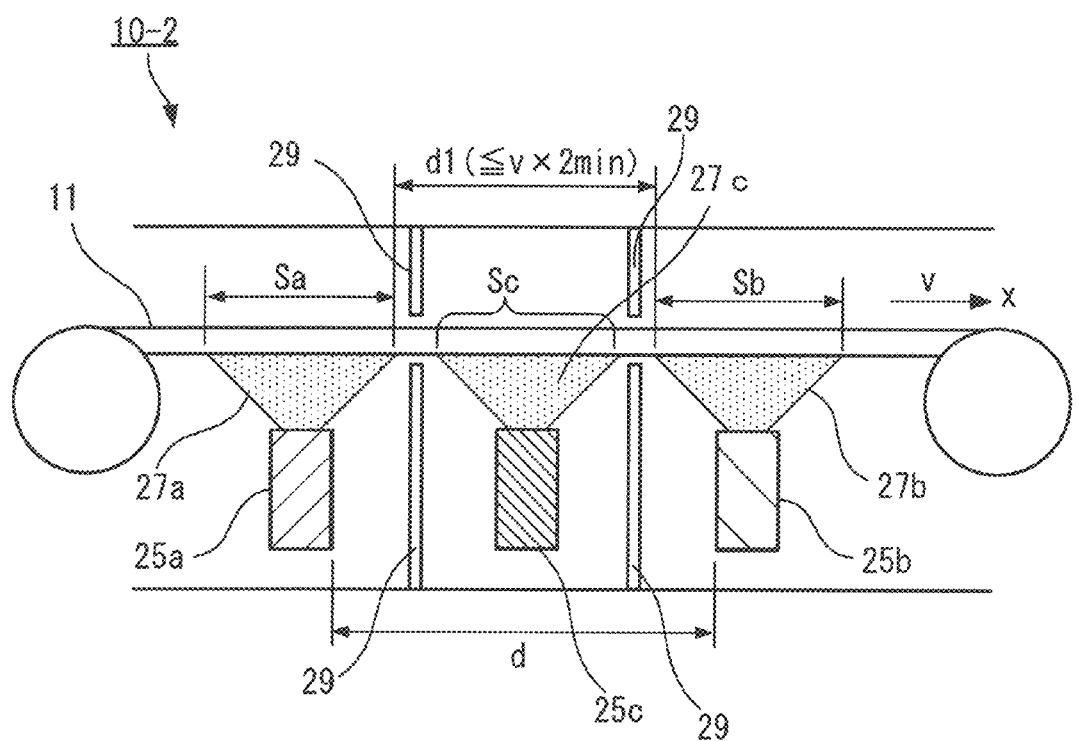
FIG. 5 is a schematic view showing a configuration of an electronic device manufacturing apparatus in a second embodiment.
Figure 6:
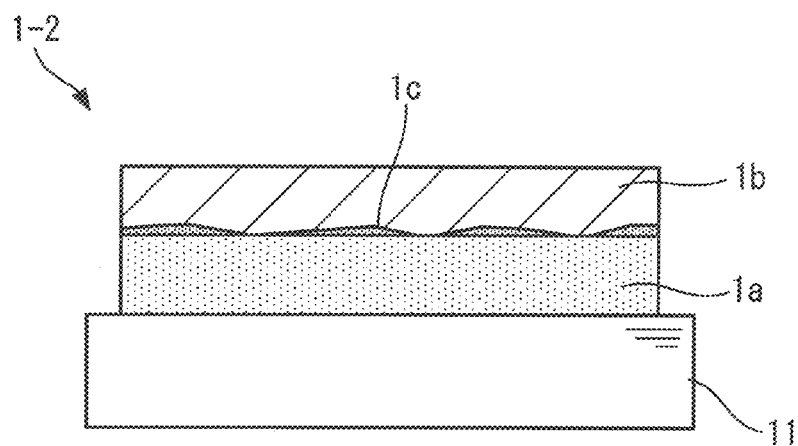
FIG. 6 is a schematic cross-sectional view of an electronic device (transparent electrode) produced by a manufacturing apparatus in a second embodiment.

FIG. 5 is a schematic view showing a configuration of an electronic device manufacturing apparatus in a second embodiment. Furthermore, FIG. 6 is a schematic cross-sectional view of an electronic device (transparent electrode 1-2) produced using the manufacturing apparatus 10-2. Hereinafter, the manufacturing apparatus 10-2 of the second embodiment will be explained on the basis of these drawings.

The manufacturing apparatus 10-2 shown in FIG. 5 is different from the manufacturing apparatus of the first embodiment explained using FIG. 1 in that a third supply source 25c is provided between the first supply source 25a and the second supply source 25b, and the other configuration is the same as that of the first embodiment.

The third supply source 25c is disposed on the primary surface a side of the substrate 11 transferred by the holding member 23, and supplies intermediate layer material 27c toward the primary surface a of the substrate 11, in a gas state. The third supply source 25c is fixed within the film formation camber 20, and provided in the width direction of the substrate 11, perpendicular to the movement direction x. Examples of the intermediate layer material 27c include metal, metal oxide, metal nitride, metal oxynitride, nonorganic chloride compounds, furthermore, organic complexes and the like.

Al, Li, Ca, Mg, Na, Zn, In, Ba, Sr, Yb, Ga, Cd, Si, Ta, Sb are exemplified as the metal used here, and these kinds of metal are also used as oxide, nitride, or oxynitride. LiF, NaF, KF, CsF, CaF2, BaF2, SrF2, MgF2, BeF2, LiCl, KCl, NaCl, AgCl, Li2O, LiO, Na2S, NaO, CaO, BaO, SrO, BeO, BaS, and CaSe are exemplified as the nonorganic chloride compounds. Liq (8-hydroxyquinolinatolithium) and the like are exemplified as the organic complexes.

The third supply source 25c may be, for example, a so-called heating boat for evaporation film formation, for example, and has a configuration in which the intermediate layer material 27c placed within the boat is gasified by heating and is ejected toward the primary surface a of the substrate 11. The third supply source 25c like this is constituted for the formation of an intermediate layer 1c on the primary surface a of the substrate 11 transferred by the holding member 23.

In the third supply source 25c like this, the supply amount of the intermediate layer material 27c is adjusted so that the intermediate layer 1c is formed adjacent to the nitrogen-containing layer 1a as an extremely thin film which needs not be a continuous film.

In the configuration providing the third supply source 25c like this, the spacing d between the first supply source 25a and the second supply source 25b is set so that the formation of the transparent electrode layer 1b is started at a prescribed position of the moving substrate 11 by the second supply source 25b within two minutes, preferably within one minute, after the formation of the nitrogen-containing layer 1a has been finished. In addition, the spacing d1 between the supply region Sa of the nitrogen-containing compound 27a and the supply region Sb of the electrode material 27b is in the range of d1≤v×2 min (preferably, d1≤v×1 min). However, since a supply region Sc of the intermediate layer material 27c from the third supply source 25c is inserted between the supply region Sa and the supply region Sb, the spacing d1 between the supply region Sa and the supply region Sb satisfies d1>0.

Furthermore, the manufacturing apparatus 10-2 may have a separation wall 29 provided within the film formation chamber 20 as necessary. The separation wall 29 is provided in one of the spacing between the first supply source 25a and the third supply source 25c and the spacing between the third supply source 25c and the second supply source 25b, or in both of the spacing. The separation wall 29 like this is the same as one explained in modification 1 of the first embodiment, and is disposed at a position where the supply regions of the materials supplied from the supply sources are separated from each other and also provided in a state of not disturbing the transfer of the substrate 11 by the holding member 23. Thereby, it is possible to prevent cross-contamination within the film formation chamber 20.

<Transparent Electrode 1-2>

The transparent electrode 1-2 produced using the above manufacturing apparatus 10-2 of the second embodiment and the above materials has a three-layer structure in which the intermediate layer 1c of an extremely thin film is sandwiched between the nitrogen-containing layer 1a and the transparent electrode layer 1b. Furthermore, the transparent electrode layer 1b constituted of silver as a main component is started to be formed within two minutes after the formation of the nitrogen-containing layer 1a has been finished and is formed in a thickness of 12 nm of less.

<Effect of the Second Embodiment>

In the above explained manufacturing apparatus 10-2 of the second embodiment, it is possible to form the transparent electrode layer 1b mainly containing silver within two minutes after the formation of the nitrogen-containing layer 1a has been finished. Thereby, effects as follows can be obtained.

That is, the transparent electrode layer 1b mainly containing silver is formed approximately adjacent to the nitrogen-containing layer 1a, via the intermediate layer 1c. Therefore, in the formation of the electrode layer 1b, silver atoms constituting the electrode layer 1b interact with the compound containing nitrogen atoms constituting the nitrogen-containing layer 1a via the intermediate layer 1c of an extremely thin film, to thereby reduce a diffusion length of the silver atoms on the film formation surface, which causes the suppression of agglomeration of silver. As a result, generally, a silver thin film that is easily isolated in the form of island due to film growth through Volumer-Weber (VW) type (nucleas growth type) is formed due to film growth through Frank-van der Merwe (FM) type (mono-layer growth type). Therefore, an electrode layer having a uniform thickness can be obtained even though the layer is thin. Accordingly, an electrode layer 1b having a uniform thickness can be obtained even though the layer is thin.

Furthermore, the transparent electrode layer 1b is formed on the nitrogen-containing layer 1a via the intermediate layer 1c which has been formed, as an extremely thin film which is not required to be a continuous film, within two minutes (preferably within one minute) after the formation of the nitrogen-containing layer 1a has been finished. Thereby, as in the first embodiment (as will be explained in detail in the following example), it is confirmed that the transparent electrode layer 1b serves as a film having a higher continuity.

Furthermore, the transparent electrode layer 1b constituting the transparent electrode 1 is formed in a thickness of 12 nm of less in which the sheet resistance can be measured, in the same way as in the first embodiment. Thereby, the transparent electrode layer 1b mainly containing silver becomes a layer having a low suppressed light absorption component or reflection component while securing practicability as an electrode film. Furthermore, the transparent electrode layer 1b having such a small thickness is formed in a state of being approximately adjacent to the nitrogen-containing layer 1a within two minutes after the formation of the nitrogen-containing layer 1a has been finished as described above, and thus has a preferable continuity. Accordingly, although the transparent electrode layer 1b has an extremely thin film having a thickness of 12 nm or less as described above, the transparent electrode layer 1*b* has a measurable sheet resistance and has a conductivity. This will be explained in detail in the following example.

As a result of the above, by using the manufacturing apparatus 10-2 of the second embodiment, it becomes possible to form the transparent electrode layer 1*b* which substantially functions as an electrode, as a film having a excellent electric conductivity while keeping a high light transmitting property, because of a film having a high continuity in spite of a thin film.

<<5. Modification of the Second Embodiment>>

Figure 7:
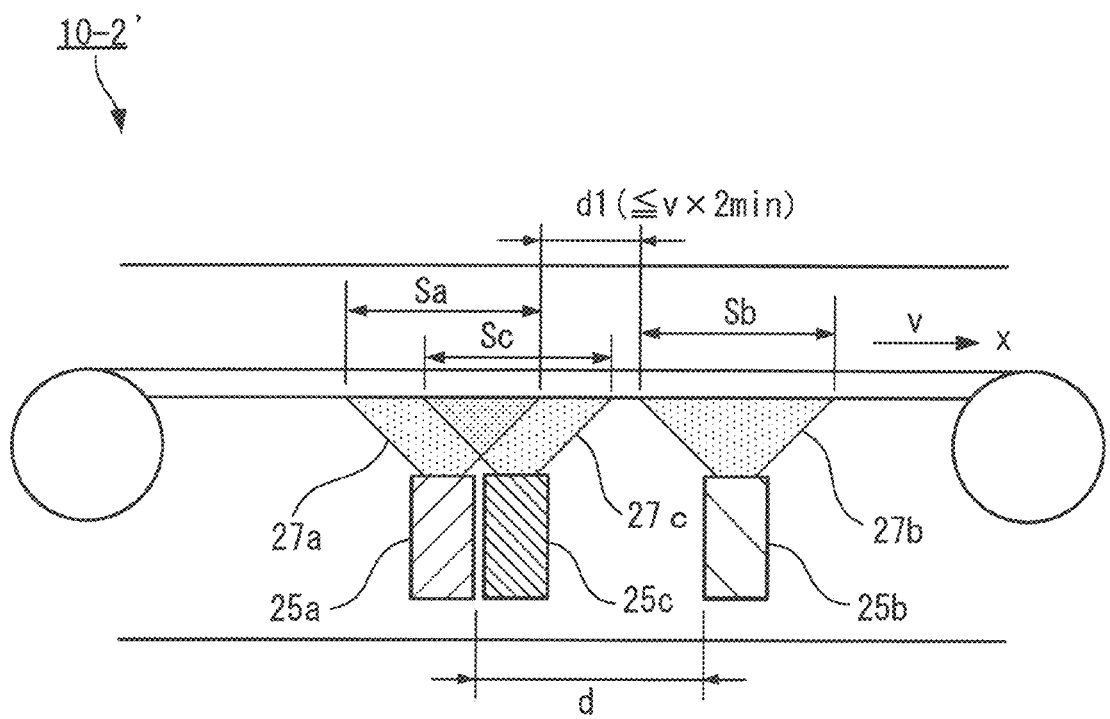
FIG. 7 is a schematic view showing a configuration of a modification in a second embodiment.

FIG. 7 is a schematic view for explaining a modification of the above electronic device manufacturing apparatus of the second embodiment. As shown in FIG. 7, the manufacturing apparatus 10-2' has a configuration in which the first supply source 25*a* and the third supply source 25*c* are disposed so that the supply region Sa of the nitrogen-containing compound 27*a* and the supply region Sc of the intermediate layer material 27*c* overlap each other. Therefore, a separation wall is not provided between the first supply source 25*a* and the third supply source 25*c*. Meanwhile, while illustration is omitted here, the separation wall for preventing the cross-contamination may be provided between the third supply source 25*c* and the second supply source 25*b*.

The supply region Sa of the nitrogen-containing compound 27*a* and the supply region Sc of the intermediate layer material 27*c* may overlap each other completely. In this case, the supply region Sc of the intermediate layer material 27*c* may completely overlap a part of the supply region Sa of the nitrogen-containing compound 27*a*. Such film formation is realized by inclining the first supply source 25*a* and the third supply source 25*c*, or by arranging the first supply source 25*a* and the third supply source 25*c* in the direction perpendicular to the movement direcdion x of the substrate 11. However, as to the supply region Sa of the nitrogen-containing compound 27*a* and the supply region Sc of the intermediate layer material, the end parts thereof on the downstream side is preferably caused to coincide with each other in the movement direction x.

In the manufacturing apparatus 10-2' of such a modification, the nitrogen-containing layer formed by the supply of the nitrogen-containing compound 27*a* is formed as a layer including the intermediate layer material 27*c*. In addition, the intermediate layer material 27*c* is included in the nitrogen-containing layer on the surface side of the formation film by constituting the supply region Sa of the nitrogen-containing compound 27*a* and the supply region Sc of the intermediate layer material 27*c* so as to cause the end parts thereof to coincide with each other in the movement direction x. Thereby, it becomes possible to obtain the same effect as that of the second embodiment.

<<6. First Example of an Organic Electroluminescent Element Produced Using a Manufacturing Apparatus in the Embodiments>>

<Configuration of an Organic Electroluminescent Element EL1>

Figure 8:
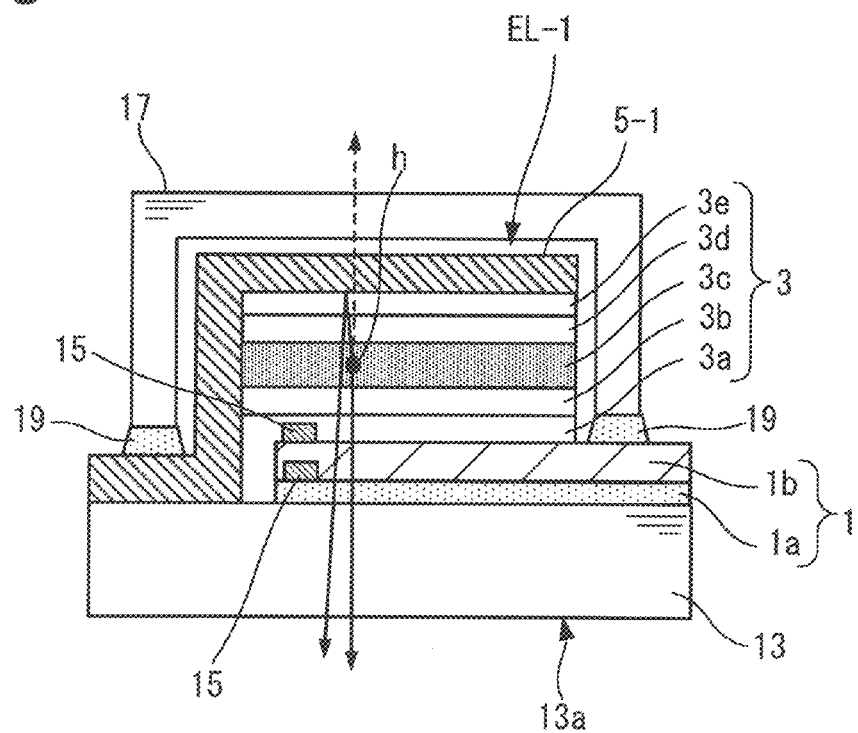
FIG. 8 is a schematic cross-sectional view of a first example for another electronic device (organic electroluminescent element) produced by a manufacturing apparatus in a first embodiment or a second embodiment.

FIG. 8 is a schematic cross-sectional view of a first example of an organic electroluminescent element using the transparent electrode 1 as an example of an electronic device produced using the above explained manufacturing apparatus of the first embodiment or the second embodiment. Hereinafter, a configuration of the organic electroluminescent element will be explained on the basis of FIG. 8.

The organic electroluminescent element EL-1 illustrated in FIG. 8 is provided on the substrate 13, and from the transparent substrate 13 side, the transparent electrode 1, the light emitting functional layer 3 constituted using an organic material or the like, and the counter electrode 5-1 are laminated in this order. In the organic electroluminescent element EL-1, the feature thereof is the use of the transparent electrode 1 of the present invention explained above as the transparent electrode 1. In this case, the transparent substrate 13 is used as the substrate 11 explained in the first embodiment and the second embodiment. Accordingly the organic electroluminescent element EL-1 is constituted as a bottom emission type in which generated light (hereinafter, referred to as emitted light h) is extracted at least from the transparent substrate 13 side. Meanwhile, as will be explained in the following, the organic electroluminescent element EL-1 can also be constituted as a double-sided emission type in which the emitted light h is extracted also from the opposite side of the transparent electrode 13.

The layer configuration of the organic electroluminescent element EL-1 is not limited and may be a general layer configuration. Here, it is constituted such that the transparent electrode 1 serves as the anode (i.e., positive terminal) and the counter electrode 5-1 serves as the cathode (i.e., negative terminal). In the case, for example, the light emitting functional layer 3 has an exemplified configuration in which [positive hole injection layer 3*a*/positive hole transport layer 3*b*/light emitting layer 3*c*/electron transport layer 3*d*/electron injection layer 3*e*] are laminated in this order from the transparent electrode 1 side being the anode. Among them, it is essential to have a light emitting layer 3*c* constituted using at least organic material. The positive hole injection layer 3*a* and the positive hole transport layer 3*b* may be provided as a positive hole transport/injection layer having positive hole transport property and positive hole injection property. The electron transport layer 3*d* and the electron injection layer 3*e* may be provided as an electron-transport/injection layer. In addition, among the light emitting functional layers 3, for example, the electron injection layer 3*e* may be constituted by an inorganic material.

In addition, in the light emitting functional layer 3, a positive hole blocking layer, an electron blocking layer and the like also other than these layers may be laminated on a required portion, as necessary. Furthermore, the light emitting layer 3*c* may have light emitting layers of each color corresponding to the respective range of wavelength, and may have a configuration obtained by laminating the light emitting layers via an intermediate layer having non-light emitting property. The intermediate layer may function as the positive hole blocking layer and the electron blocking layer. Moreover, the counter electrode 5-1 being a cathode may also have a laminated structure as necessary. In these configurations, only the portion in which the light emitting functional layer is sandwiched between the transparent electrode 1 and the counter electrode 5-1 serves as the light emitting region in the organic electroluminescent element EL-1.

Furthermore, in the above layer configuration, in order to reduce electric resistance of the transparent electrode 1, an auxiliary electrode 15 may be provided in contact with the electrode layer 1*b* of the transparent electrode 1.

The organic electroluminescent element EL-1 having the above configuration is sealed by a transparent sealing material 17 described below on the transparent substrate 13 in order to prevent the degradation of the light emitting functional layer constituted using organic materials. The transparent sealing material 17 is fixed on the transparent substrate 13 side via an adhesive 19. However, terminal portions of the transparent electrode 1 and the counter electrode 5-1 are set to be provided in a state in which they are exposed from the sealing material 17 while maintaining electric insulation with each other by the light emitting functional layer 3 on the transparent substrate 13.

Hereinafter, the details of the main layers for constituting the above organic electroluminescent element EL-1 will be explained in order of the transparent substrate 13, the transparent electrode 1, the counter electrode 5-1, the light emitting layer 3$c$ of the light emitting functional layer 3, other layers of the light emitting functional layer 3, the auxiliary electrode 15, and the sealing material 17. After that, production method of the organic electroluminescent element EL-1 will be explained.

[Transparent Electrode 13]

The transparent substrate 13 is a substrate 11 to be provided with the transparent electrode 1 of the present invention described above, and a transparent substrate 11 having high light transmission property among the aforementioned substrates 11 is used.

[Transparent Electrode 1 (Anode)]

The transparent electrode 1 is the aforementioned transparent electrode 1 of the present invention, and has a configuration in which the nitrogen containing layer 1$a$ and the electrode layer 1$b$ are formed in order from the transparent substrate 13 side. Specifically, the transparent electrode 1 herein functions as the anode, i.e. the electrode layer 1$b$ substantially serves as the anode.

[Counter Electrode 5-1 (Cathode)

The counter electrode 5-1 is an electrode film having a function as a cathode for supplying an electron to the light emitting functional layer 3, and a metal, an alloy, an organic or inorganic electric conductive compound, and a mixture thereof are used for the counter electrode. Examples include gold, aluminum, silver, magnesium, lithium, a mixture of magnesium/copper, a mixture of magnesium/silver, a mixture of magnesium/aluminum, a mixture of magnesium/indium, indium, a mixture of lithium/aluminum, a rare-earth metal, an oxide semiconductor such as ITO, ZnO, TiO2 or SnO2.

The counter electrode 5-1 can be produced by forming a thin film from the electric conductive material through the use of a method such as vapor evaporation or sputtering. The sheet resistance of the counter electrode 5-1 is preferably several hundreds of Ω/sq. or less. The thickness is generally selected within the range of 5 nm to 5 μm, preferably within the range of 5 nm to 200 nm.

When the organic electroluminescent element EL-1 is an element in which emitting light h can also be extracted from the counter electrode 5-1 side, the counter electrode 5-1 may be constituted by selecting an electrically conductive material having a good light transmission property among the aforementioned electrically conductive materials. The above transparent electrode 1 may be applied as the counter electrode 5-1 having a highlight transmittance like this. In this case, over a substrate in which the layers up to the light emission functional layer 3 are formed over the transparent substrate 13, the transparent electrode 1 having a laminated structure of the nitrogen-containing layer 1$a$ and the transparent electrode layer 1$b$ may be formed through the use of the above explained manufacturing apparatus of the first embodiment or the second embodiment.

[Light Emitting Layer 3$c$]

The light emitting layer 3$c$ used in the present invention contains a phosphorescence emitting compound as a light emitting material.

The light emitting layer 3$c$ of the present invention is a layer which emits light through recombination of electrons injected from an electrode or an electron transport layer 3$d$ and positive holes injected from the positive hole transport layer 3$b$. A portion that emits light may be either the inside of the light emitting layer 3$c$ or an interface between the light emitting layer 3$c$ and its adjacent layer.

The configuration of the light emitting layer 3$c$ is not particularly limited as long as the light emitting material contained therein satisfies a light emission requirement. In addition, there may be a plurality of light emitting layers having the same emission spectrum and/or emission maximum wavelength. In the case, it is preferable that non-luminescent intermediate layers (not shown) are present between the light emitting layers 3$c$.

The total thickness of the light emitting layers 3$c$ is preferably within a range of 1 to 100 nm, and more preferably within a range of 1 to 30 nm from the viewpoint of obtaining a lower driving voltage. Meanwhile, the total thickness of the light emitting layers 3$c$ is a thickness including the thickness of the intermediate layers when the non-luminescent intermediate layers are present between the light emitting layers 3$c$.

In the case of the light emitting layer 3$c$ constituted by lamination of a plurality of layers, it is preferable to adjust the thickness of individual light emitting layer to be within a range of 1 to 50 nm and it is more preferable to adjust the thickness thereof to be within a range of 1 to 20 nm. When the plurality of the laminated light emitting layers corresponds to the emitted color of blue, green and red, respectively, the relationship between the respective thickness of the light emitting layers of blue, green and red is not particularly limited.

In addition, in the light emitting layer 3$c$, a plurality of light emitting materials may be mixed. Furthermore, a fluorescence emitting material and a fluorescence emitting material (also referred to as fluorescence emitting dopant, fluorescence emitting compound) may be mixed in the same light emitting layer 3$c$.

It is preferable that the light emitting layer 3$c$ is constituted so as to contain a host compound (also referred to as emitting host) and a light emitting material (also referred to as light emitting dopant compound, a guest compound), and emit light through the light emitting material.

(Host Compound)

The host compound contained in the light emitting layer 3$c$ is preferably a compound having a phosphorescence quantum yield in phosphorescence emission of less than 0.1 at room temperature (25° C.). The host compound more preferably has a phosphorescent quantum yield of less than 0.01. Furthermore, among the compounds contained in the light emitting layer 3$c$, a volume ratio in the layer of 50% or more is preferable.

A well-known host compound may be used as the host compound, alone or in combination of a plurality of kinds. The use of a plurality of host compounds makes it possible to adjust transfer of charges, and to increase an efficiency of the organic electroluminescent element EL-1. Furthermore, the use of a plurality of light emitting materials mentioned below makes it possible to mix different colors of light to be emitted, and to thereby produce any luminous color.

The host compound to be used may be a well-known low molecular compound, a high molecular compound having a repeating unit or a low molecular compound having a polymerizable group such as a vinyl group or an epoxy group (evaporation-polymerizable light emission host) may be used.

The well-known host compound is preferably a compound preventing a light emission wavelength from becoming longer and having a high Tg (glass transition temperature), while having a positive hole transport ability and an electron transport ability. The glass transition temperature Tg herein is a value measured using DSC (Differential Scanning Colorimetry) in accordance with JIS-K-7121.

Hereinafter, specific examples of the host compounds (H1 to H79) which can be used in the present invention are shown, and the present invention is not limited thereto. Meanwhile, the host compound H68 to H79, x and y represent ratio of random copolymer. The ratio may be set to, for example, x:y=1:10.
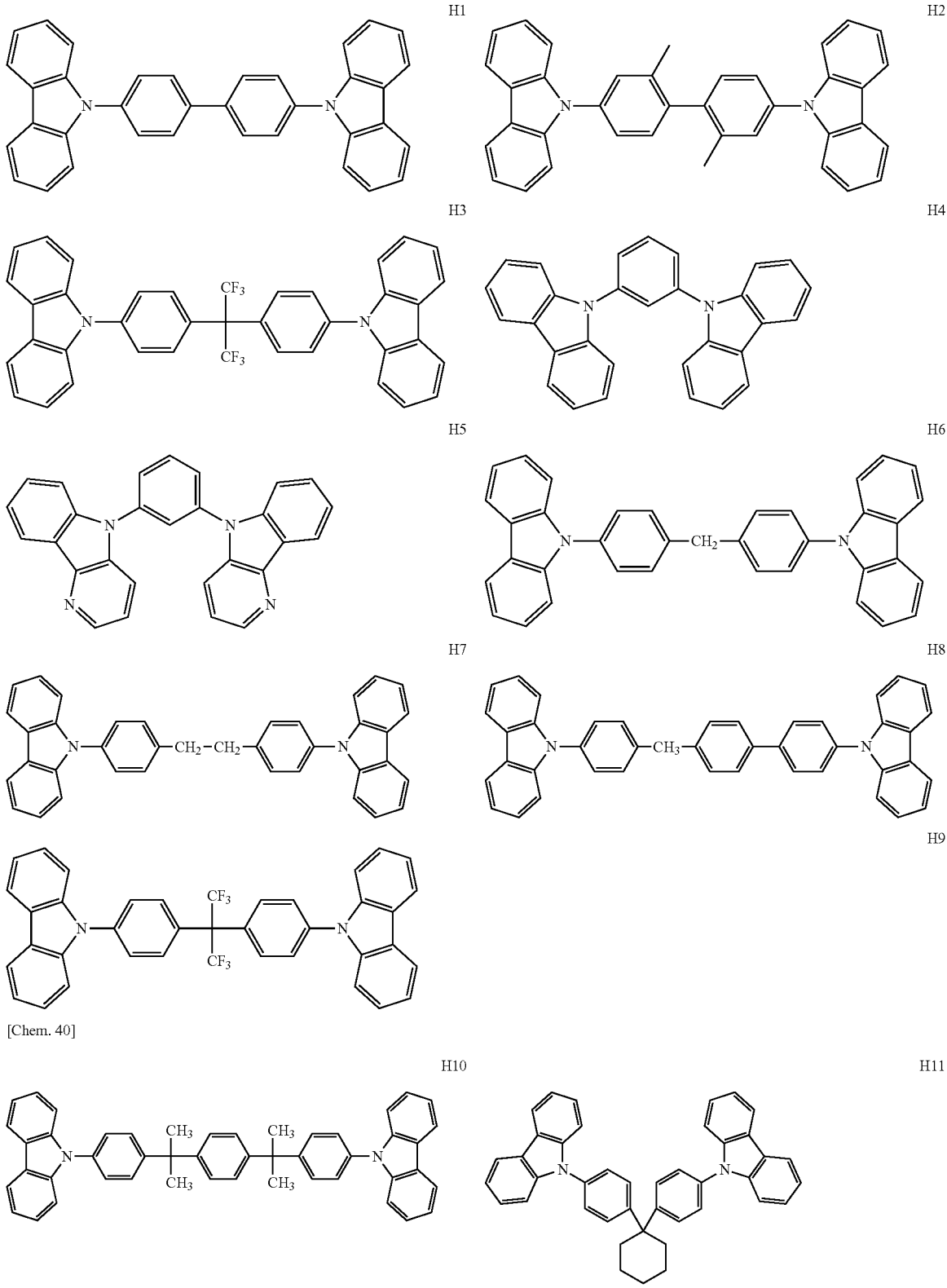

-continued
H12
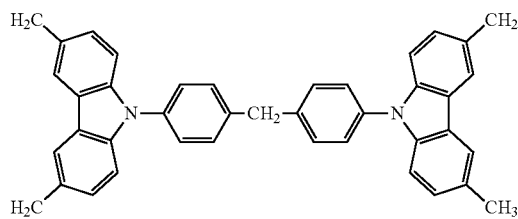
H13
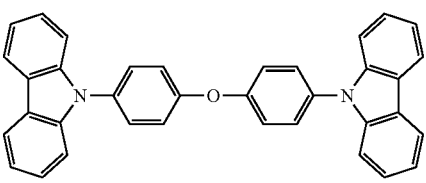
H14
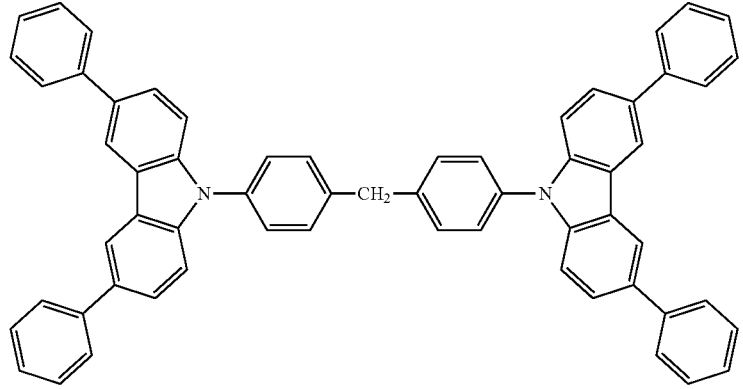
[Chem. 41]
H15
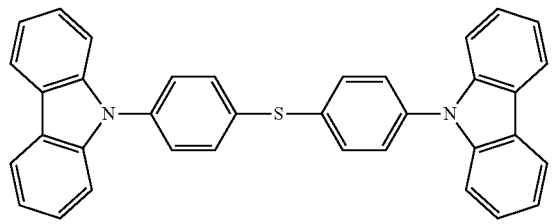
H16
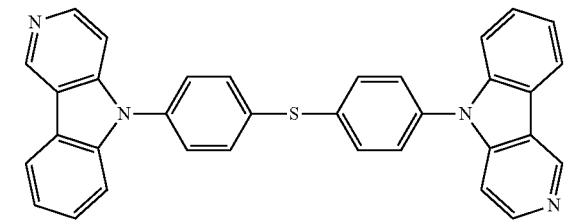
H17
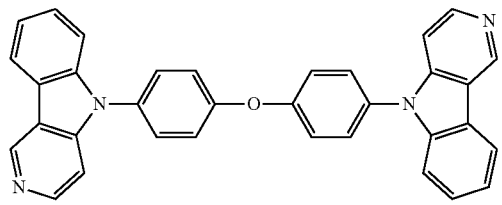
H18
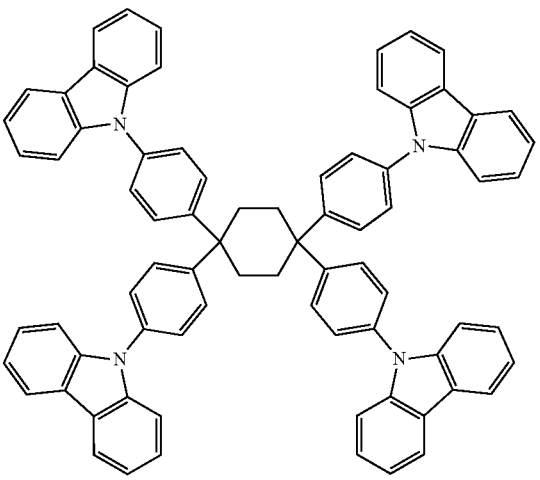
H19
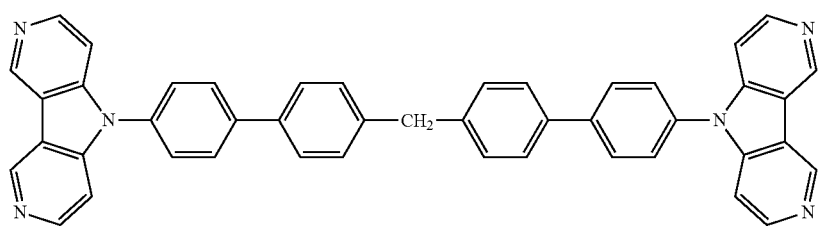

-continued
H20 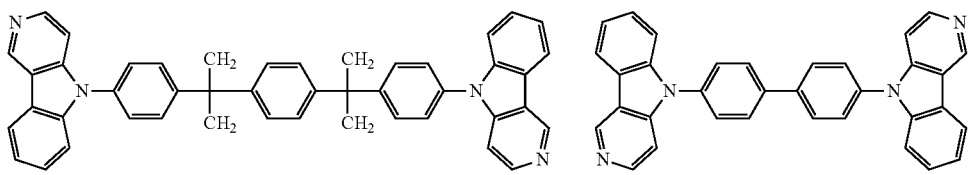
H21
H22 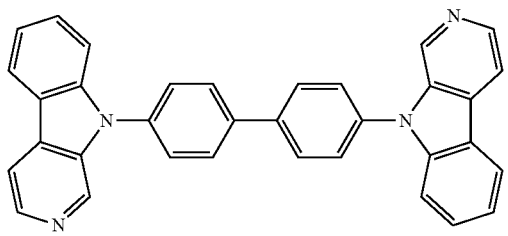
[Chem. 42]
H23 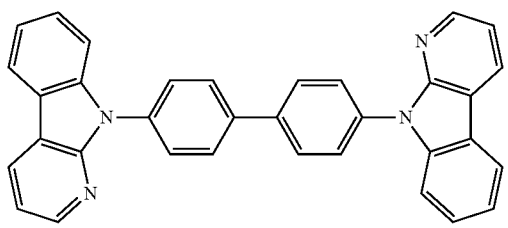
H24 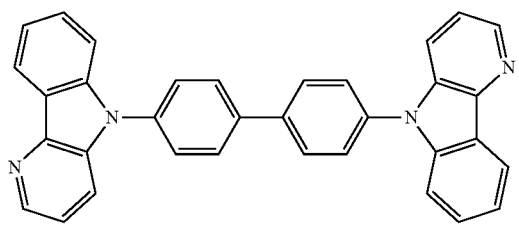
H25 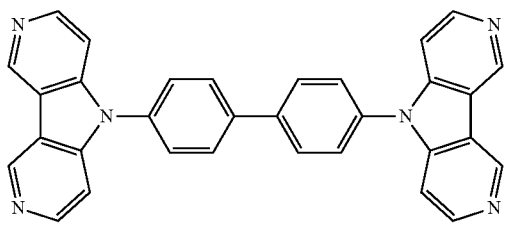
H26 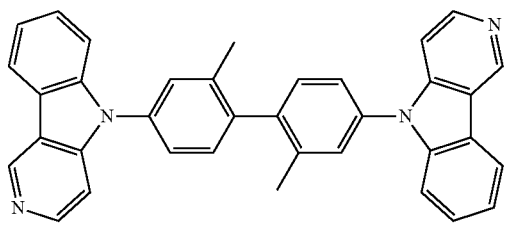
H27 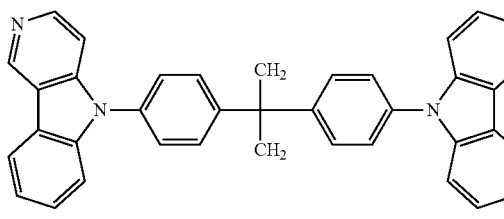
H28 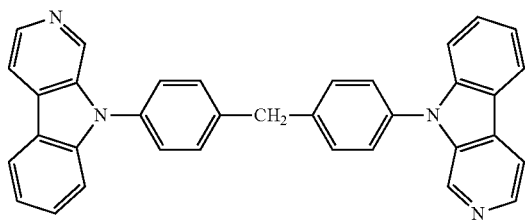
H29 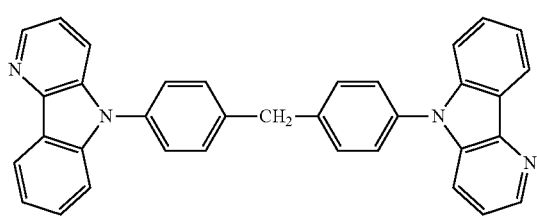
H30 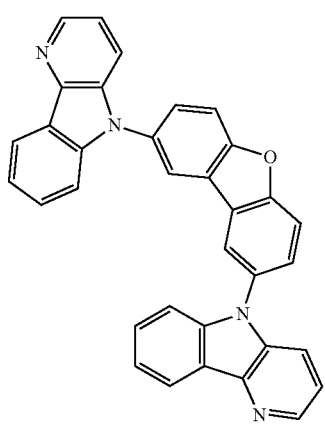

[Chem. 43]
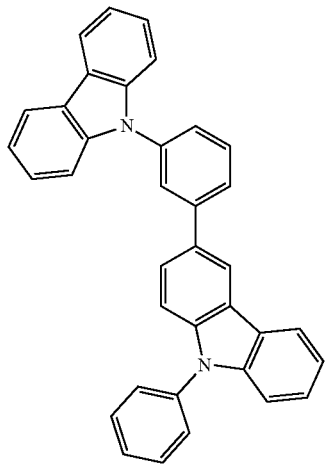
H31
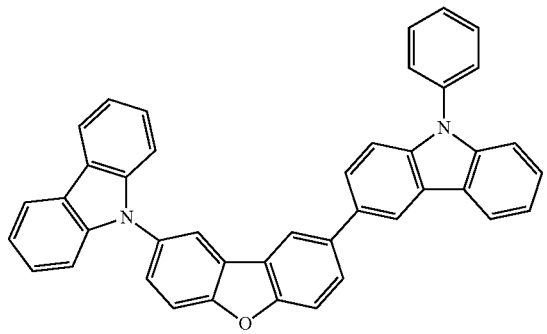
H32
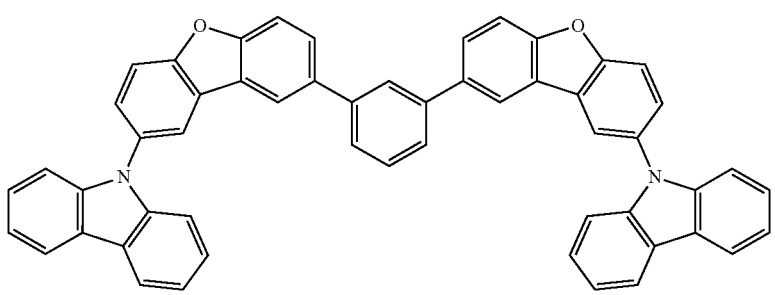
H33
[Chem. 44]
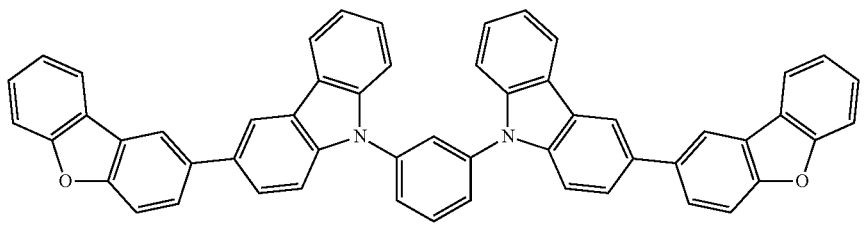
H34
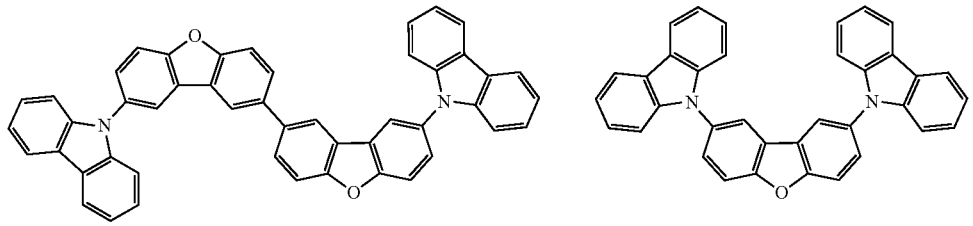
H35    H36
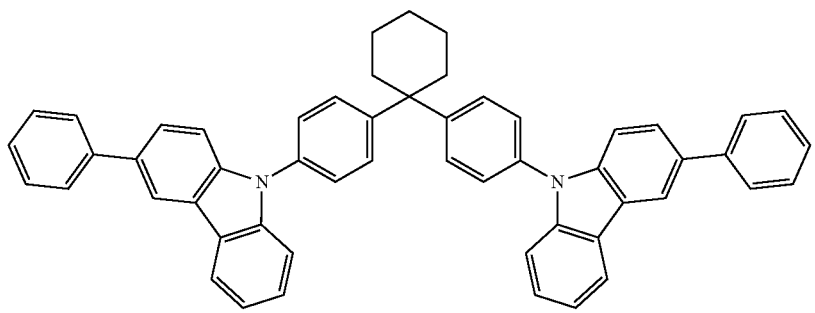
H37

-continued
H38
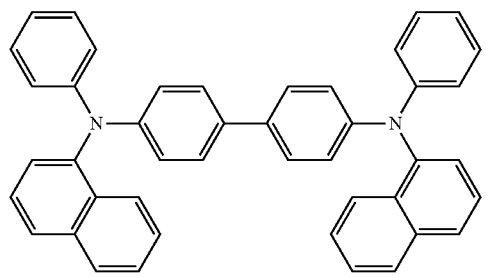
H39
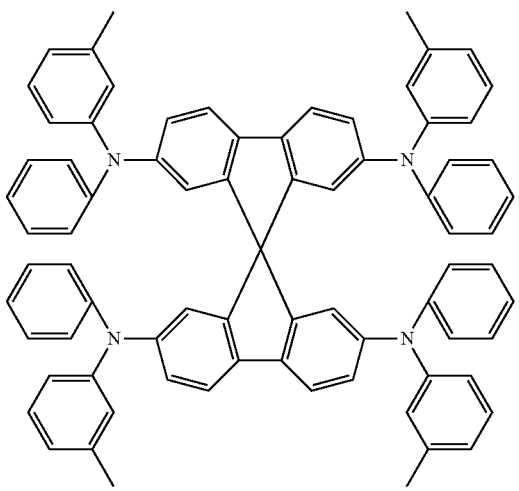
[Chem. 45]
H40
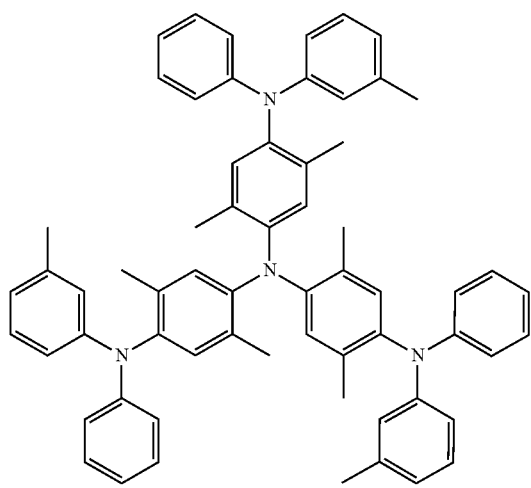
H41
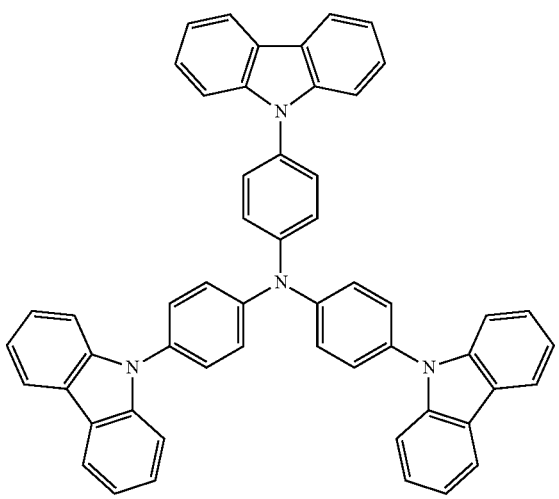
H42
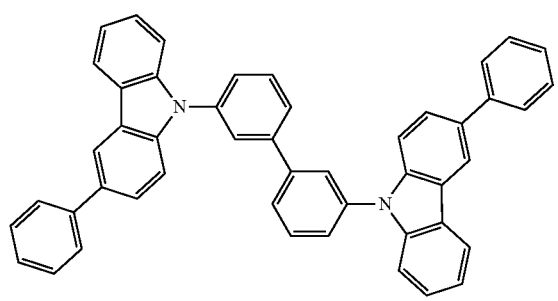
H43
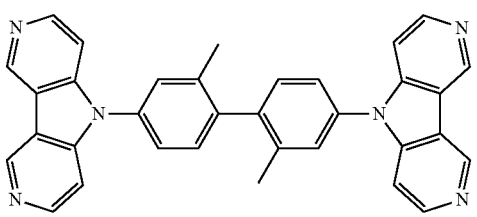

-continued
H44
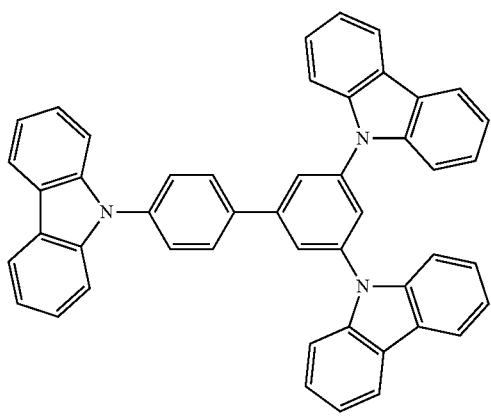
H45
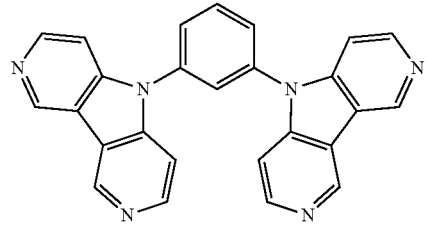
H46
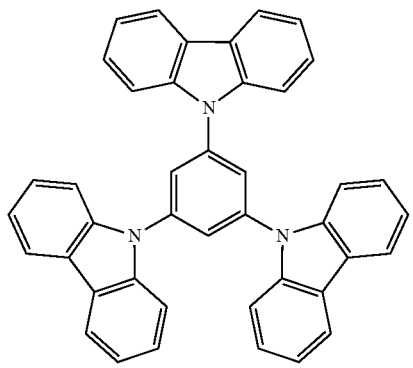
H47
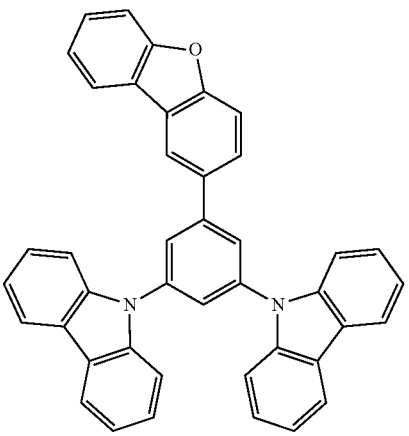
[Chem. 46]
H48
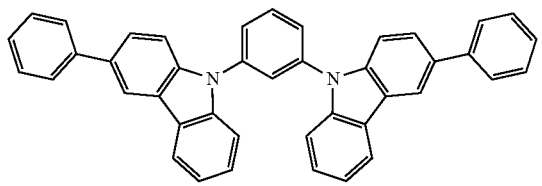
H49
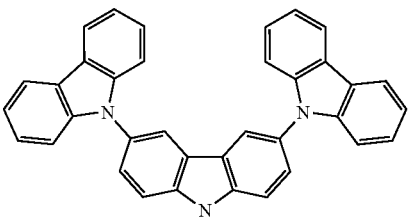
H50
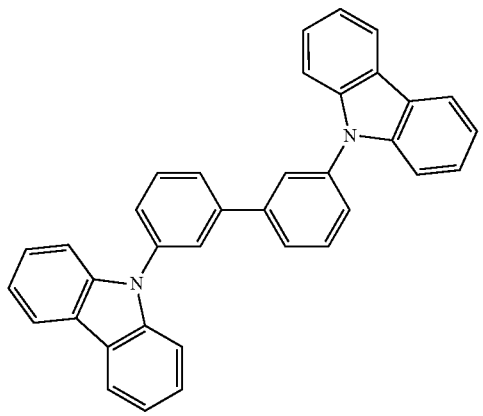
H51
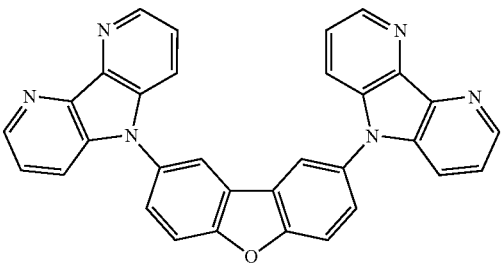

-continued
H52
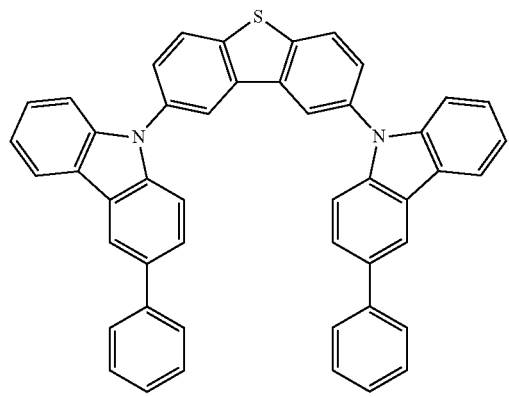
H53
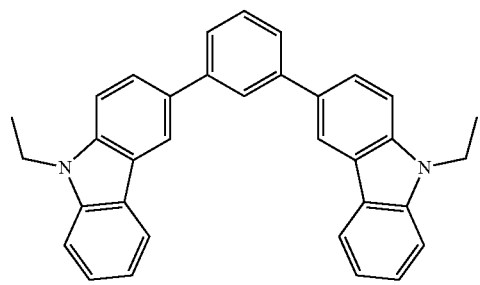
H54
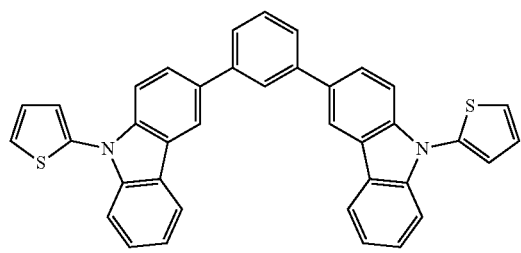
H55
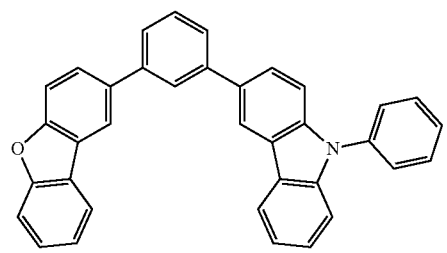
[Chem. 47]
H56
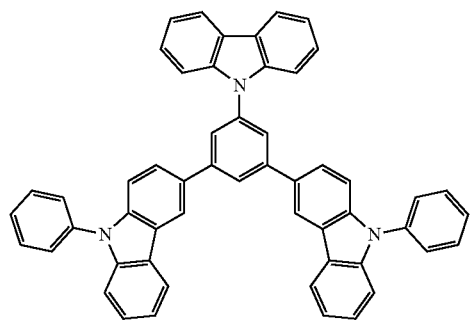
H57
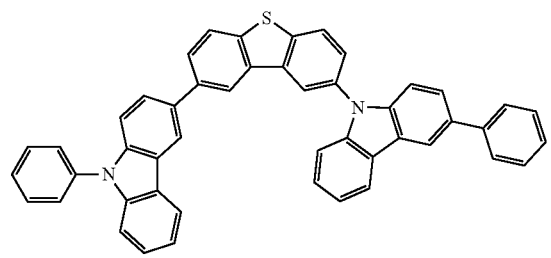
H58
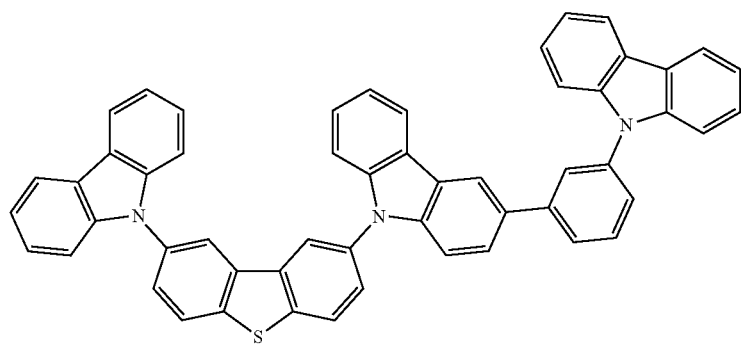

-continued
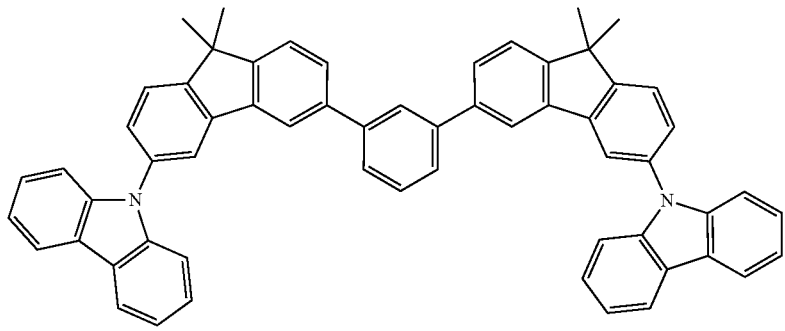
H59
[Chem. 48]
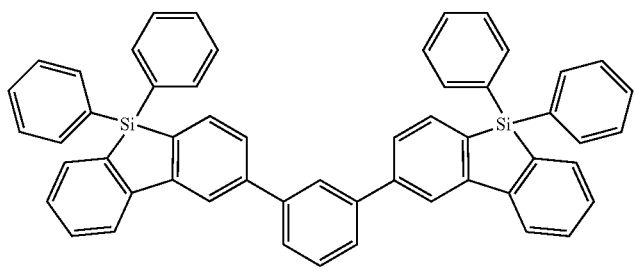
H60
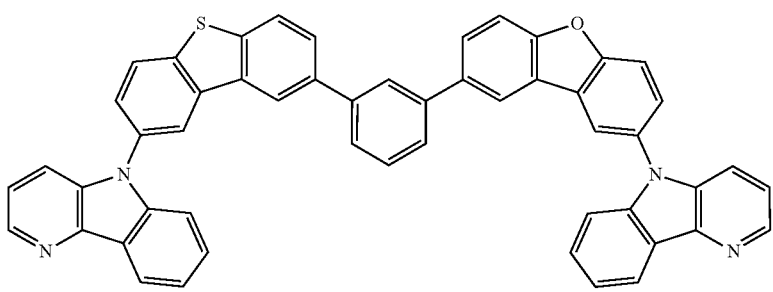
H61
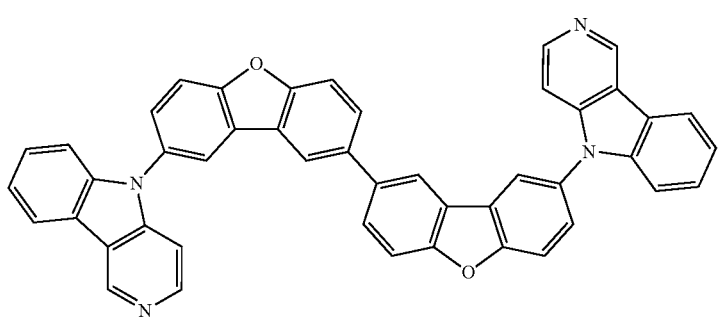
H62
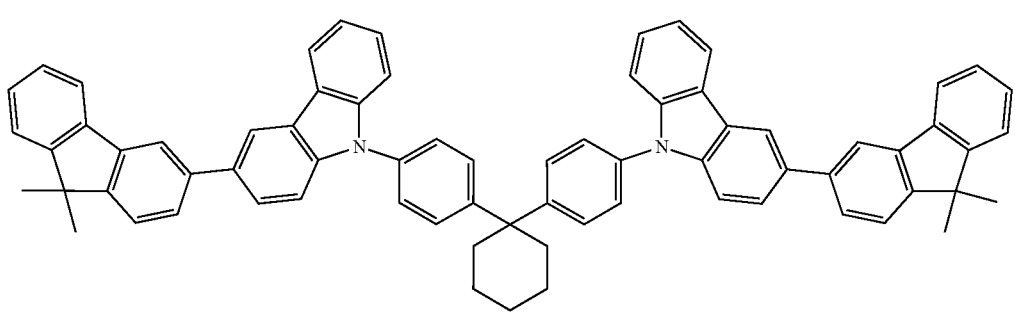
H63

-continued
H64
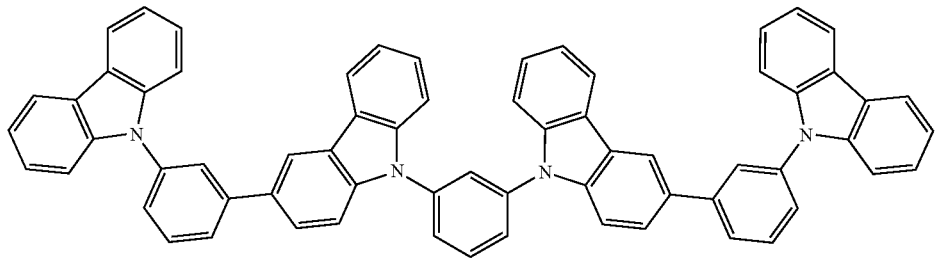
[Chem. 49]
H65
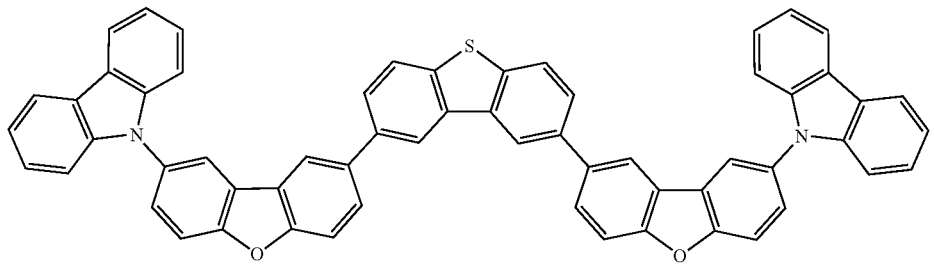
H66
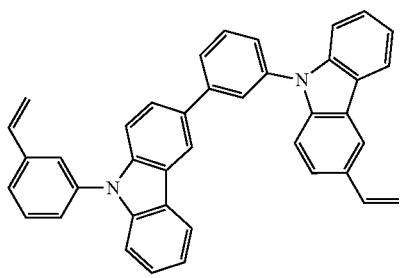
H67
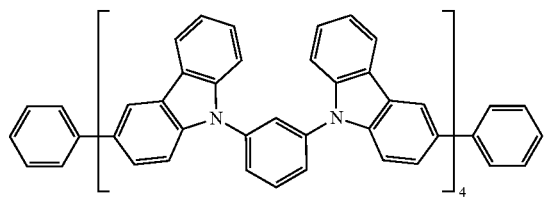
[Chem. 50]
H68
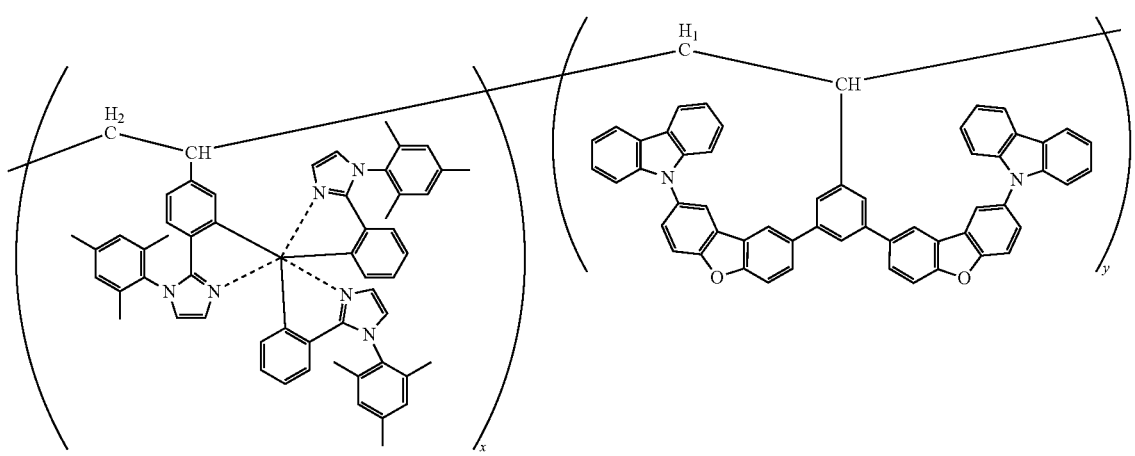
x:y = 1:10
random co-polymer -continued
[Chem. 51]
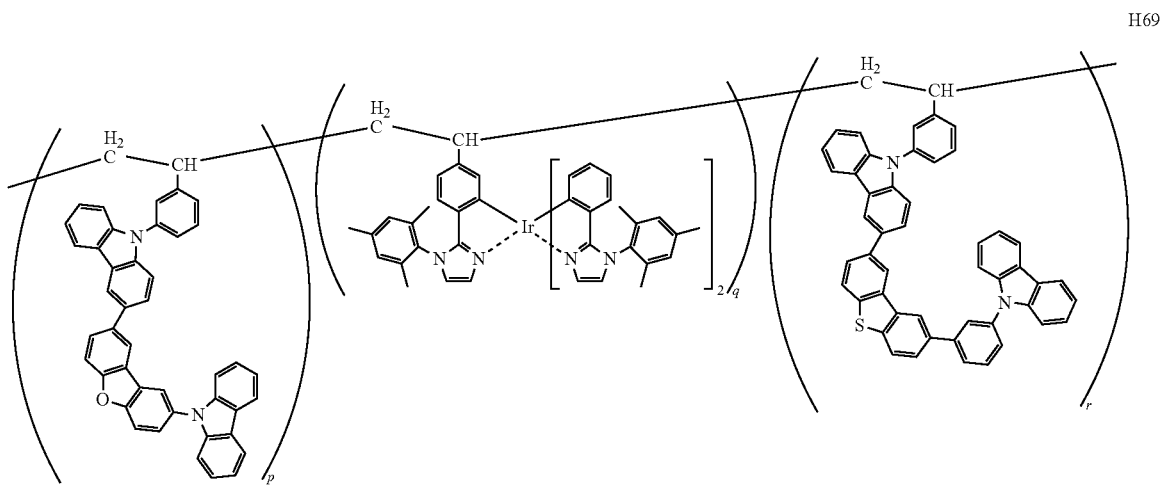
H69
[Chem. 52]
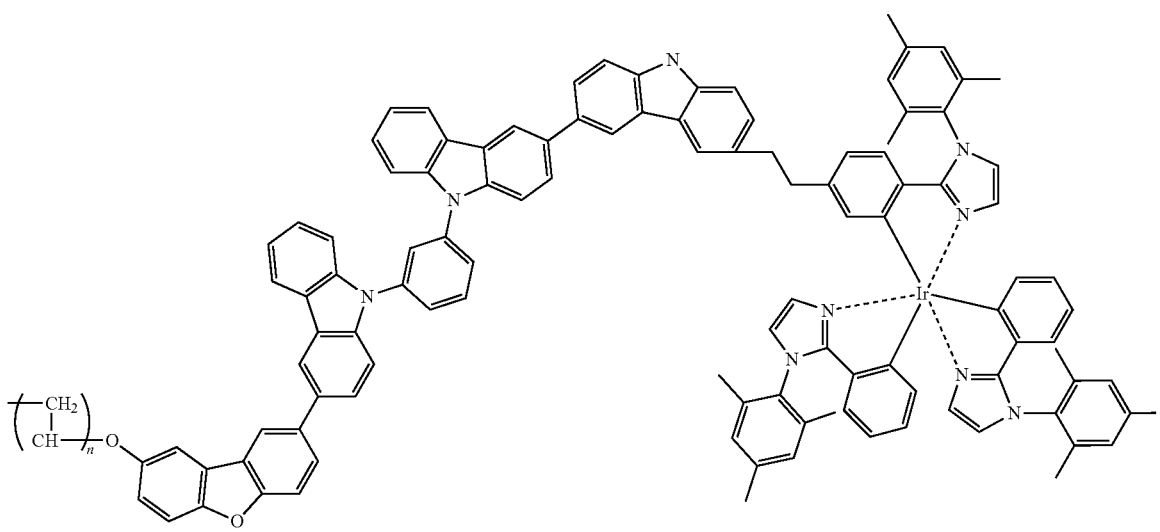
H70
[Chem. 53]
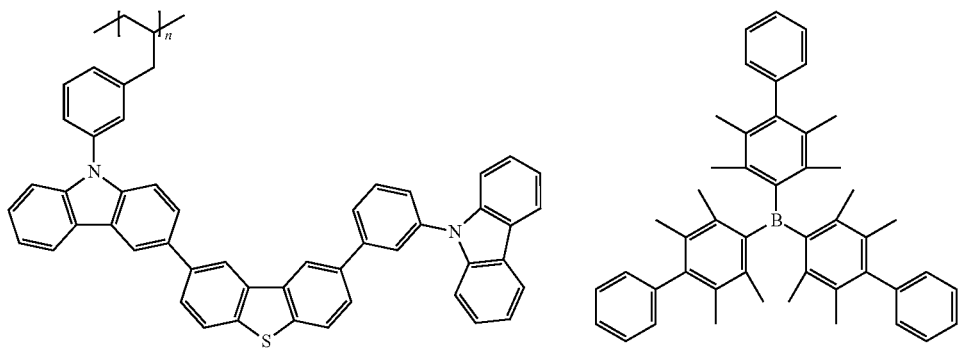
H71
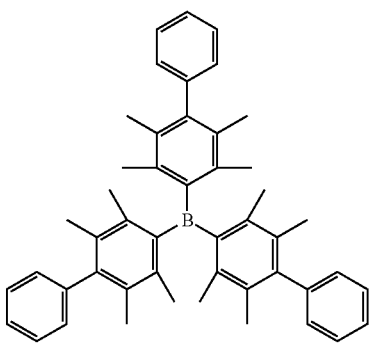
H72

-continued

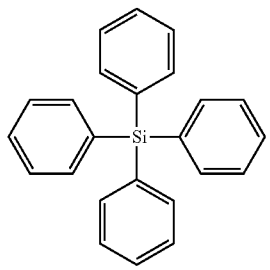
H73

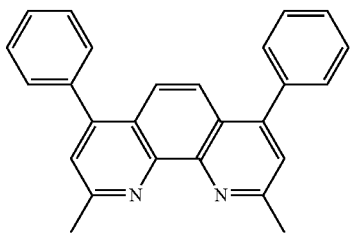
H74

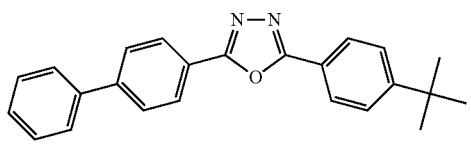
H75

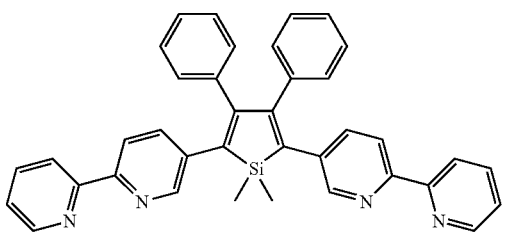
H76

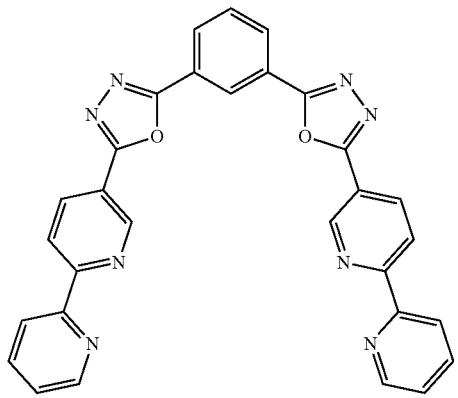
H77

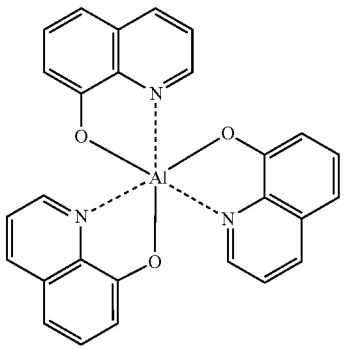
H78

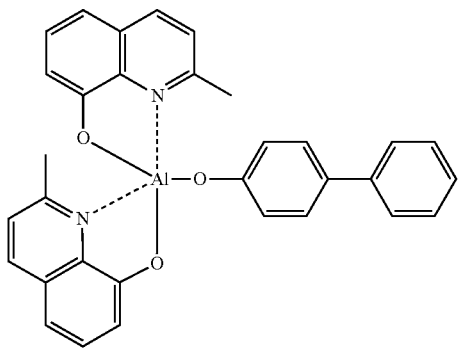
79

As the publicly known host material, there can be also used compounds described in the following literatures. Examples include Japanese Patent Laid-Open Publications No. 2001-257076, No 2002-308855, No. 2001-313179, No. 2002-319491, No. 2001-357977, No. 2002-334786, No. 2002-8860, No. 2002-334787, No. 2002-15871, No. 2002-334788, No. 2002-43056, No. 2002-334789, No. 2002-75645, No. 2002-338579, No, 2002-105445, No. 2002-343568, No. 2002-141173, No. 2002-352957, No. 2002-203683, No. 2002-363227, No. 2002-231453, No. 2003-3165, No. 2002-234888, No. 2003-27048, No. 2002-255934, No. 2003-260861, No. 2002-280183, No. 2002-299060, No. 2002-302516, No. 2002-305083, No. 2002-305084, No. 2002-308837, and the like.

(Light Emitting Material)

Te light emitting material that can be used includes a phosphorescent compound (also referred to as a phosphorescent compound or a phosphorescence emitting compound).

The phosphorescent compound is defined as a compound in which light emission from an excited triplet state is observed, and specifically, a compound which emits phosphorescence at room temperature (25° C.) and a phosphorescence quantum yield at 25° C. is 0.01 or more, and preferable phosphorescence quantum yield is 0.1 or more.

The phosphorescence quantum yield can be measured by a method described on page 398 of Bunko II of Dai 4 Han Jikken Kagaku Koza 7 (Spectroscopy II of Lecture of Experimental Chemistry vol. 7, 4th edition) (1992, published by Maruzen Co., Ltd.). The phosphorescence quantum yield in a solution can be measured by using various solvents, and in the case of using the phosphorescence emitting compound in the present invention, it is sufficient that the aforementioned phosphorescence quantum yield (0.01 or more) is achieved in any of arbitrary solvents.

There are two kinds of principles regarding light emission of the phosphorescent compound. One is an energy transfer type, in which recombination of carriers occurs on a host compound which transfers the carriers to thereby produce an excited state of the host compound, this energy is transferred to a phosphorescent compound, and then light emission from the phosphorescent compound is obtained. The other is a carrier trap type, in which a phosphorescent compound serves as a carrier trap, recombination of carriers occurs on the phosphorescent compound, and then light emission from the phosphorescent compound is obtained. In either case, the excited state energy of the phosphorescent compound is required to be lower than that of the host compound.

The phosphorescent compound can be used by being appropriately selected from the well-known phosphorescent compounds used for light emitting layers of organic electroluminescent elements, and is preferably a complex compound containing metal of the groups 8 to 10 in the element periodic table, more preferably an iridium compound, an osmium compound, a platinum compound (a platinum complex compound) or a rare earth complex, and most preferably an iridium compound.

In the present invention, at least one light emitting layer 3c may contain two or more types of phosphorescent compounds, and a ratio of concentration of the phosphorescent compound in the light emitting layer 3c may vary in the thickness direction of the light emitting layer 3c.

An amount of the phosphorescent compound is preferably 0.1% by volume or more and 30% by volume or less relative to the total volume of the light emitting layer 3c.

(Compound Represented by the General Formula (5))

Preferably, the compound (phosphorescent compound) included in the light emitting layer 3c is a compound represented by following the general formula (5).

Meanwhile, while it is a preferable mode that the phosphorescent compound (also called phosphorescent metal complex) represented by the general formula (5) is included in the light emitting layer 3c of the organic electroluminescent element EL-1 as a light emission dopant, the phosphorescent compound may be included in the light emission functional layer except the light emitting layer 3c.

[Chem. 54]

General formula (5)

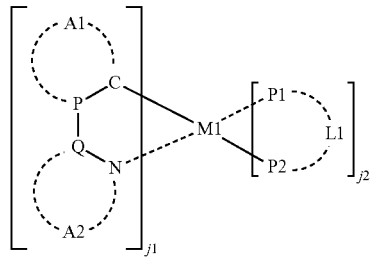

In the general formula (5), P and Q each represent a carbon atom or a nitrogen atom, A1 represents an atom group which forms an aromatic hydrocarbon ring or an aromatic heterocyclic ring with P—C. A2 represents an atom group which forms an aromatic heterocyclic ring with Q-N. P1-L1-P2 represents a bidentate ligand, P1 and P2 each independently represent a carbon atom, a nitrogen atom or an oxygen atom. L1 represents an atom group which forms a bidentate ligand with P1 and P2. j1 represents an integer of 1 to 3, j2 represents an integer of 0 to 2, but the sum of j1 and j2 is 2 or 3. M1 represents a transition metal element of the groups 8 to 10 in the element periodic table.

In the general formula (5), P, Q each represent a carbon atom or a nitrogen atom.

Examples of the aromatic hydrocarbon ring which is formed by A1 with P—C in the general formula (5) include benzene ring, biphenyl ring, naphthalene ring, azulene ring, anthracene ring, phenanthrene ring, pyrene ring, chrysene ring, naphthacene ring, triphenylene ring, o-terphenyl ring, m-terphenyl ring, p-terphenyl ring, acenaphthene ring, coronene ring, fluorene ring, fluoranthrene ring, naphthacene ring, pentacene ring, perylene ring, pentaphene ring, picene ring, pyrene ring, pyranthrene ring, anthranthrene ring and the like.

These rings may have a substituent which is exemplified as R11, R12 in the general formula (1).

Examples of the aromatic heterocyclic ring which is formed by A1 with P—C in the general formula (5) include furan ring, thiophene ring, oxazole ring, pyrrole ring, pyridine ring, pyridazine ring, pyrimidine ring, pyrazine ring, triazine ring, benzimidazole ring, oxadiazole ring, triazole ring, imidazole ring, pyrazole ring, triazole ring, indole ring, benzimidazole ring, benzothiazole ring, benzoxazole ring, quinoxaline ring, quinazoline ring, phthalazine ring, carbazole ring, azacarbazole ring and the like.

Here, the azacarbazole ring indicates a ring obtained by substituting one or more carbon atoms of benzene ring constituting carbazole ring by a nitrogen atom.

These rings may further include the substituent group represented by Y1 in the general formula (1).

Examples of the aromatic heterocyclic ring which is formed by A2 with Q-N in the general formula (5) include oxazole ring, oxadiazole ring, oxatriazole ring, isoxazole ring, tetrazole ring, thiadiazole ring, thiatriazole ring, isothiazole ring, pyrrole ring, pyridine ring, pyridazine ring, pyrimidine ring, pyrazine ring, triazine ring, imidazole ring, pyrazole ring, triazole ring and the like.

These rings may further include the substituent group represented by Y1 in the general formula (1).

In the general formula (5), P1-L1-P2 represents a bidentate ligand, P1 and P2 each independently represent carbon atom, nitrogen atom or oxygen atom. L1 represents an atom group which forms a bidentate ligand with P1 and P2.

Examples of the bidentate ligand represented by P1-L1-P2 include phenylpyridine, phenylpyrazole, phenylimidazole, phenyltriazole, phenyltetrazole, pyrazabole, acetylacetone, picolinic acid and the like.

In the general formula (5), j1 represents an integer of 1 to 3, and j2 represents an integer of 0 to 2, but the sum of j1 and j2 is 2 or 3. Among them, j2 is preferably 0.

In the general formula (5), M1 represents a transition metal element (simply referred to as a transition metal) of the groups 8 to 10 in the element periodic table. Among them, M1 is preferably iridium.

(Compound Represented by the General Formula (6))

Among compounds represented by the general formula (5), a compound represented by following the general formula (6) is more preferable.

[Chem. 55]

General formula (6)

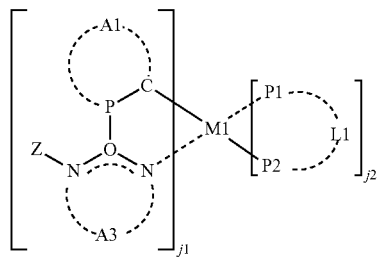

In the above general formula (6), Z represents a hydrocarbon ring group or a hetero ring group. Each of P and Q represents a carbon atom or a nitrogen atom, A1 represents an atom group forming an aromatic hydrocarbon ring or an aromatic hetero ring. A3 represents —C(R01)=C(R02)-, —N=C(R02)-, —C(R01)=N—, or —N=N—, and each of R01 and R02 represents a hydrogen atom or a substituent group. P1-L-P2 represents a bidentate ligand, and each of P1 and P2 represents a carbon atom, a nitrogen atom, or an oxygen atom independently. L1 represents an atom group forming the bidentate ligand together with P1 and P2. While j1 represents an integer of 1 to 3 and j2 represents an integer of 0 to 2, j1+j2 is 2 or 3. M1 represents a transition metal element from group 8 to group 10 in the repetition table of the elements.

In the general formula (6), examples of the hydrocarbon ring group represented by Z include a no-aromatic hydrocarbon ring group and an aromatic hydrocarbon ring group, and examples of the non-aromatic hydrocarbon ring group include a cyclopropyl group, a cyclopentyl group, a cyclohexyl group, and the like. Each of these groups may not include a substituent group or may include the substituent group represented by Y1 in the general formula (1).

Furthermore, examples of the aromatic hydrocarbon ring group (also called aromatic hydrocarbon group or aryl group) include a phenyl group, a p-chlorophenyl group, a mesityl group, a tolyl group, a xilyl group, a naphthyl group, an anthryl group, an azulenyl group, an acenaphthenyl group, a fluorenyl group, a phenanthryl group, an indenyl group, a pyrenyl group, a biphenylyl group, and the like.

Each of these groups may not include a substituent group or may include the substituent group represented by Y1 in the general formula (1).

In the general formula (6), examples of the hetero ring group represented by Z include a non-aromatic hetero ring group, an aromatic hetero ring group, and the like, and examples of the non-aromatic hetero ring group include an epoxy ring, an aziridine ring, a thiirane ring, an oxetane ring, an azetidine group, a thiethane ring, a tetrahydrofuran ring, a dioxolane ring, a pyrrolidine ring, a pyrazolidine ring, an imidazolidine ring, an oxazolidine ring, a tetrahydrothiophene ring, a sulfolane ring, a thiazolidine ring, an ε-caprolactone ring, an ε-caprolactam ring, a piperidine ring, a hexahydropyridazine, a hexahydropyrimidine, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, and the like.

Each of these rings may not include a substituent group or may include the substituent group represented by Y1 in the general formula (1).

Examples of the aromatic hetero ring group include a pyridyl group, a pyrimidinyl group, a furyl group, a pyrrolyl group, an imidazolyl group, a bemzoimidazolyl group, a pyrazolyl group, a pyrazinyl group, a triazolyl group (e.g., 1,2,4-triazole-1-yl group, 1,2,3-triazole-1-yl group, etc.), an oxazolyl group, a benzo oxazolyl group, a triazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbonyl group, a diazacarbazolyl group (indicating a group in which one of carbon atoms constituting a carboline group in the carbonyl group is substituted by a nitrogen atom), a quinoxalinyl group, a pyridazinyl group, a triazinyl group, a quinazolinyl group, a phthalazinyl group, and the like.

Each of these rings may not include a substituent group or may include the substituent group represented by Y1 in the general formula (1).

Preferably, the group represented by Z is an aromatic hydrocarbon ring group or an aromatic hetero ring group.

In the general formula (6), examples of the aromatic hydrocarbon ring which A1 forms together with P—C include a benzene ring, a biphenyl ring, a naphthalene ring, an azylene ring, an anthracene ring, a phenathrene ring, a pyrene ring, a chrysene ring, a naphthacene ring, a triphenylene ring, an o-terphenyl ring, an m-terphenyl ring, a p-terphenyl ring, an acenaphtene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthraanthrene ring, and the like.

Each of these rings may include the substituent group represented by Y1 in the general formula (1).

In the general formula (6), examples of the aromatic hetero ring which A1 forms together with P—C include a furan ring, a thiophene ring, an oxazole ring, a pyrrol ring, a pyridine ring, a pyridazine ring, a pyrimidine ring, a pyrazine ring, a triazine ring, a benzoimidazole ring, an oxadiazole ring, a triazole ring, an imidazole ring, a pyrazole ring, a triazole ring, an indole ring, a benzoimidazole ring, a benzothiazole ring, a benzooxazole ring, a quinoxaline ring, a quinazoline ring, a phthalazine ring, a carbazole ring, a carboline ring, an azacarbazole ring, and the like.

Here, the azacarbazole ring indicates a ring in which one or more carbon atoms of a benzene ring constituting the carbazole ring is substituted by nitrogen atoms.

Each of these rings may include the substituent group represented by Y1 in the general formula (1).

In —C(R01)=C(R02)-, —N=C(R02)-, —C(R01)=N— which are represented by A3 in the general formula (6), the substituent group represented by each of Ro1 and R02 is synonymous with the substituent group represented by Y1 in the general formula (1).

In the general formula (6), examples of the bidentate ligand represented by P1-L1-P2 include phenylpyridine, phenylpyrazole, phenylimidazole, phenyltriazole, phenyltetrazole, pyrazabole, acetylacetone, picolinic acid, and the like.

Furthermore, while j1 represents an integer of 1 to 3 and j2 represents an integer of 0 to 2, j1+j2 represents 2 or 3, and j2 is 0 thereamong.

The transition metal element (also simply called transition metal) from group 8 to group 10 in the repetition table of the elements which is represented by M1 in the general formula (6) is synonymous with the transition metal element from group 8 to group 10 in the repetition table of the elements which is represented by M1 in the general formula (5).

(Compound Represented by the General Formula (7))

Examples of a preferable mode of a compound represented by the above general formula (6) include a compound represented by following the general formula (7).

[Chem. 56]

General formula (7)

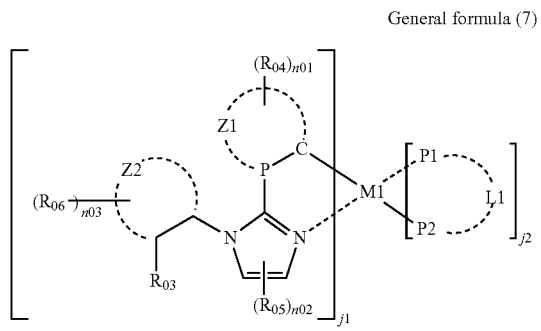

In the above general formula (7), R03 represents a substituent group, R04 represents a hydrogen atom or a substituent group, and a plurality of R04 may bind with one another to form a ring. n01 represents an integer of 1 to 4. R05 represents a hydrogen atom or a substituent group, and a plurality of R05 may bind with one another to form a ring. n02 represents an integer of 1 to 2. R06 represents a hydrogen atom or a substituent group, a plurality of R06 may bind with one another to form a ring. n03 represents an integer of 1 to 4. Z1 represents an atom group necessary for forming a 6-seat aromatic hydrocarbon ring or a 5-seat or 6-seat aromatic hetero ring together with C—C. Z2 represents an atom group necessary for forming a hydrocarbon ring group or a hetero ring group. P1-L1-P2 represents a bidentate ligand, and each of P1 and P2 represents a carbon atom or an oxygen atom independently. L1 represents an atom group forming the bidentate ligand together with P1 and P2. While j1 represents an integer of 1 to 3 and j2 represents an integer of 0 to 2, j1+j2 is 2 or 3. M1 represents a transition metal element from group 8 to group 10 in the repetition table of the elements. Each pair of R03 and R06, R04 and R06, and R05 and R06 may bind with each other to form a ring.

In the general formula (7), the substituent group represented by each of R03, R04, R05, and R06 is synonymous with the substituent group represented by Y1 in the general formula (1).

In the general formula (7), examples of the 6-seat aromatic hydrocarbon ring which Z1 forms together with C—C include a benzene ring and the like.

Each of these rings may further include the substituent group represented by Y1 in the general formula (1).

In the general formula (7), examples of the 5-seat or 6-seat aromatic hetero ring which Z1 forms together with C—C include an oxazole ring, an oxadiazole ring, an oxatriazole ring, an isooxazole ring, a tetrazole ring, a thiadiazole ring, a thiatriazole ring, an isothiazole ring, a thiophene ring, a furan ring, a pyrrol ring, a pyridine ring, a pyridazine ring, a pyrimidine ring, a pyrazine ring, a triazine ring, an imidazole ring, a pyrazole ring, a triazole ring, and the like.

Each of these rings may further include the substituent group represented by Y1 in the general formula (1).

In the general formula (7), example of the hydrocarbon ring group represented by Z2 include a non-aromatic hydrocarbon ring group and an aromatic hydrocarbon ring group, and examples of the non-aromatic hydrocarbon ring group include a cyclopropyl group, a cyclopentyl group, a cyclohexyl group, and the like. Each of these groups may not include a substituent group or may include the substituent group represented by Y1 in the general formula (1).

Furthermore, examples of the aromatic hydrocarbon ring group (also called aromatic hydrocarbon group or aryl group) include a phenyl group, a p-chlorophenyl group, a mesityl group, a tolyl group, a xylyl group, a naphtyl group, an anthryl group, an azulenyl group, an acenaphthenyl group, a fluorenyl group, a phenanthryl group, an indenyl group, a pyrenyl group, a biphenylyl group, and the like. Each of these groups may not include a substituent group or may include the substituent group represented by Y1 in the general formula (1).

In the general formula (7), examples of the hetero ring group represented by Z2 include a non-aromatic hetero ring group, an aromatic hetero ring group, and the like, and example of the non-aromatic hetero ring group include groups derived from an epoxy ring, an aziridine ring, a thiirane ring, an oxetane ring, an azetidine group, a thiethane ring, a tetrahydrofuran ring, a dioxolane ring, a pyrrolidine ring, a pyrazolidine ring, an imidazolidine ring, an oxazolidine ring, a tetrahydrothiophene ring, a sulfolane ring, a thiazolidine ring, an ε-caprolactone ring, an ε-caprolactam ring, a piperidine ring, a hexahydropyridazine, a hexahydropyrimidine, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, and the like. Each of these groups may not include a substituent group or may include the substituent group represented by Y1 in the general formula (1).

Examples of the aromatic hetero ring group include a pyridyl group, a pyrimidinyl group, a furyl group, a pyrrolyl group, an imidazolyl group, a bemzoimidazolyl group, pyrazolyl group, a pyrazinyl group, a triazolyl group (e.g., 1,2,4-triazole-1-yl group, 1,2,3-triazole-1-yl group, etc.), an oxazolyl group, a benzooxazolyl group, a triazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbonyl group, a diazacarbazolyl group (indicating a group in which one of carbon atoms constituting a carboline group in the carbonyl group is substituted by a nitrogen atom), a quinoxalinyl group, a pyridazinyl group, a triazinyl group, a quinazolinyl group, a phthalazinyl group, and the like.

Each of these rings may not include a substituent group or may include the substituent group represented by Y1 in the general formula (1).

In the general formula (7), preferably the group formed by Z1 and Z2 is a benzene ring.

In the general formula (7), the bidentate ligand represented by P1-L1-P2 is anonymous with the bidentate ligand represented by P1-L1-P2 in the general formula (5).

In the general formula (7), the transition metal element represented by M1 from group 8 to group 10 in the repetition table of the elements is anonymous with the transition metal element from group 8 to group 10 in the repetition table of the elements which is represented by M1 in the general formula (5).

Furthermore, the phosphorescent compound can be selected to be used from the publicly known compounds used as the light emitting layer 3c of the organic electroluminescent element EL-1.

The phosphorescent compound according to the present invention is preferably a complex series compound including metal from group 8 to group 10 in the repetition table of the elements and more preferably an iridium compound, an osmium compound, a platinum compound (platinum-complex-bases compound), or a rare earth complex, and the most preferable compound thereamong is the iridium compound.

While specific examples (Pt-1 to Pt-3, A-1, and Ir-1 to Ir-50) of the phosphorescent compound according to the present embodiment will be shown in the following, the present invention is not limited to these examples. Here, in these compounds, each of m and n represents the number of repetitions.

[Chem. 57]

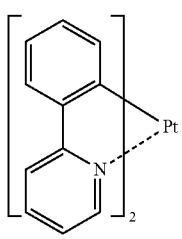

Pt-1

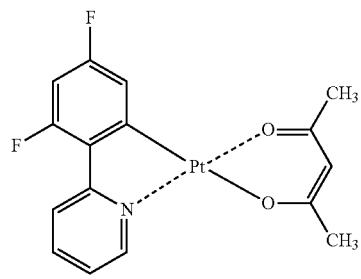

Pt-2

Pt-3

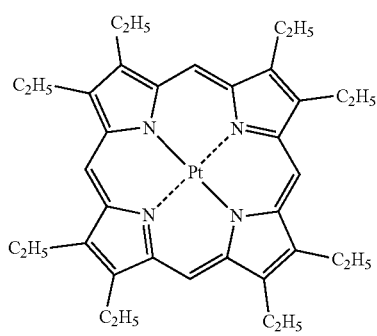

A-1

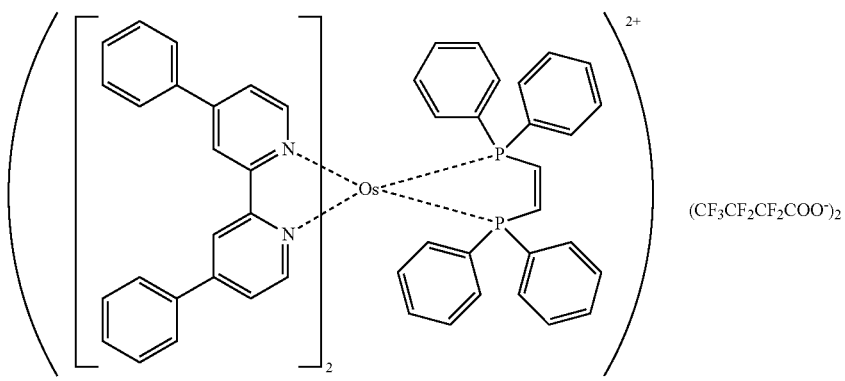

[Chem. 58]

Ir-1

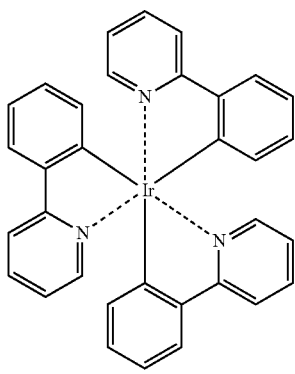

Ir-2

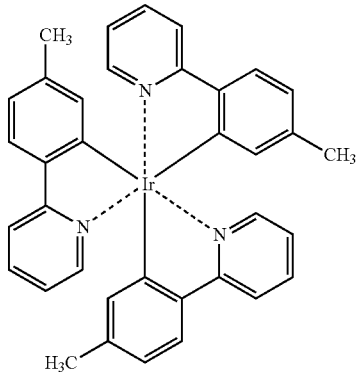

-continued
Ir-3
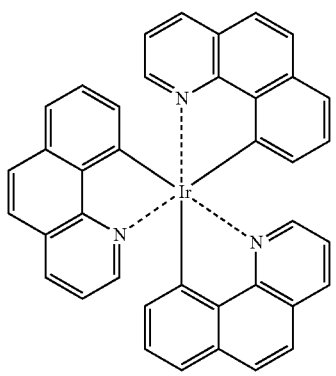
Ir-4
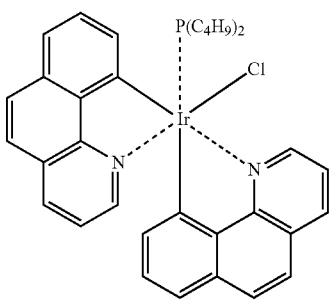
Ir-5
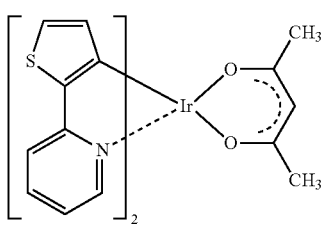
Ir-6
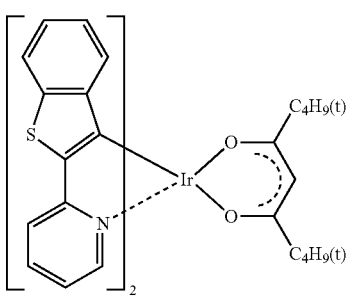
[Chem. 59]
Ir-7
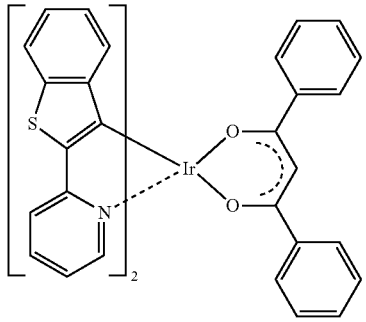
Ir-8
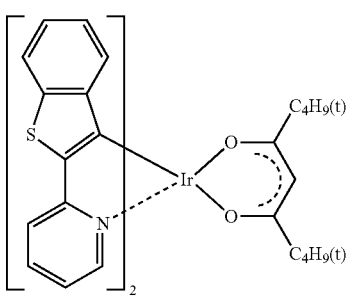
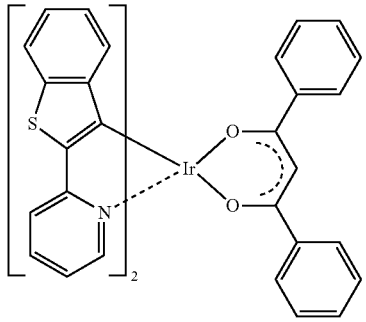
Ir-9
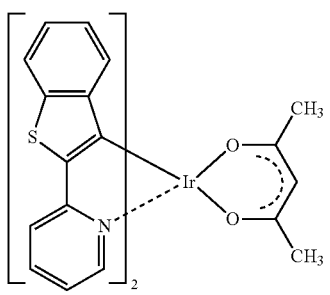
Ir-10
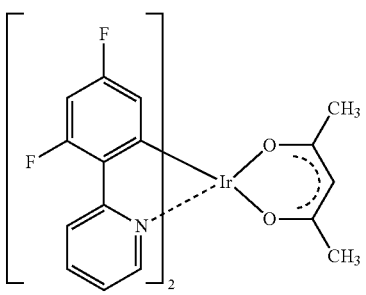
Ir-11
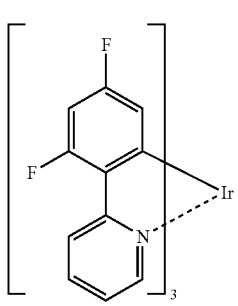
Ir-12
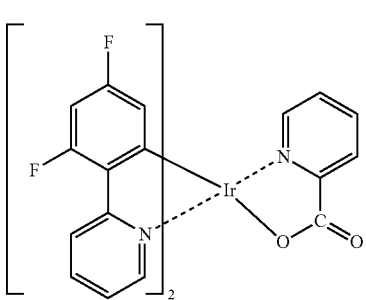

-continued
Ir-13
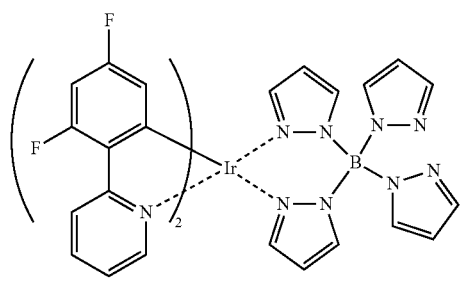
Ir-14
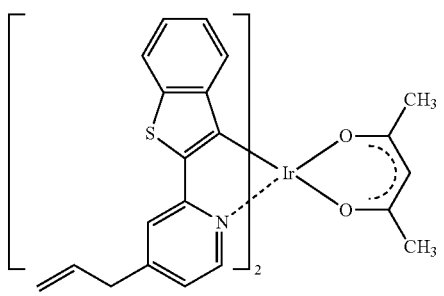
[Chem. 60]
Ir-15
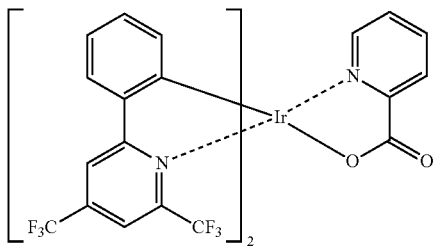
Ir-16
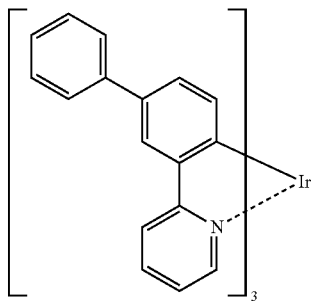
Ir-17
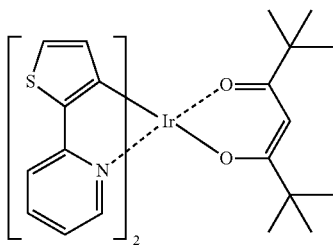
Ir-18
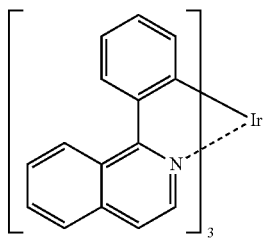
Ir-19
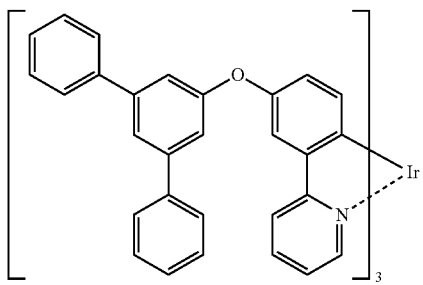
Ir-20
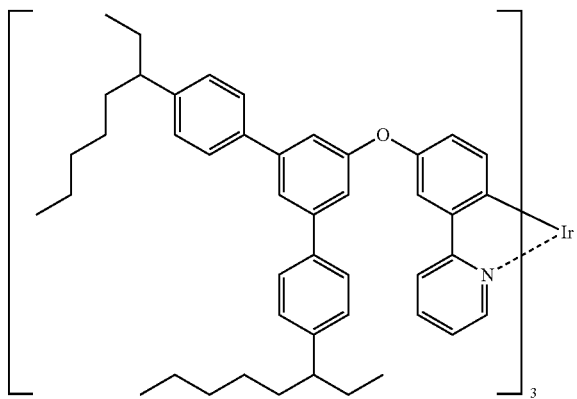

-continued
Ir-21
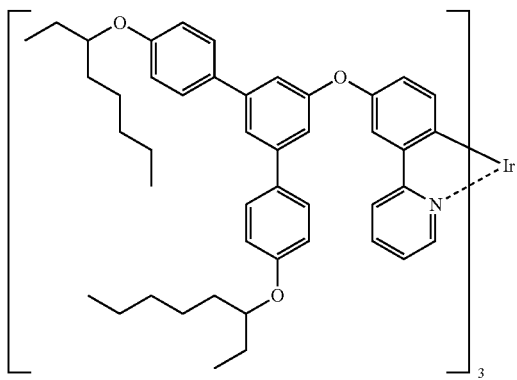
[Chem. 61]
Ir-22
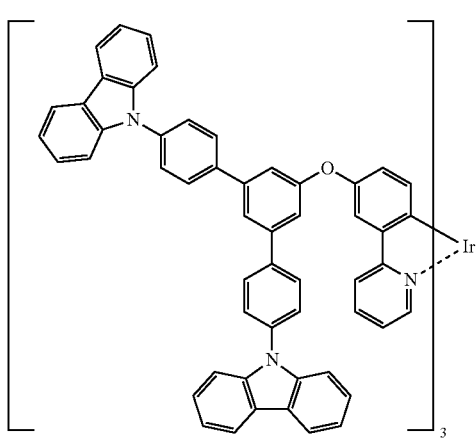
Ir-23
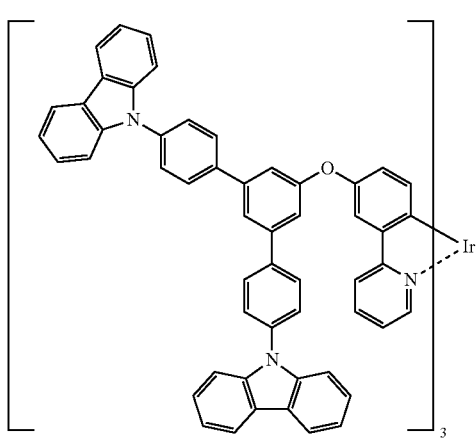
Ir-24
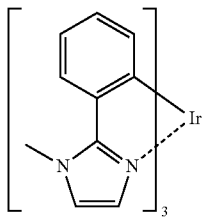
Ir-25
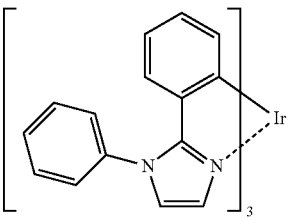
Ir-26
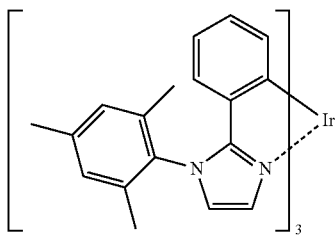
[Chem. 62]
Ir-27
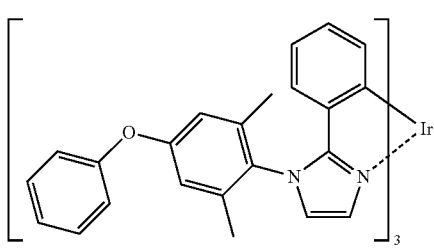
Ir-28
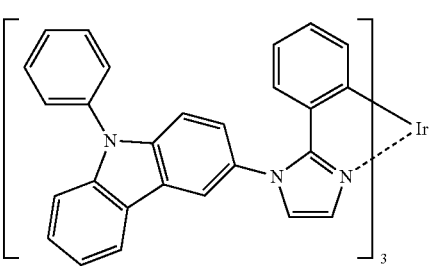

-continued
Ir-29
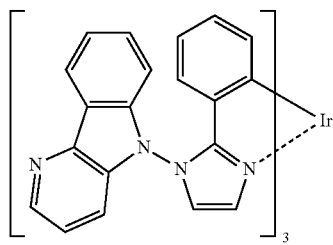
Ir-30
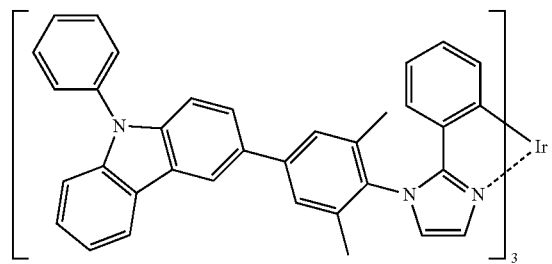
Ir-31
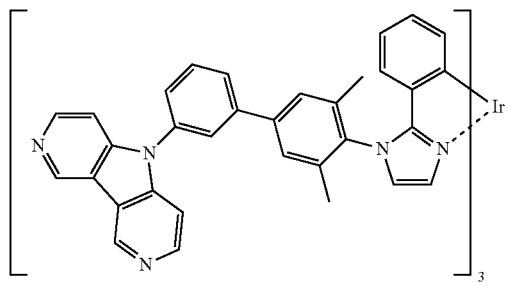
Ir-32
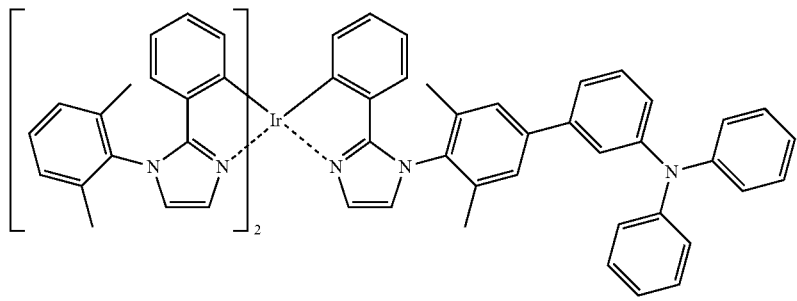
Ir-33
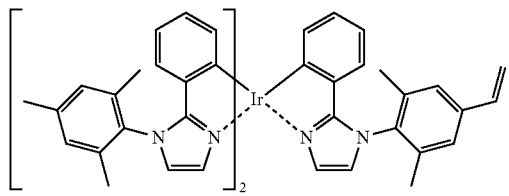
[Chem. 63]
Ir-34
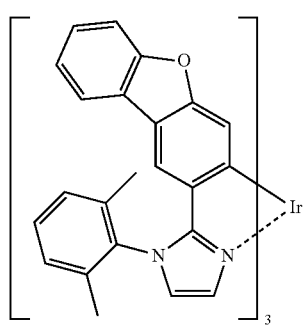
Ir-35
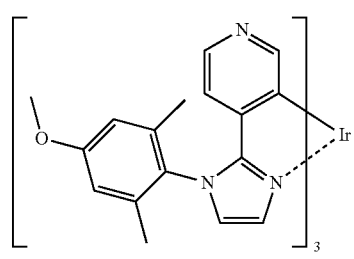

-continued
Ir-36
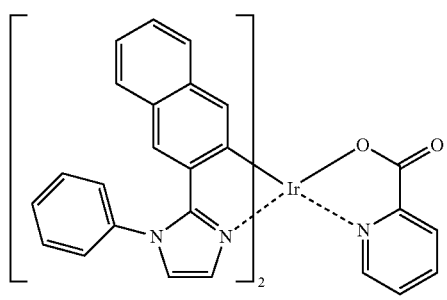
Ir-37
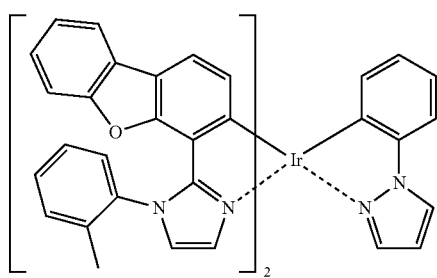
Ir-38
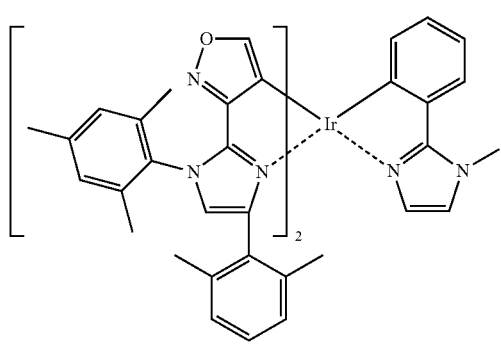
Ir-39
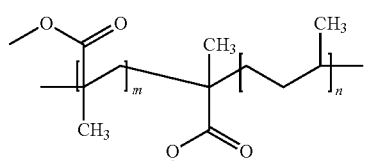
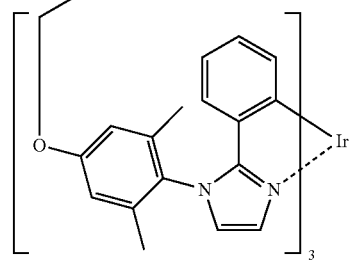
[Chem. 64]
Ir-40
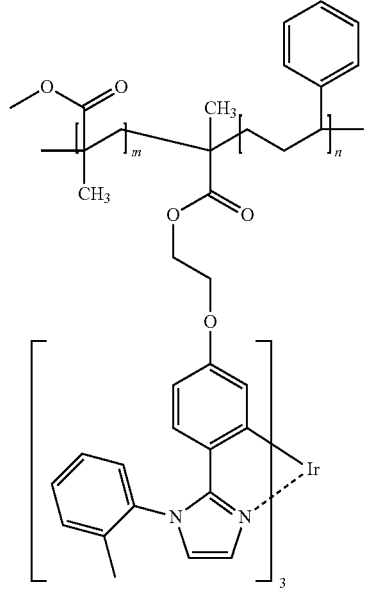
Ir-41

-continued
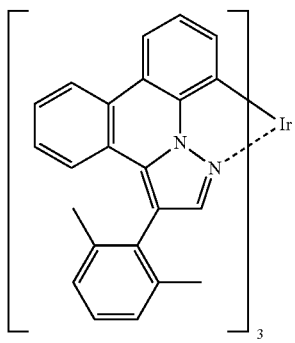
Ir-42
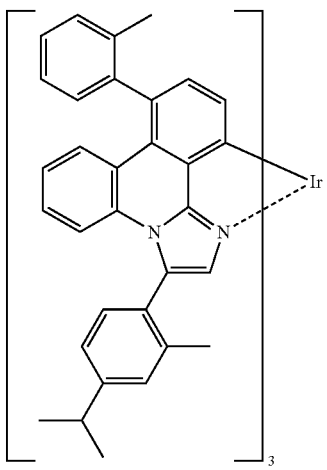
Ir-43
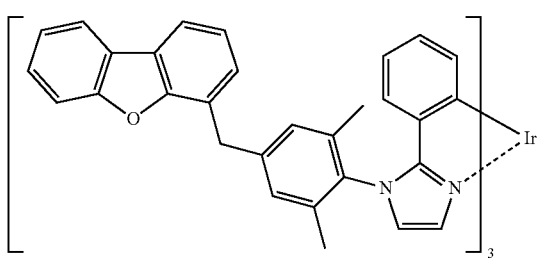
Ir-44
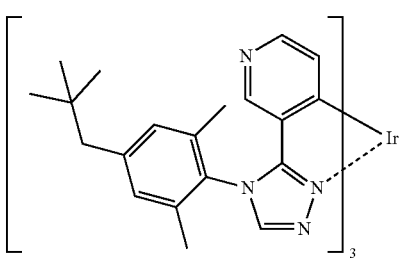
Ir-45
[Chem. 65]
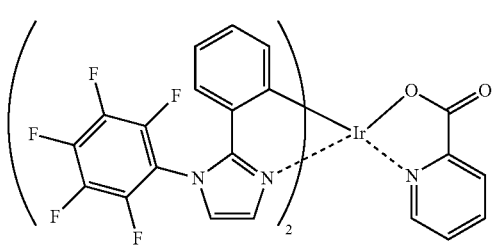
Ir-46
Ir-47
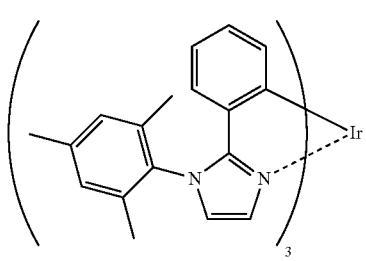
Ir-48
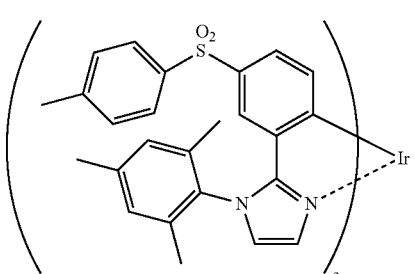
Ir-49
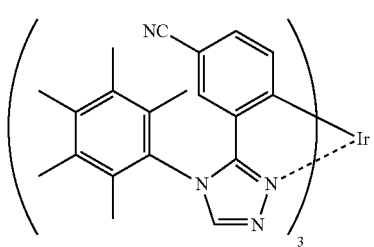
Ir-50
The aforementioned phosphorescent compounds (also referred to as phosphorescent metal complexes and the like) can be synthesized by employing methods described in documents such as Organic Letter, vol. 3, No. 16, pp. 2579-2581

(2001); Inorganic Chemistry, vol. 30, No. 8, pp. 1685-1687 (1991); J. Am. Chem. Soc., vol. 123, p. 4304 (2001); Inorganic Chemistry, vol. 40, No. 7, pp. 1704-1711 (2001); Inorganic Chemistry, vol. 41, No. 12, pp. 3055-3066 (2002); New Journal of Chemistry, vol. 26, p. 1171 (2002); and European Journal of Organic Chemistry, vol. 4, pp. 695-709 (2004); and reference documents described in these documents.

(Fluorescent Material)

Examples of the fluorescent material include a coumarin-based dye, a pyran-based dye, a cyanine-based dye, a croconium-based dye, a squarylium-based dye, an oxobenzanthracene-based dye, a fluorescein-based dye, a rhodamine-based dye, a pyrylium-based dye, a perylene-based dye, a stilbene-based dye, a polythiophene-based dye, or a rare earth complex-based fluorescent material or the like.

[Injection Layer: Positive Hole Injection Layer 3a, Electron Injection Layer 3e]

The injection layer is a layer disposed between an electrode and the light emitting layer 3c in order to decrease a driving voltage and to improve luminance of light emitted, which is described in detail in Part 2, Chapter 2 "Denkyoku Zairyo" (pp. 123-166) of "Yuki EL Soshi To Sono Kogyoka Saizensen (Nov. 30, 1998, published by N. T. S Co., Ltd.)", and examples thereof include a positive hole injection layer 3a and an electron injection layer 3e.

The injection layer is provided as necessary. The positive hole injection layer 3a may be present between an anode and the light emitting layer 3c or the positive transport layer 3b, and the electron injection layer 3e may be present between a cathode and the light emitting layer 3c or the electron transport layer 3d.

The positive hole injection layer 3a is also described in detail in documents such as Japanese Patent Application Laid-Open Publication Nos. 09-45479, 09-260062 and 08-288069, and examples thereof include a phthalocyanine layer represented by copper phthalocyanine, an oxide layer represented by vanadium oxide, an amorphous carbon layer, a polymer layer using a conductive polymer such as polyaniline (emeraldine) or polythiophene and the like.

The electron injection layer 3e is also described in detail in documents such as Japanese Patent Application Laid-Open Publication Nos. 06-325871, 09-17574 and 10-74586, and examples thereof include: a metal layer represented by strontium or aluminum, an alkali metal halide layer represented by potassium fluoride, an alkali earth metal compound layer represented by magnesium fluoride, an oxide layer represented by molybdenum oxide and the like. It is preferable that the electron injection layer 3e of the present invention is a very thin film, and the thickness thereof is within a range of 1 nm to 10 μm although it depends on the material thereof.

[Positive Hole Transport Layer 3b]

The positive hole transport layer 3b is formed of a positive hole transport material having a function of transporting positive holes, and a positive hole injection layer 3a and an electron blocking layer are also included in the positive hole transport layer 3b in the broad sense of the word. The positive hole transport layer 3b may be provided as a sole layer or as a plurality of layers.

The positive hole transport material is a material having an injection capability or transport capability of positive holes, and barrier property against electrons and either an organic substance or an inorganic substance may be used. Examples include a triazole derivative, an oxadiazole derivative, an imidazole derivative, a polyarylalkane derivative, a pyrazoline derivative and a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline-based copolymer, and a conductive high molecular oligomer, particularly, a thiophene oligomer and the like.

Those described above can be used as the positive hole transport material. However, it is preferable to use a porphyrin compound, an aromatic tertiary amine compound and a styrylamine compound, particularly, an aromatic tertiary amine compound.

Typical examples of the aromatic tertiary amine compound and the styrylamine compound include N,N,N',N'-tetraphenyl-4,4'-diaminophenyl; N,N'-diphenyl-N,N'-bis(3-methylphenyl)-[1,1'-biphenyl]-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-metyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; N-phenylcarbazole; those having two condensed aromatic rings in a molecule described in U.S. Pat. No. 5,061,569, for instance, 4,4'-bis[N-(1-naphthyl)-N-phenylamino]biphenyl (NDP), 4,4',4''-tris[N-(3-methylphenyl)-N-phenylamino]triphenylamin e (MTDATA) in which three triphenylamine units are bonded in a star burst form described in Japanese Patent Application Laid-Open Publication No. 04-308688 and the like.

Furthermore, polymer materials in which these materials are introduced into a polymer chain or constitute a main chain of a polymer can also be used. Moreover, inorganic compounds such as a p type-Si and a p type-SiC can also be used as the positive hole injection material and the positive hole transport material.

In addition, it is also possible to use so-called p type positive hole transport materials described in documents such as Japanese Patent Application Laid-Open Publication No. 11-251067 and Applied Physics Letters 80 (2002), p. 139 by J. Huang et. al. In the present invention, it is preferable to use these materials in view of producing a light emitting element having high efficiency.

The positive hole transport layer 3b can be formed by making the aforementioned positive hole transport material a thin film by a well-known method such as the vacuum evaporation method, the spin coating method, the casting method, the printing method including the ink-jet method or the LB method. The thickness of the positive hole transport layer 3b is not particularly limited, but the thickness is generally within a range about of 5 nm to 5 μm, preferably within a range of 5 nm to 200 nm. This positive hole transport layer 3b may have a single layer configuration constituted of one or two or more of the aforementioned materials.

Furthermore, it is possible to enhance the p property by doping the material of the positive hole transport layer 3b with impurities. Examples include those described in documents such as Japanese Patent Application Laid-Open Publication Nos. 04-297076, 2000-196140, 2001-102175 and J. Appl. Phys., 95, 5773 (2004).

As described above, it is preferable that enhancement of a high p property of the positive hole transport layer 3b makes it possible to produce an element which consumes lower electric power.

[Electron Transport Layer 3d]

The electron transport layer 3d is formed of a material having a function of transporting electrons, and, in a broad sense, the electron injection layer 3e and a positive hole blocking layer (not shown) are involved in the electron transport layer 3d. The electron transport layer 3d can be provided as a single layer or a laminated layer of a plurality of layers.

In the electron transport layer 3d having a single layer configuration and the electron transport layer 3d having a laminated layer configuration, the electron transport material constituting a layer provided adjacent to the light emitting layer 3c has a function of transporting electrons injected from the cathode to the light emitting layer 3c. The material to be used can be optionally selected from well-known compounds. Examples include a nitro-substituted fluorene derivative, a diphenylquinone derivative, a thiopyrandioxide derivative, carbodiimide, a fluorenylidenemethane derivative, anthraquinonedimethane, an anthrone derivative, and an oxadiazole derivative and the like. Furthermore, in the aforementioned oxadiazole derivative, a thiadiazole derivative which is formed by substituting the oxygen atom of the above oxadiazole ring by a sulfur atom, and a quinoxaline derivative having a quinoxaline ring which is well-known as an electron withdrawing group can be used as the material of the electron transport layer 3d. Moreover, polymer materials in which these materials are introduced into a polymer chain or constitute a main chain of a polymer can also be used.

Additionally, metal complexes of an 8-quinolinol derivative such as: tris(8-quinolinol)aluminum (Alq3), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol) zinc (Znq), and metal complexes in which the central metal of the these metal complexes is substituted by In, Mg, Cu, Ca, Sn, Ga or Pb can also be used as the material of the electron transport layer 3d.

Other than the above, a metal-free or metalphthalocyanine and those in which the terminals thereof are substituted by an alkyl group, a sulfonic acid group or the like can be preferably used as the material of the electron transport layer 3d. Moreover, the distyrylpyrazine derivative mentioned as an example of the material of the light emitting layer 3c can also be used as the material of the electron transport layer 3d. In the same way as the positive hole injection layer 3a and the positive hole transfer layer 3b, inorganic semiconductors such as an n type-Si and an n type-Sic can also be used as the material of the electron transport layer 3d.

The thickness of the electron transport layer 3d is not particularly limited, but the thickness is generally within a range of 5 nm to 5 μm, preferably within a range of 5 nm to 200 nm. This electron transport layer 3d may have a single layer configuration constituted of one or two or more kinds of the aforementioned materials.

Furthermore, it is possible to enhance the n property by doping the material of the electron transport layer 3d with impurities. Examples thereof include those described in documents such as Japanese Patent Application Laid-Open Publication Nos. 04-297076, 10-270172, 2000-196140 and 2001-102175 and J. Appl. Phys., 95, 5773 (2004). Moreover, it is preferable to introduce potassium or a potassium compound into the electron transport layer 3d. Examples of the potassium compound that can be used include, for example, potassium fluoride, and the like. As described above, by enhancement of an n property of the electron transport layer 3d, an element which consumes lower electric power can be produced.

Alternatively, the equivalents to the above material of the nitrogen containing layer 1a may be also available for the material of the electron transport layer 3d (electron transport compound). This would be similar to the electron transport layer 3d concurrently serving as the electron injection layer 3e, and therefore, the equivalents to the above material of the nitrogen containing layer 1a is also available.

[Blocking Layer: Positive Hole Blocking Layer, Electron Blocking Layer]

The blocking layer is provided as necessary in addition to the basic constituent layers of thin organic compound films described above. Examples thereof include a positive hole blocking layer described in documents such as Japanese Patent Application Laid-Open Publication Nos. 11-204258, 11-204359, and p. 237 of "Yuki EL Soshi To Sono Kogyoka Saizensen (Organic EL Element and Front of Industrialization thereof) (Nov. 30, 1998, published by N. T. S Co., Ltd.)", and the like.

The positive hole blocking layer has a function of the electron transport layer 3d in a broad sense. The positive hole blocking layer is formed of a positive hole blocking material having a remarkably small capability to transport positive holes while having a function of transporting electrons and can increase recombination probability of electrons and positive holes by blocking positive holes while transporting electrons. Furthermore, as necessary, the configuration of an electron transport layer 3d described below can be used as the positive hole blocking layer according to the present invention. It is preferable that the positive hole blocking layer be disposed adjacent to the light emitting layer 3c.

On the other hand, the electron blocking layer has a function as the positive hole transport layer 3b in abroad sense. The electron blocking layer is formed of a material having a very little capability to transport electrons while having a function of transporting positive holes, and can increase the recombination probability of electrons and positive holes by blocking electrons while transporting positive holes. Furthermore, as necessary, the configuration of a positive hole transport layer 3b described below can be applied to the electron blocking layer. The thickness of the positive hole blocking layer according to the present invention is preferably 3 to 100 nm, more preferably 5 to 30 nm.

[Auxiliary Electrode 15]

An auxiliary electrode 15 is provided in order to lower an electric resistance of the transparent electrode 1 and is provided in contact with the electrode layer 1b of the transparent electrode 1. As a material forming the auxiliary electrode 15, a metal having a low electric resistance such as gold, platinum, silver, copper or aluminum is preferable. These metals may be patterned within a range not affecting the extraction of the emitted light h from a light extraction surface 17a due to the low light transmission property. Examples of a method for forming the auxiliary electrode 15 include the vapor evaporation method, the sputtering method, the printing method, the ink-jet method, an aerosol jet method and the like. It is preferable that the line width of the auxiliary electrode 15 is 50 μm or less in view of an aperture ratio for the light extraction, and the thickness of the auxiliary electrode 15 is 1 μm or more in view of electric conductivity.

[Sealing Material 17]

A transparent sealing material 17 is a material for covering the organic electroluminescent element EL-1, and may be a plate-like (film-like) sealing member which is fixed to a substrate 13 by an adhesive 19, or may be a sealing membrane. The transparent sealing material 17 is provided in a state in which the terminal portions of transparent electrode 1 and the counter electrode 5-1 of the organic electroluminescent element EL-1 are exposed and at least the light emitting functional layer 3 is covered. Alternatively, the transparent sealing material 17 may be constituted so that an electrode is provided on the transparent sealing material 17, and the electrode is electrically conducted with the terminal portions of transparent electrode 1 and the counter electrode 5-1 of the organic electroluminescent element EL-1.

Specific examples of the plate-like (film-like) transparent sealing material 17 include a glass substrate, a polymer substrate, and the transparent sealing material 17 may be used by making these substrates into thinner-type films. Examples of glass substrate can include particularly soda lime glass, barium strontium-containing glass, lead glass, alminosilicate glass, borosilicate glass, barium borosilicate glass, quartz and the like. In addition, examples of the polymer substrate can include polycarbonate, acryl, polyethylene terephthalate, polyethersulfide, polysulfone and the like. The metal substrate can include the one obtained by using one or more metals or alloys selected from the group consisting of stainless steel, iron, copper, aluminum, magnesium, nickel, zinc, chromium, titanium, molybdenum, silicon, germanium and tantalum.

Among them, from the viewpoint of being able to thin the element, the polymer substrate or the metal substrate in the form of a thin film is preferably used as a sealing material.

Furthermore, the polymer substrate in the form of a thin film preferably has an oxygen transmittance measured in accordance with the method of JIS-K-7126-1987 of $1\times10^{-3}$ ml/(m$^2$·24 hr·atm) or less and a water vapor transmittance ($25\pm0.5°$ C., relative humidity ($90\pm2$) % RH) measured in accordance with the method of JIS-K-7129-1992 of $1\times10^{-3}$ g/(m$^2$·24 hr) or less.

Moreover, the above substrate material may also be processed into the form of a recessed plate to thereby be used as the sealing material 17. In this case, processing such as sandblast processing or chemical etching processing is performed on the substrate member to thereby form recessed portions.

Meanwhile, when the organic electroluminescent element EL-1 is an element in which the emitted light h is extracted also from the counter electrode 5-1 side, a material having a favorable light transmission property may be used by being selected among the above materials, as the sealing member 17.

In addition, the adhesive 19 for fixing the plate-like sealing material 17 to the transparent substrate 13 is also used as a sealant for sealing the organic electroluminescent element EL-1 sandwiched between the transparent sealing material 17 and the substrate 13. Examples of the adhesive 19 can include a photo curable and thermosetting-type adhesive such as an acrylic acid-based oligomer or methacrylic acid-based oligomer having a reactive vinyl group, a moisture curable type adhesive such as 2-cyanoacrylic acid ester and the like.

In addition, examples of the adhesive 19 can include a thermosetting or chemical curable (two liquids mixing type) adhesive such as epoxy-based adhesive. Furthermore, there can be included a hot-melt type adhesive such as polyamide, polyester, polyolefin, or the like. Moreover, there can be included an ultraviolet curable-type epoxy resin adhesive of cationic curable-type.

Meanwhile, there is a case in which the organic materials constituting the organic electroluminescent element EL-1 degrade through heat treatment. Therefore, it is preferable that the adhesive 19 can be adhered and cured at temperatures from room temperature to 80° C. In addition, a drying agent may be dispersed in the adhesive 19.

Coating of the adhesive 19 on the adhesion portion of the sealing material 17 and the transparent substrate 13 may be carried out using a commercially available dispenser, or by printing such as screen-printing.

Furthermore, when a gap is formed among the plate-like sealing material 17 and the transparent substrate 13 and the adhesive 19, it is preferable to inject an inert gas such as nitrogen or argon, or an inert liquid such as a fluorinated hydrocarbon or a silicone oil to the gap, in gaseous phase and liquid phase. It is possible to be set vacuum. Furthermore, it is possible to enclose a hydroscopic compound into the gap.

Examples of the hydroscopic compound include, for instance, a metal oxide (for example, sodium oxide, potassium oxide, calcium oxide, barium oxide, magnesium oxide, aluminum oxide and the like), a sulfate (for example, sodium sulfate, calcium sulfate, magnesium sulfate, cobalt sulfate and the like), a metal halide (for example, calcium chloride, magnesium chloride, cesium fluoride, tantalum fluoride, cesium brominate, magnesium brominate, barium iodide, magnesium iodide and the like), a perchloric acid (for example, barium perchloric acid salt, magnesium perchloric acid salt and the like), and the like. In the sulfate, metal halide and the perchloric acid, an anhydrous salt is suitably used.

In contrast, when using the sealing membrane as the sealing material 17, the sealing membrane is formed on the transparent substrate 13 in a state in which the light emitting functional layer 3 of the organic electroluminescent element EL-1 is completely covered and the terminal portions of the transparent electrode 1 and the counter electrode 5-1 of the organic electroluminescent element EL-1 are exposed.

The sealing membrane is constituted using an inorganic material or an organic material. Particularly, the sealing membrane should be constituted by a material having function of suppressing the immersion of a substance which causes degradation of the light emitting functional layer 3 in the organic electroluminescent element EL-1, such as moisture and oxygen. There is used as such a material, for example, an inorganic material such as silicon oxide, silicon dioxide or silicon nitride. Furthermore, in order to improve its fragility of the sealing membrane, a laminated structure may be formed by using a membrane formed of an organic material, in addition to the membrane formed of the inorganic material.

The method for forming the membranes is not particularly limited, and there can be used, for example, a vacuum evaporation method, a sputtering method, a reactive sputtering method, a molecular beam epitaxy method, a cluster ion beam method, an ion plating method, a plasma polymerization method, an atmospheric plasma polymerization method, a plasma CVD method, a laser CVD method, a heat CVD method, a coating method, and the like.

[Protective Membrane, Protective Plate]

Meanwhile, although the illustration here is omitted, a protective membrane or a protective plate may be provided by sandwiching the organic electroluminescent element EL and the sealing material 17 between the transparent substrate 13. The protective membrane or the protective plate is to mechanically protect the organic electroluminescent element EL, and particularly when the sealing material 17 is the protective membrane, it is preferable to provide the protective membrane or the protective plate since the mechanical protection of the organic electroluminescent element EL is not sufficient.

Examples of the protective membrane or the protective plate to be applied include a glass plate, a polymer plate, a thinner polymer film, a metal plate, a thinner metal plate, or a membrane of polymer material and a membrane of metal material. Among them, from the viewpoint of light weight and small thickness, the polymer film is preferably used.

<Production Method of Organic Electroluminescent Element EL-1>

Here, as one embodiment, the manufacturing method of the organic electroluminescent element EL-1 shown in FIG. 8 will be explained.

First, the transparent electrode 1 which becomes the anode is formed on the transparent substrate 13 prepared as the substrate 11 through the use of the manufacturing apparatus explained in the first embodiment or the second embodiment. At this time, with reference to, for example, FIG. 1, the transparent electrode 1 is formed at a prescribed position of the moving substrate 11 so as to cause the film formation of the transparent electrode layer 1b to be started by the second supply source 25b between starting the formation of the nitrogen-containing layer 1a and two minutes, preferably one minute, after finishing the formation of the nitrogen-containing layer 1a by the first supply source. At this time, the movement speed v of the transparent electrode 13 serving as the substrate 11 in the movement direction x, a supply amount of the material from each of the supply sources 25a and 25b, and the size of each of the supply regions Sa and Sb are adjusted. Therefore, the nitrogen-containing layer 1a constituted of a compound including nitrogen atoms is formed so as to have a thickness of 1 µm or less, and preferably a thickness of 10 nm to 100 nm. Furthermore, the transparent electrode layer 1b constituted of silver (or alloy mainly containing silver) is formed so as to have a thickness of 12 nm or less.

Next, a light emitting functional layer 3 was formed on the counter electrode by the formation of a positive hole injection layer 3a, a positive hole transport layer 3b, alight emitting layer 3c, an electron transport layer 3d and an electron injection layer 3e in the order. There are employed, for the film formation of the layers, a spin coating method, a casting method, an inkjet printing method, an evaporation method, a sputtering method, a printing method, and the like. From the viewpoints of obtaining a homogeneous membrane easily, of not generating a pinhole easily and the like, the vacuum evaporation method or the spin coating method is particularly preferable. In addition, a different film forming method may be employed to each layer. When employing the evaporation method for film formation of each layer, although the evaporation conditions are varied depending on the kind of the compound to be used, it is desirable to select each condition optionally within the ranges of a heating temperature of boat for housing a compound of 50° C. to 450° C., a degree of vacuum of $10^{-6}$ Pa to $10^{-2}$ Pa, a deposition speed of 0.01 nm/sec. to 50 nm/sec., a temperature of substrate of −50° C. to 300° C., and a thickness of membrane of 0.1 µm to 5 µm.

After formation of the light emitting functional layer 3 as describe above, a counter electrode 5-1 serving as a cathode is formed in the upper portion thereof by an appropriate film formation method such as an evaporation method and a sputtering method. At this time, the counter electrode 5-1 is patterned into a shape in which the terminal part is extracted from the upper part of the light emission functional layer 3 to the peripheral edge of the transparent substrate 13 while keeping an insulating state with respect to the transparent electrode 1 by the light emission functional layer 3. This results in obtaining the organic electroluminescent element EL-1. Furthermore, after that, the sealing member 17 is provided covering at least the light emission functional layer 3 in a state in which the terminal parts of the transparent electrode and the counter electrode 5-1 in the organic electroluminescent element EL-1 are exposed.

By the above procedures, a desired organic electroluminescent element EL-1 is obtained on the transparent substrate 13. In the production of the organic electroluminescent element EL-1, although it is preferable to perform production consistently from the light emitting functional layer 3 to the counter electrode 5-1 through one-time vacuum drawing, it may be possible that the transparent substrate 13 is extracted from the vacuum atmosphere to thereby be subjected to other different film formation. At this time, it is necessary to consider that the procedures are carried out under a dry inert gas atmosphere.

In the case of applying a direct voltage to the organic electroluminescent element EL-1 thus obtained, while setting the counter electrode 5-1 of the anode as +polarity and the electrode layer 1b of the cathode as −polarity, a light emission can be observed when applying a voltage of 2 V or more to 40 V or less to the electrodes. In addition, an alternating voltage may be applied. Meanwhile, a waveform of the alternating voltage to be applied may be optional.

<Effects of Organic Electroluminescent Element EL-1>

The aforementioned organic electroluminescent element EL-1 has the configuration in which the transparent electrode 1 of the present invention produced by having both electrical conductivity and light transmission property is used as the anode, and the light emitting functional layer 3 and the counter electrode 5-1 serving as the cathode are provided in this order thereon. Accordingly, while a light emission with a high luminance of the organic electroluminescent element EL-1 can be implemented by applying a sufficient voltage between the transparent electrode 1 and the counter electrode 5-1, it is possible to achieve a high luminance by enhancing an extraction efficiency of the emitted light h from the transparent electrode 1. Furthermore, it is also possible to achieve enhancement of emission life by reducing a driving voltage for obtaining a given luminance.

<<7. Second Example of an Organic Electroluminescent Element Produced Using a Manufacturing Apparatus in the Embodiment>>

<Configuration of an Organic Electroluminescent Element EL-2>

Figure 9:
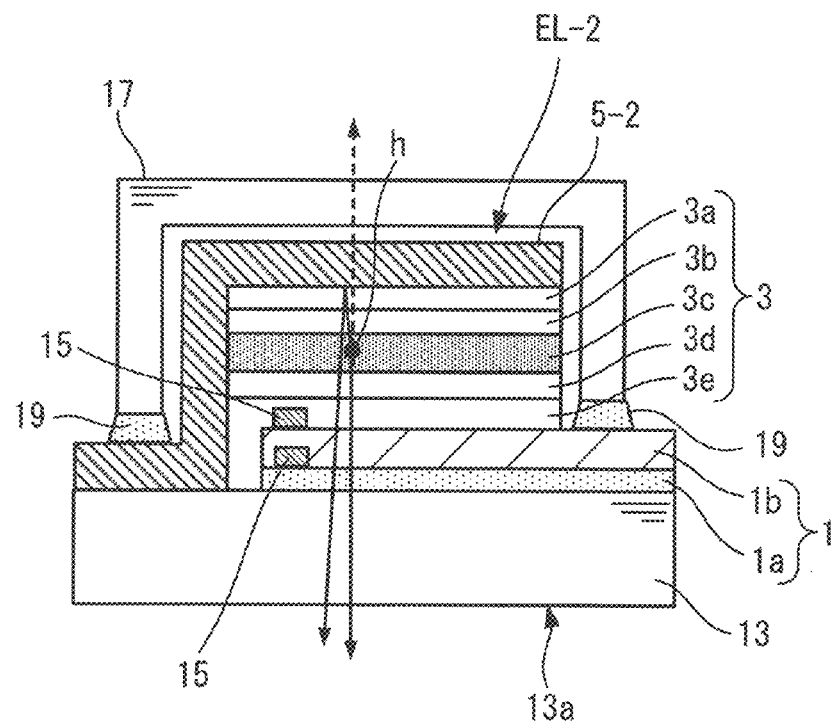
FIG. 9 is a schematic cross-sectional view of a second example for another electronic device (organic electroluminescent element) produced by a manufacturing apparatus in a first embodiment or a second embodiment.

FIG. 9 is a cross-sectional configuration view showing a second example of an organic electroluminescent element using the transparent electrode 1 as an example of an electronic device produced through the use of the aforementioned manufacturing apparatus of the first embodiment or the second embodiment. Hereinafter, a configuration of the organic electroluminescent element will be explained on the basis of the drawing.

The organic electroluminescent element EL-2 of the second example shown in FIG. 9 is different from the organic electroluminescent element EL-1 of the first example explained using FIG. 8 in that the transparent electrode 1 is used as a cathode. The fact that the transparent electrode 1 produced through the use of the above manufacturing apparatus of the first embodiment or the second embodiment is used as the transparent electrode 1 is the same. Hereinafter, duplicated and detailed explanation of the same constituent element as in the first example will be omitted and a characteristic configuration of the organic electroluminescent element EL-2 in the second example will be explained.

The organic electroluminescent element EL-2 shown in FIG. 9 is provided on the transparent substrate 13 and it is characteristic that the above explained transparent electrode 1 of the present invention is used as the transparent electrode 1 on the transparent substrate 13 in the same way as in the first example. Therefore, the organic electroluminescent element EL-2 is constituted so as to extract the emitted light h at least from the transparent substrate 13 side. However, the transparent electrode 1 is used as a cathode (negative electrode). Accordingly, a counter electrode 5-2 is used as an anode.

The layer configuration of the organic electroluminescent element EL-2 is not limited, and a general layer configuration may be used in the same way as in the first embodiment. As one example in the case of the present second embodiment, a configuration is exemplified in which the electron injection layer 3e/electron transport layer 3d/light emitting layer 3c/positive hole transport layer 3b/positive hole injection layer 3a are laminated in this order in the upper portion of the transparent electrode 1 having a function as a cathode, and furthermore the counter electrode 5-2 for a cathode is laminated in the upper portion thereof. However, among these, it is essential to have, at least, the light emitting layer 3c formed of an organic material.

Meanwhile, various configurations are employed, as necessary, as the light emitting functional layer 3, other than the layers in the same way as that explained in the first embodiment. In the aforementioned configurations, in the same way as in the first embodiment, only the portion in which the light emitting functional layer 3 is sandwiched between the transparent electrode 1 and the counter electrode 5-2 serves as the light emitting region in the organic electroluminescent element EL-2.

Furthermore, in the above layer configuration, in the same way as in the first embodiment, in order to lower the electric resistance of the transparent electrode 1, the auxiliary electrode 15 may be provided in contact with the electrode layer 1b of the transparent electrode 1.

The counter electrode 5-2 used herein as an anode may include a metal, an alloy, an electrically conductive organic or inorganic compound, and a mixture thereof. Specific examples include a metal such as gold (Au), copper iodide (CuI), an oxide semiconductor such as ITO, ZnO, TiO2 or SnO2 and the like.

The above counter electrode 5-2 can be produced by forming a thin film from the electric conductive material by using a method such as vapor evaporation or sputtering. Furthermore, the sheet resistance of the counter electrode 5-2 is preferably several hundred Ω/sq. or less, and the thickness is generally selected from the range of 5 nm to 5 μm, preferably within the range of 5 nm to 200 nm.

Meanwhile, in the case where the organic electroluminescent element EL-2 is the type that extracts the emitted light h also from the counter electrode 5-2, an electrically conductive material having a good light transmission property may be selected as the material constituting the counter electrode 5-2, among the aforementioned electrically conductive materials. The above transparent electrode 1 may be used as the counter electrode 5-2 having a light transmission property like this. In this case, on a substrate in which the layers up to the light emission functional layer 3 are formed on the transparent substrate 13, the transparent electrode 1 having a laminated structure of the nitrogen-containing layer 1a and the transparent electrode layer 1b may be formed through the use of the above-explained manufacturing apparatus of the first embodiment or the second embodiment.

The organic electroluminescent element EL-2 having the above configuration is sealed with a sealing material 17 in the same way as in the first example in order to prevent deterioration of the light emitting functional layer 3.

Among these main layers of the organic electroluminescent element EL-2 described above, the detailed configuration of the constituent elements excluding the counter electrode 5-2 used as an anode and the method for manufacturing the organic electroluminescent element EL-2 are similar to the ones described in the first example. Therefore, the detailed explanation will be omitted.

<Production Method of Organic Electroluminescent Element EL-2>

The manufacturing method of the organic electroluminescent element EL-2 shown in FIG. 9 as explained above may be the same as that of the organic electroluminescent element EL-2 explained using FIG. 8, and the procedure in which the transparent electrode 1 is formed on the transparent substrate 13 prepared as the substrate 11 through the use of the manufacturing apparatus explained in the first embodiment or the second embodiment is characteristic. Meanwhile, only the fact that the transparent electrode 1 is formed as the cathode and the formation order of the light emission functional layer 3 provided in the upper portion thereof is reversed is different from the above first example.

<Effects of Organic Electroluminescent Element EL-2>

The aforementioned organic electroluminescent element EL-2 has a configuration in which the transparent electrode 1 of the present invention formed by having both electrical conductivity and light transmission property is used as a cathode, and the light emitting functional layer 3 and the counter electrode 5-2 serving as the anode are provided in the upper portion thereof. Accordingly, in the same way as in the first embodiment, while a light emission with a high luminance of the organic electroluminescent element EL-2 can be implemented by applying a sufficient voltage between the transparent electrode 1 and the counter electrode 5-1, it is possible to achieve a high luminance by enhancing an extraction efficiency of the emitted light h from the transparent electrode 1. Furthermore, it is also possible to achieve improvement of emission life by reducing a driving voltage for obtaining a given luminance.

<<8. Electronic Device Manufacturing Apparatus in a Third Embodiment>>

Figure 10:
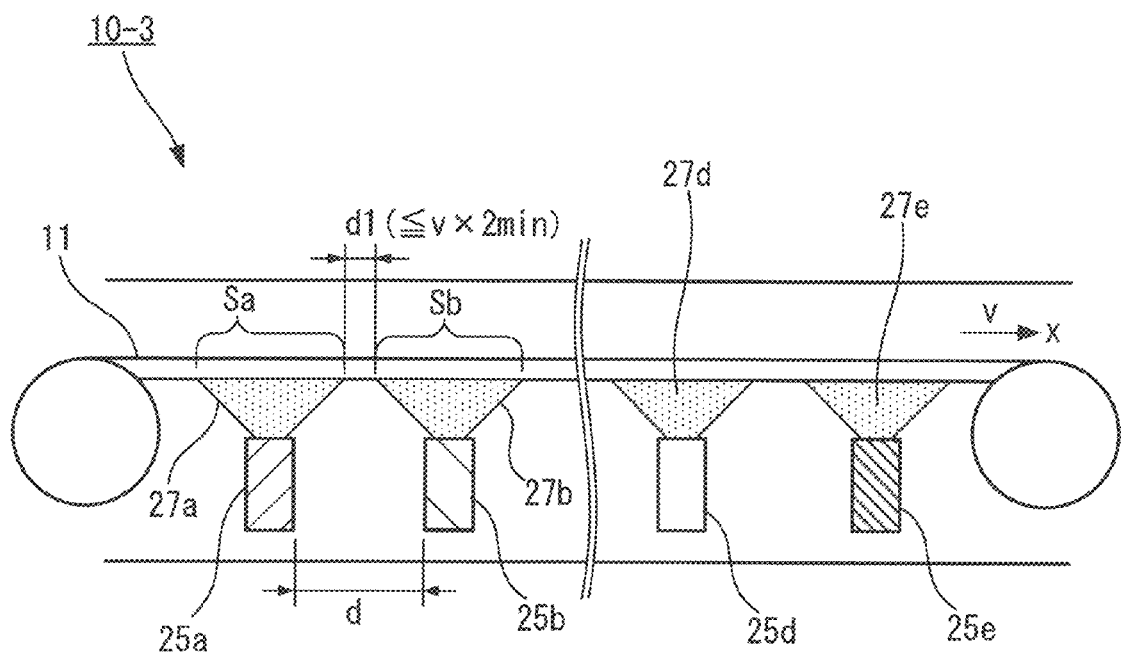
FIG. 10 is a schematic view showing a configuration of an electronic device manufacturing apparatus in a third embodiment.
Figure 11:
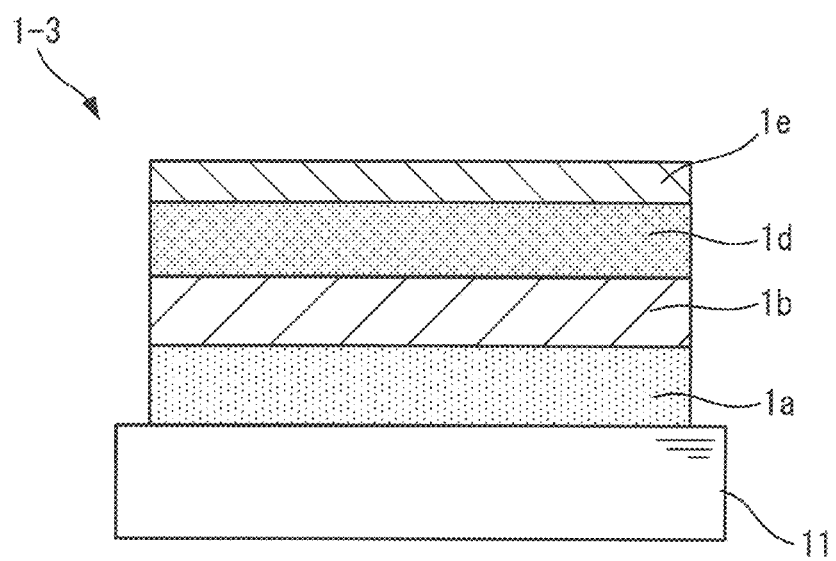
FIG. 11 is a schematic cross-sectional view of an electronic device (transparent electrode) produced by a manufacturing apparatus in a third embodiment.

FIG. 10 is a schematic view showing a configuration of an electronic device manufacturing apparatus in a third embodiment. Furthermore, FIG. 11 is a schematic cross-sectional view of an electronic device (transparent electrode 1-3) produced through the use of the manufacturing apparatus 10-3. Hereinafter, the configuration of the manufacturing apparatus 10-3 of the third embodiment will be explained on the basis of these drawings.

The manufacturing apparatus 10-3 shown in FIG. 10 is different from the manufacturing apparatus of the first embodiment explained using FIG. 1 in that other supply sources 25d and 25e are provided on the downstream side of the second supply source 25b, and the other configuration is the same as that of the first embodiment.

The other supply sources 25d and 25e are disposed on the side of the primary surface a side of the substrate 11 which is transferred by the holding member 23, and the supply source 25d and the supply source 25e are disposed in this order from the side of the second supply source 25b in the movement direction x. These supply sources 25d and 25e are fixed within the film formation chamber 20, and provided across the substrate in the width direction perpendicular to the movement direction x. Out of these supply sources, the supply source 25d on the upstream side is provided for supplying organic protection material 27d, for example, and the supply source 25e on the downstream side is provided for supplying inorganic protection material 27e. AS the organic protection material 27d, for example, a metal complex compound having a ligand of a quinoline derivative, or the above nitrogen-containing compound explained through the use of the general formula (1), the general formula (A) or the general formulas (A-1) to (A-4) is used. Furthermore, as the inorganic protection material 27e, for example, MgO, Al2O3, SiO2, SiN, SiON, TiO2, and the like are exemplified.

Each of these supply sources 25d and 25e may be, for example, a so-called heating boat for evaporation film formation, and has a configuration in which each of the material 27d and 27e placed within the boat is gasified by heating and is ejected toward the primary surface a of the substrate 11. Thereby, the supply source 25d is constituted for the formation of an organic protection film 1d over the primary surface a of the substrate 11 transferred by the holding member 23. On the other hand, the supply source 25e is constituted for the formation of an inorganic protection film 1e over the primary surface a of the substrate 11 transferred by the holding member 23. Meanwhile, any one of the supply sources 25d and 25e may be used. Each of these organic protection material 27d and the inorganic protection material 27e functions also as a light adjusting layer.

Also in such a configuration providing the supply sources 25d and 25e, the spacing d between the first supply source 25a and the second supply source 25b is the same as that in the first embodiment. That is, the spacing d is set so that the formation of the transparent electrode layer 1b by the second supply source 25b is started between starting the formation and two minutes, preferably one minute, after finishing the formation of the nitrogen-containing layer 1a by the first supply source 25a, at the prescribed position of the moving substrate 11. Then, the spacing d1 between the supply region Sa of the nitrogen-containing compound 27a and the supply region Sb of the electrode material 27b satisfies d1≤v×2 min (preferably d1≤v×1 min).

Meanwhile, as in the modification 2 (FIG. 4) of the first embodiment, the supply region Sa of the nitrogen-containing compound 27a and the supply region Sb of the electrode material 27b may overlaps each other partially, and the spacing d between the first supply source 25a and the second supply source 25b may be set as d1<0. Thereby, a co-evaporation film in which the nitrogen-containing compound 27a and the electrode material 27b are mixed may be formed between the nitrogen-containing layer 1a and the transparent electrode layer 1b, for the enhancement of adhesion of the nitrogen-containing layer 1a and the transparent electrode layer 1b.

<Transparent Electrode 1-3>

The transparent electrode 1-3 produced using the above manufacturing apparatus 10-3 of the third embodiment and the above materials has a laminated structure in which the nitrogen-containing layer 1a, the transparent electrode layer 1b, the organic protection layer 1d and the inorganic protection film 1e are laminated in this order. Furthermore, the transparent electrode layer 1b constituted including silver as a main component is a layer which is started to be formed between starting the formation and two minutes after finishing the formation of the nitrogen-containing layer 1a, and formed in a thickness of 12 nm or less.

<Effect of the Third Embodiment>

In the above explained manufacturing apparatus 10-3 of the third embodiment, it is possible to form the transparent electrode layer 1b mainly containing silver adjacent to the nitrogen-containing layer 1a constituted of the nitrogen-containing compound between starting the formation and two minutes after finishing the formation of the nitrogen-containing layer 1a. Thereby, it becomes possible to form the transparent electrode layer 1b mainly containing silver as a film which has an excellent electric conductivity while securing a high light transmitting property, as explained in the first embodiment.

Furthermore, subsequently to the formation of the transparent electrode layer 1b, the laminated organic protection film 1d and inorganic protection film 1e can be formed in the upper portion thereof. Thereby, it is possible to realize a configuration in which the transparent electrode layer 1b is covered by the organic protection film 1d and the inorganic protection film 1e without being exposed to a deterioration atmosphere such as the air, and it becomes possible to obtain the transparent electrode 1-3 in which deterioration is suppressed.

<<9. Modification of the Third Embodiment>>

Figure 12:
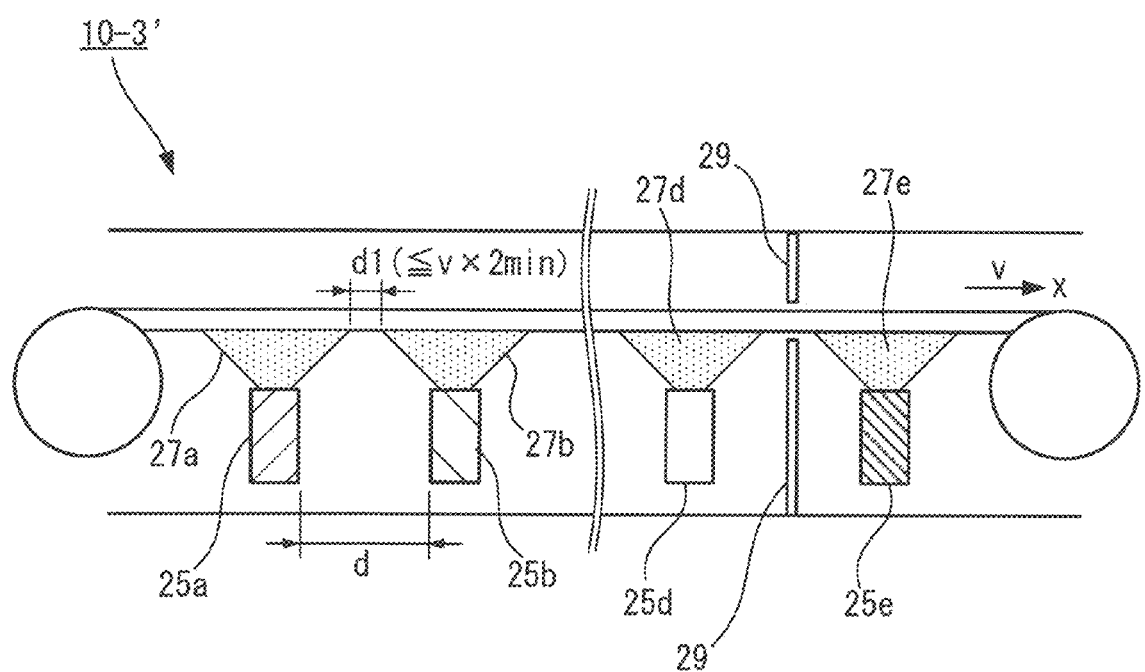
FIG. 12 is a schematic view showing a configuration of a modification in a third embodiment.

FIG. 12 is a schematic view for explaining a modification of the above electronic device manufacturing apparatus of the third embodiment. As shown in FIG. 12, the manufacturing apparatus 10-3' has a configuration in which the separation wall 29 is provided within the film formation chamber 20, and the other configuration is the same as that of the third embodiment.

The separation wall 29 is provided between, for example, the supply source 25d and the supply source 25e at a position where the organic protection material 27d from the supply source 25d and the inorganic protection material 27e from the supply source 25e are to be separated. As in the other embodiments, the separation wall 29 is provided in a state of not disturbing the transfer of the substrate 11 by the holding member 23. Meanwhile, the separation wall 29 is provided between the supply sources other than these supply sources as necessary.

In the manufacturing apparatus 10-3' like this in the modification, by providing the separation wall 29, it is possible to prevent cross-contamination of the organic protection material 27d and the inorganic protection material 27e within the film formation chamber 20. As a result, it becomes possible to protect the transparent electrode layer 1b by the organic protection film 1d and the inorganic protection film 27e each having a high barrier performance and an excellent protection performance.

<<10. Electronic Device Manufacturing Apparatus of a Fourth Embodiment>>

Figure 13:
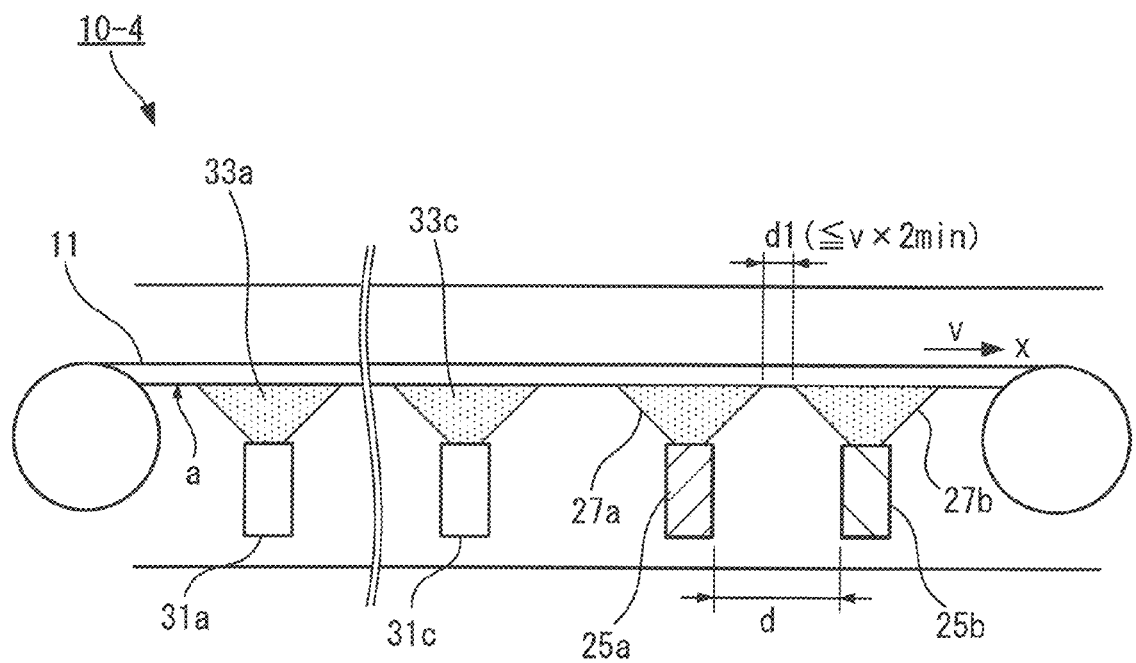
FIG. 13 is a schematic view showing a configuration of an electronic device manufacturing apparatus in a fourth embodiment.
Figure 14:
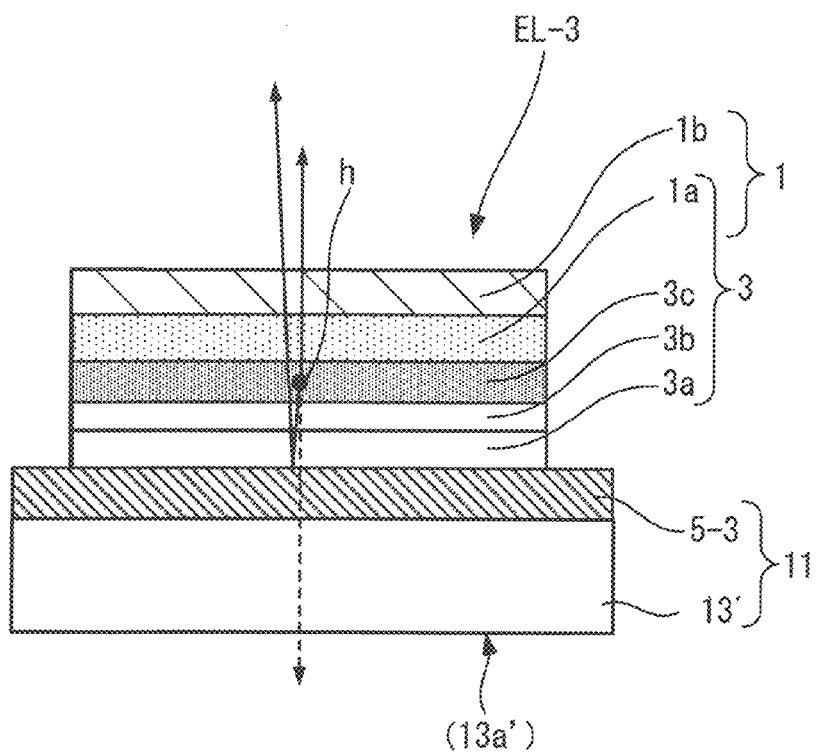
FIG. 14 is a schematic cross-sectional view of an electronic device (transparent electrode and organic electroluminescent element) produced by a manufacturing apparatus in a fourth embodiment.

FIG. 13 is a schematic view showing a configuration of an electronic device manufacturing apparatus of a fourth embodiment. Furthermore, FIG. 14 is a schematic cross-sectional view of an electronic device (organic electroluminescent element EL-3) produced using the manufacturing apparatus 10-4. Hereinafter, the configuration of the manufacturing apparatus 10-4 of the fourth embodiment will be explained on the basis of these drawings.

The manufacturing apparatus 10-4 shown in FIG. 13 is different from the manufacturing apparatus of the first embodiment explained using FIG. 1 in that other supply sources 31a, . . . , 31c are provided on the upstream side of the first supply source 25a, and the other configuration is the same as that of the first embodiment.

The other supply sources 31a, . . . , 31c are disposed on the primary surface a side of the substrate 11 which is transferred by the holding member 23, and are assumed here to supply materials constituting a light emission functional layer of an organic electroluminescent element in gas states. As to the supply sources 31a, . . . , 31c, for example, the supply source 31a for supplying a positive hole injection material 33a, a supply source for supplying a positive hole transport material which is omitted from illustration here, . . . , the supply source 31c for supplying a light emitting layer material 33c, and the like are disposed in the movement direcdion x of the substrate 11 in the lamination order of the light emission functional layer. Furthermore, these supply sources 31a, . . . , 31c are fixed within the film formation chamber 20 and provided in the width direction of the substrate 11, perpendicular to the movement direction x. Meanwhile, the materials for constituting the light emission functional layer which are explained in the above organic electroluminescent element EL-1 are used for details of the materials supplied from the respective supply sources 31a, ..., and 31c.

Each of these supply sources 31a, ..., 31c may be, for example, a so-called heating boat for evaporation film formation, and has a configuration in which each of the materials 33a, ..., 33c placed within the boat is gasified by heating and is ejected toward the primary surface a of the substrate 11. Thereby, the supply sources 31a, ..., 31c are constituted for the sequential formation of the layers constituting the light emission functional layer 3, that is, the positive hole injection layer 3a, the positive hole transport layer 3b, the light emitting layer 3c, and the like, on the primary surface a of the substrate 11 transferred by the holding member 23. Here, these supply sources 31a, ..., 31c may be disposed so that the material layers needed according to the layer configuration of the light emission functional layer 3 is formed sequentially from the side of the substrate 11.

Meanwhile, as the supply source 31c for supplying the light emitting layer material 33c, for example, the supply source for supplying plural kinds of material such as the host compound and the light emission dopant is assumed to be constituted to include the plural kinds of material. Thereby, plural kinds of material are constituted to be co-evaporated in a gas state in the same supply region.

Also in such a configuration providing the supply sources 31a, ..., 31c, the spacing d between the first supply source 25a and the supply source 25b which are disposed on the downstream side thereof is the same as that in the first embodiment. That is, the spacing d is set so that the formation of the transparent electrode layer 1b by the second supply source 25b is started between starting the formation and two minutes, preferably one minute, after finishing the formation of the nitrogen-containing layer 1a by the first supply source 25a, at the prescribed position of the moving substrate 11. In addition, the spacing d1 between the supply region Sa of the nitrogen-containing compound 27a and the supply region Sb of the electrode material 27b satisfies d1≤v×2 min (preferably d1≤v×1 min).

Furthermore, the nitrogen-containing compound 27a which has at least one of a high electron transportation capability and a high electron injection capability may be selected from the first supply source 25a, to thereby be used. Thereby, the nitrogen-containing layer 1a which has a high electron transportation capability and a high electron injection capability is formed as a constituent element of the light emission functional layer 3.

Meanwhile, here, a substrate in which a counter electrode 5-3 is formed over a substrate 13' is used as the substrate 11. As to the substrate 13', the same substrate as the substrate 11 explained in the first embodiment and the second embodiment is applied. Furthermore, the counter electrode 5-3, while being used as the anode in the example shown in the drawing, is used as the cathode when the lamination order of the light emission functional layer is reversed from the order shown in the drawing. For the counter electrode 5-3 like this, metal, an alloy, an organic or inorganic conductive compound, or a mixture thereof is used, and formed on the substrate 13' by a method such as evaporation and sputtering. Furthermore, the sheet resistance of the counter electrode 5-3 is preferably several hundreds of Ω/sq. or less, and the thickness is selected normally in a range of 5 nm to 5 μm, and preferably in a range of 5 nm to 200 nm.

Meanwhile, when the organic electroluminescent element EL-3 produced by the manufacturing apparatus 10-4 has a configuration in which the emitted light h is extracted also from the side of the counter electrode 5-3, a conductive material having a preferable light transmittance may be selected to be used from the above conductive materials as a material constituting the counter electrode 5-3. Furthermore, in this case, a material having a high light transmittance is used as the substrate 13', and a face directed outside in the substrate 13' serves as a light extraction face 13a'.

Furthermore, as in the modification 2 (FIG. 2) of the first embodiment, the spacing d between the first supply source 25a and the second supply source 25b may be set to satisfy d1<0 where the supply region Sa of the nitrogen-containing compound 27a and the supply region Sb of the electrode material 27b overlap each other partially. Thereby, the co-evaporation layer mixing the nitrogen-containing compound 27a and the electrode material 27b may be constituted to be formed between the nitrogen-containing layer 1a and the transparent electrode layer 1b, for the enhancement of adhesion of the nitrogen-containing layer 1a and the transparent electrode layer 1b.

Moreover, the separation wall may be provided at a required position between the supply sources for preventing the cross-contamination. Furthermore, the supply source explained in the third embodiment may be provided on the downstream side of the second supply source 25b for forming the protection film.

<Organic Electroluminescent Element EL-3>

The organic electroluminescent element EL-3 produced through the use of the above manufacturing apparatus 10-4 of the fourth embodiment and the above materials has a configuration in which the positive hole injection layer 3a, the positive hole transport layer 3b, the light emitting layer 3c, the nitrogen-containing layer 1a having a high electron transportation capability, and the transparent electrode later 1b are laminated in this order on the counter electrode 5-3 constituting the substrate 11. Thereby, the organic electroluminescent element EL-3 is produced as a top emission type device in which the emitted light h is extracted at least from the side of the transparent electrode 1 opposite to the substrate 13'. Furthermore, the transparent electrode layer 1b constituted including silver as a main component is formed having a thickness of 12 nm within two minutes after the formation of the nitrogen-containing layer 1a has been finished. Meanwhile, by constituting the counter electrode 5-3 used as the anode and the substrate 13' with the light-transmitting material, it is also possible to configure the organic electroluminescent element EL-3 as a double-sided light emission type in which the emitted light is extracted also from the side of the substrate 13'. In this case, the above transparent electrode 1 may be used as the counter electrode 5-3 having a high light transmitting property.

<Effect of the Fourth Embodiment>

In the above explained manufacturing apparatus 10-4 of the fourth embodiment, as in the other embodiments, it is possible to form the transparent electrode layer 1b mainly containing silver adjacent to the nitrogen-containing layer 1a constituted of the nitrogen compound between starting the formation and two minutes after finishing the formation of the nitrogen-containing layer 1a. Thereby, as explained in the other embodiments, it becomes possible to form the transparent electrode layer 1b mainly containing silver as a film having an excellent electric conductivity while securing a highlight transmittance. Accordingly, it is possible to realize a higher brightness by improving the light extraction efficiency of the emitted light h from the side of the transparent electrode 1, while realizing a high brightness in the organic electroluminescent element EL-3 by applying a sufficient voltage across the transparent electrode 1 and the counter electrode 5-3. Moreover, it becomes also possible to realize improvement of the light emission life by reducing the drive voltage for obtaining the prescribed brightness.

Furthermore, after the light emission functional layer 3 has been formed over the counter electrode 5-3 constituting the substrate 11, it is possible to form the nitrogen-containing layer 1*a* and the transparent electrode layer 1*b* continuously to the formation of the light emission functional layer 3. Thereby, it is possible to realize a configuration in which the light emission functional layer 3 constituted of organic materials is covered by the transparent electrode 1 without being exposed to a deterioration atmosphere such as the air, and it becomes possible to suppress the deterioration of the light emission functional layer 3 and to obtain the organic electroluminescent element EL-3 having a preferable life performance.

Meanwhile the above fourth embodiment may be further combined with the third embodiment and may provide other supply sources on the downstream side of the second supply source 25*b* for forming the transparent electrode layer 1*b*, for forming the organic protection film and the inorganic protection film, Thereby, it is possible to obtain the effect of the third embodiment.

Moreover, the manufacturing apparatus 10-4 of the fourth embodiment has the configuration in which the plural supply sources for forming the light emission functional layer 3 are disposed on the upstream side from the first supply source 25*a* for forming the nitrogen-containing layer 1*a*. However, the manufacturing apparatus of the present invention may have a configuration in which supply sources for forming the light emission functional layer 3 are disposed in a prescribed order on the downstream side of the second supply source 25*b* for forming the transparent electrode layer 1*b*. By constituting the manufacturing apparatus in this way, it is possible to form the light emission functional layer 3 on the transparent electrode layer 1*b* provided adjacent to the nitrogen-containing layer 1*a*.

Furthermore, a supply source for forming a counter electrode may be further provided on the downstream side of the supply source for forming the light emission functional layer 3. By constituting the manufacturing apparatus in this manner, it is possible to produce a bottom-emission type organic electroluminescent element in which the light emission functional layer 3 and the counter electrode are laminated in this order on the transparent electrode layer 1*b*, by continuous film formation processing.

Moreover, as the supply source for forming such a counter electrode, the above explained first supply source 25*a* and the second supply source 25*b* may be provided in the prescribed state, and thus it is possible to produce a double-sided light emission type organic electroluminescent element by continuous film formation processing.

<<11. Electronic Device Manufacturing Apparatus of a Fifth Embodiment>>

Figure 15:
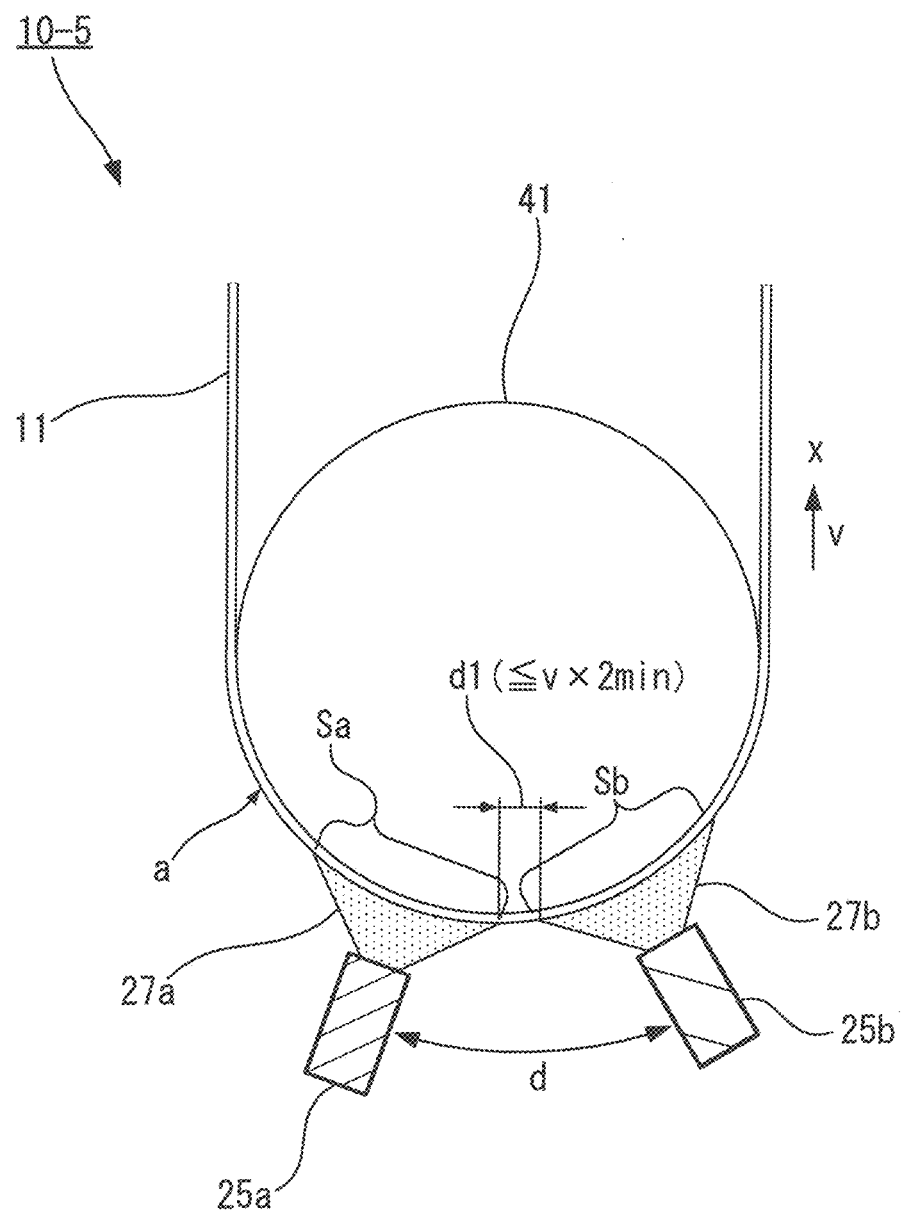
FIG. 15 is a schematic view showing a configuration of an electronic device manufacturing apparatus in a fifth embodiment.

FIG. 15 is a schematic view showing a configuration of an electronic device manufacturing apparatus in a fifth embodiment. Hereinafter, the manufacturing apparatus 10-5 in the fifth embodiment will be explained using FIG. 15.

The manufacturing apparatus 10-5 shown in FIG. 15 is different from the manufacturing apparatus of the first embodiment explained using FIG. 1 in that a holding member 41 of the substrate 11 is constituted to be a rotating cylindrical drum and the first supply source 25*a* and the second supply source 25*b* are disposed along the outside periphery thereof. The other configuration is the same as that of the first embodiment.

That is, the holding member 41 is a rotating cylindrical dram and holds the substrate 11 in a state of winding the substrate 11 at a part of the circumference thereof. The substrate 11 wounded on the holding member 41 moves along the cylindrical side periphery along with the rotation of the holding member 41, and the circumference direction becomes the movement direction x. For example, the holding member 41 like this is disposed between two roles which wind off and wind up the flexibly bendable elongated substrate 11. Then, the wind-up of the substrate 11 by the role becomes a drive source, and the substrate 11 wound off from one of the roles is constituted to move along the side circumference of the holding member 41 and wound up by the other role.

It is the same as in the other embodiments that the transfer of the substrate 11 like this in the movement direction x is performed in a speed of v. Furthermore, the speed v is also a movement speed relative to the first supply source 25*a* and the second supply source 25*b*.

The first supply source 25*a* and the second supply source 25*b* are disposed along a circumference concentric with the holding member 41 in the outer peripheral part along a side periphery of the holding member 41. These first supply source 25*a* and the second supply source 25*b* are disposed along the movement direction x of the substrate 11 held by the holding member 41.

The disposition state of the first supply source 25*a* and the second supply source 25*b* in the movement direction x of the substrate 11 is the same as that in the other embodiments. That is, the spacing d between the first supply source 25*a* and the second supply source 25*b* is set so that the formation of the transparent electrode layer by the supply of the electrode material 27*b* from the second supply source 25*b* is started between starting the formation and two minutes, preferably one minute, after finishing the formation of the nitrogen-containing layer by the supply of the nitrogen-containing compound 27*a* from the first supply source 25*a*, at a prescribed position of the moving substrate 11. In addition, the spacing d1 between the supply region Sa of the nitrogen-containing compound 27*a* and the supply region Sb of the electrode material 27*b* satisfies d1≤v×2 min (preferably d1≤v×1 min).

Furthermore, while omitted from illustration here, the above holding member 41, first supply source 25*a*, and second supply source 25*b* are disposed in the film formation chamber 20 constituted as a vacuum tank.

<Effect of the Fifth Embodiment>

Also in the above explained manufacturing apparatus 10-5 of the fifth embodiment, it is possible to form the transparent electrode layer 1*b* constituted of the electrode material 27*b* mainly containing silver adjacent to the nitrogen-containing layer constituted of the nitrogen-containing compound 27*a* between staring the formation and two minutes after finishing the formation of the nitrogen-containing layer. Thereby, in the same way as in the first embodiment, by using the manufacturing apparatus 10-5 of the present fifth embodiment, it becomes possible to form a transparent electrode layer which substantially functions as an electrode, as a film having a high continuity in spite of a thin film and thus as a film having an excellent electric conductivity while securing a highlight transmitting property.

The above explained manufacturing apparatus 10-5 of the fifth embodiment can have a configuration combined with the modifications 1 and 2 of the first embodiment, the other embodiments, and the modifications thereof. Thereby, it becomes possible to obtain all the effects obtained by the embodiments and the modifications thereof.

The above-explained embodiments and the modifications thereof explain the configuration in which the substrate 11 is transferred in the movement direction x by the holding member, and thus the substrate 11 and the supply sources are moved relatively. However, the relative movement of the substrate 11 and the supply sources may be constituted to be performed by the movement of the supply sources with respect to the fixed substrate 11. Also in such a configuration, it is possible to make the disposition state of the supply sources with respect to the substrate 11 which moves relatively to the supply sources the same as that in the above embodiments and modifications thereof, and thus it is possible to obtain the same effects as those of these embodiments and modifications thereof.

EXAMPLE

<<Production of Transparent Electrode>>

As will be explained in the following, transparent electrodes of samples 1-1 to 1-9 were produced so as to each have an area of a conductive region of 5 cm×5 cm.

In sample 1-1 to 1-9, as shown in following Table 1, the transparent electrodes were produced each having a laminated structure of a nitrogen-containing layer constituted of each compound and an upper electrode layer using silver.

In the production of the transparent electrodes in samples 1-1 to 1-3, the following compound 10 containing nitrogen is used as a compound constituting the nitrogen-containing layer. The compound 10 is a compound included in the general formula (3).

In the production of the transparent electrodes in samples 1-4 to 1-6, the following compound 94 containing nitrogen is used as a compound constituting the nitrogen-containing layer. The compound 94 is a compound included in the general formula (3).

In the production of the transparent electrodes in samples 1-7 to 1-9, the following compound 99 containing nitrogen is used as a compound constituting the nitrogen-containing layer. The compound 99 is a compound included in the general formula (1).

[Chem. 66]

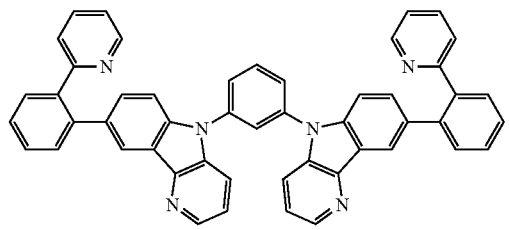

10

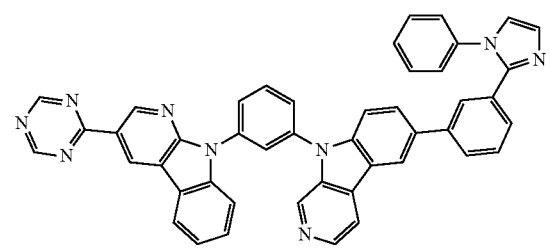

94

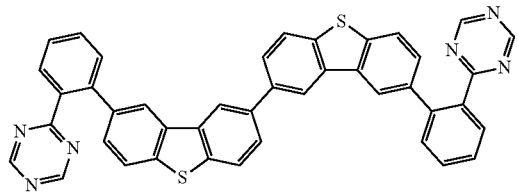

99

TABLE 1

| | Example configuration | | | Evaluation result | | |
|---|---|---|---|---|---|---|
| | | Electrode | Film | | | |
| Sample | Nitrogen-containing layer (Thickness 25 nm) Material | layer (Ag) Thickness (nm) | formation Period (min) | Light transmittance (at 550 nm) | Sheet resistance (Ω/sq.) | Remark |
| 1-1 | Compound 10 | 8 | 1 | 73% | 7.8 | Present invention (FIG. 16) |
| 1-2 | | | 2 | 71% | 8.1 | Present invention (FIG. 17) |
| 1-3 | | | 10 | 60% | 14.0 | Comparison (FIG. 18) |
| 1-4 | Compound 94 | 12 | 1 | 68% | 7.4 | Present invention (FIG. 19) |
| 1-5 | | | 2 | 66% | 7.6 | Present invention (FIG. 20) |
| 1-6 | | | 10 | 51% | 13.0 | Comparison (FIG. 21) |
| 1-7 | Compound 99 | 12 | 1 | 63% | 8.4 | Present invention (FIG. 22) |
| 1-8 | | | 2 | 60% | 8.8 | Present invention (FIG. 23) |
| 1-9 | | | 10 | 49% | 13.0 | Comparison (FIG. 24) |

<Production Sequence of the Transparent Electrodes in Samples 1-1 to 1-9>

A transparent alkali-free glass substrate was fixed to a substrate holder of the commonly available vacuum evaporation apparatus. In addition, in the production of the respective transparent electrodes, each of the aforementioned compounds 10, 94 and 99 was charged into a tantalum resistive heating boat. The substrate holder and the resistive heating boats were attached to a first vacuum tank in the vacuum evaporation apparatus. Furthermore, a tungsten resistive heating boat containing silver (Ag) was attached to a second vacuum tank.

In this state, after reducing a pressure of the first vacuum tank to 4×10−4 Pa, the heating boat containing the respective compound was heated by applying an electric current, and there was formed, on the substrate, a nitrogen-containing layer constituted of the respective compounds each having a thickness of 25 nm at a deposition speed of 0.3 nm/s.

Subsequently, the substrate obtained by forming the layers up to the nitrogen-containing layer was transferred to the second vacuum tank while being kept in a vacuum atmosphere, and after reducing a pressure of the second vacuum tank to 4×10−4 Pa, the heating boat containing silver was heated by applying an electric current. Therefore, the electrode layer constituted of silver having each thickness shown in the aforementioned Table 1 (8 nm or 12 nm) was formed adjacent to the nitrogen-containing layer, at a deposition speed of 0.02 nm/s. At this time, the formation of the electrode layer was carried out so that the interval between the formation of the nitrogen-containing layer and the subsequent formation of the electrode layer is each of the formation intervals (1 min, 2 min, and 10 min) shown in the aforementioned Table 1 and the process was carried out until the electrode layer was formed. That is, within a time of the formation period, the substrate obtained by forming the layers up to the nitrogen-containing layer was transferred from the first vacuum tank to the second vacuum tank, the depressurization of the second vacuum tank and the heating of the heating boat were performed, and formation of the electrode layer was performed. Therefore, there was obtained each of the transparent electrodes of sample 1-1 to 1-9 formed of a laminated structure of the nitrogen-containing layer and the electrode layer in the upper portion thereof.

<Evaluation-1 of Respective Samples in Example 1>

With respect to each of the transparent electrode of samples 1-1 to 1-9 produced above, the light transmittance was measured. Measurement of the light transmittance was performed by using a spectrophotometer system (U-3300 by Hitachi, Ltd.) and using the same substrate as the samples, as a baseline. The result is shown together in the above Table 1.

<Evaluation-2 of Respective Samples in Example 1>

With respect to each of the transparent electrode of samples 1-1 to 1-9 produced above, the light transmittance was measured. Measurement of the light transmittance was performed by using a spectrophotometer system (U-3300 by Hitachi, Ltd.) and by using the same substrate as the samples, as a baseline. The result is shown together in the above Table 1.

<Evaluation Result of Example 1>

In Table 1, samples 1-1 to 1-3, in which the material constituting the nitrogen-containing layer is compound 10 and the thickness of the electrode layer is 8 nm, are compared with one another. In each of the transparent electrodes of samples 1-1 and 1-2 which has a film formation period not longer than two minutes between the nitrogen-containing layer and the electrode layer according to the present invention, the light transmittance is high as not lower than 70% and the sheet resistance is suppressed as smaller than 10 Ω/sq. On the other side, in the transparent electrode of sample 1-3 which has a film formation period of 10 minutes between the nitrogen-containing layer and the electrode layer outside the range of the present invention, the light transmittance is 60% and the sheet resistance exceeds 10 Ω/sq.

Furthermore, in Table 1, samples 1-4 to 1-6, in which the material constituting the nitrogen-containing layer is compound 94 and the thickness of the electrode layer is 12 nm, are compared with one another. In each of the transparent electrodes of samples 1-4 and 1-5 which has a film formation period not longer than two minutes between the nitrogen-containing layer and the electrode layer according to the present invention, the light transmittance is high as higher than 65% and the sheet resistance is suppressed as smaller than 10 Ω/sq. On the other side, in the transparent electrode of sample 1-6 which has a film formation period of 10 minutes between the nitrogen-containing layer and the electrode layer outside the range of the present invention, the light transmittance is approximately 50% and the sheet resistance exceeds 10 Ω/sq.

Furthermore, in Table 1, samples 1-7 to 1-9, in which the material constituting the nitrogen-containing layer is compound 99 and the thickness of the electrode layer is 12 nm, are compared with one another. In each of samples 1-7 and 1-8 which has a film formation period not longer than two minutes between the nitrogen-containing layer and the electrode layer according to the present invention, the light transmittance is high as not lower than 60% and the sheet resistance is suppressed as smaller than 10 Ω/sq. On the other side, the transparent electrode of sample 1-9 which has a film formation period of 10 minutes between the nitrogen-containing layer and the electrode layer outside the range of the present invention, the light transmittance is not higher than 50% and the sheet resistance exceeds 10 Ω/sq.

Moreover, as a result of whole Table 1, when the material constituting the nitrogen-containing layer is the same, as the film formation period between the nitrogen-containing layer and the electrode layer is shorter, the sheet resistance is lower and the light transmittance is higher. Furthermore, each of samples 1-4 and 1-5 which use compound 94 corresponding to the general formula (3) for the nitrogen-containing layer has a higher light transmittance and also a higher sheet resistance than the samples 1-7 and 1-8 which use compound 99 corresponding to the general formula (1) for the nitrogen-containing layer.

From the above, in the transparent electrode which has a film formation period of within two minutes between the nitrogen-containing layer and the electrode layer according to the present invention, the light transmittance is not lower than 50% and the sheet resistance is smaller than 10 Ω/sq. Accordingly, it is confirmed that, although the electrode layer constituting the transparent electrode of the present invention is a thin film having a thickness of 12 nm or less, a high continuity is secured and thereby the transparent electrode of the present invention has a high transmittance and a high conductivity.

Furthermore, FIG. 16 to FIG. 24 show SEM images (magnification: ×50,000) of the transparent electrodes in samples 1-1 to 1-9. The correspondence relationship between samples 1-1 to 1-9 and FIG. 16 to FIG. 24 is as shown in above Table 1.

First, when FIG. 16 to FIG. 18 corresponding to samples 1-1 to 1-3 among which only the film formation period is different are compared with one another, as explained in the following, it is clear that the film formation state of silver constituting the electrode layer is different depending on the film formation period between the nitrogen-containing layer and the electrode layer. In the transparent electrode of sample 1-1 shown in FIG. 16 which has a film formation period of one minute between the nitrogen-containing layer and the electrode layer according to the present invention, silver constituting the electrode layer provided adjacent to the nitrogen-containing layer is connected. Furthermore, similarly also in the transparent electrode of sample 1-2 shown in FIG. 17 which has a film formation period of two minutes between the nitrogen-containing layer and the electrode layer according to the present invention, silver constituting the electrode layer provided adjacent to the nitrogen-containing layer is connected. Moreover, the transparent electrode of sample 1-1 shown in FIG. 16 has a less part which is not covered by the silver (part shown in black in the drawing), and has a higher continuity of the silver constituting the electrode (part shown in white in the drawing) than those of the transparent electrode of sample 1-2 shown in FIG. 17. On the other side, in the transparent electrode of sample 1-3 shown in FIG. 18 which has a film formation period of 10 minutes between the nitrogen-containing layer and the electrode layer outside the range of the present invention, silver constituting the electrode layer provided adjacent to the nitrogen-containing layer has a low continuity. Moreover, parts which are not covered by the silver are found in an outstanding manner.

Furthermore, when FIG. 19 to FIG. 21 showing the SEM images (magnification: ×50,000) of the transparent electrodes of samples 1-4 to 1-6 among which only the film formation period is different are compared with one another, the film formation state of silver constituting the electrode layer is different depending the time of the film formation period between the nitrogen-containing layer and the electrode layer in the same way as in above FIG. 16 to FIG. 18. In the same way as this, also when the SEM images (magnification: ×50,000) of the transparent electrodes of samples 1-7 to 1-9 among which only the film formation period is different are compared with one another, the film formation state of silver constituting the electrode layer is different depending on the time of the film formation period between the nitrogen-containing layer and the electrode layer in the same way as in above FIG. 16 to FIG. 18.

From these results, it is confirmed that, in the transparent electrode which has a film formation period not longer than two minutes between the nitrogen-containing layer and the electrode layer according to the present invention, the electrode layer adjacent to the nitrogen-containing layer is formed in a film growth type more close to Frank-van der Merwe (FM) type (mono-layer growth type) than to film growth through Volumer-Weber (VW) type (nucleas growth type).

Furthermore, if the material constituting the nitrogen-containing layer provided adjacent to the electrode layer is the same, it is confirmed that, the shorter the film formation period between the nitrogen-containing layer and the electrode layer is, the more uniformly silver constituting the electrode layer (part indicated in white in the drawing) is connected and the continuity thereof is higher.

From the above, it is confirmed that, through the use of the manufacturing apparatus of the present invention, capable of forming the transparent electrode layer 1*b* mainly containing silver between stating the formation and two minutes after finishing the formation of the nitrogen-containing layer 1*a*, adjacent to the nitrogen-containing layer 1*a* constituted of the nitrogen-containing compound, it becomes possible to form the transparent electrode having a sufficiently high conductivity and light transmittance.

REFERENCE SIGNS LIST

1, 1-2, 1-3 . . . Transparent electrode (Electronic device), 1*a* . . . Nitrogen-containing layer, 1*b* . . . Transparent electrode layer, 10-1, 10-1', 10-1", 10-2, 10-2', 10-3, 10-3', 10-4, 10-5 . . . Manufacturing apparatus (Electronic device manufacturing apparatus), 11 . . . Substrate, 23 . . . Holding member, 25*a* . . . First supply source, 25*b* . . . Second supply source, 25*d*, 25*e*, 31*a*, 31*c* . . . Supply source, 27*a* . . . Nitrogen-containing compound, 27*b* . . . Electrode material, 33*a* . . . Positive hole injection material (Light emitting functional material), 33*c* . . . Light emitting layer material (Light emitting functional material), d . . . Spacing (Supply source), d1 . . . Spacing (Supply region), v . . . Speed, x . . . Movement direction, LE-1, LE-2, LE-3 . . . Organic electroluminescent element (Electronic device)

The invention claimed is:

1. An electronic device manufacturing apparatus, comprising:

a holding member holding a substrate having a primary surface on which an electronic device is to be formed;

a first supply source provided on a primary surface side of the substrate held by the holding member and configured to include an evaporation film formation heating boat and form a nitrogen-containing layer on the primary surface of the substrate held by the holding member by heating a nitrogen-containing compound contained in the heating boat so as to be gasified and ejecting the gasified nitrogen-containing compound toward the primary surface of the substrate so as to be deposited thereon; and a second supply source provided on the primary surface side of the substrate held by the holding member and configured to include an evaporation film formation heating boat and form a transparent electrode layer on the primary surface side of the substrate by heating an electrode material mainly containing silver contained in the heating boat so as to be gasified and ejecting the gasified electrode material toward the primary surface of the substrate, wherein the substrate held by the holding member and each of the first supply source and the second supply source are configured to be relatively moved, the second supply source is provided on a downstream side of the first supply source in a relative movement direction of the substrate held by the holding member, and spacing between the first supply source and the second supply source is set so that formation of a transparent electrode layer at a prescribed position on the substrate is started after starting formation of a nitrogen-containing layer at the prescribed position on the substrate and before an elapse of two minutes after finishing the formation of the nitrogen-containing layer at the prescribed position, such that the transparent electrode layer having a relatively higher continuity is formed at the predetermined position on the primary surface of the substrate via the nitrogen-containing layer.

2. The electronic device manufacturing apparatus according to claim 1, wherein a relative movement speed between the substrate held by the holding member and each of the first supply source and the second supply source is set to a speed at which the transparent electrode layer is formed in a thickness of 12 nm or less.

3. The electronic device manufacturing apparatus according to claim 1, wherein when a relative movement speed between the substrate held by the holding member and each of the first supply source and the second supply source is v, the first supply source and the second supply source are disposed so that spacing d1 between a supply region of the gasified nitrogen-containing compound and a supply region of the gasified electrode material on the primary surface of the substrate holds $d1 \leq v \times 2$ minutes.

4. The electronic device manufacturing apparatus according to claim 1, further comprising
another supply source provided on the primary surface side of the substrate held by the holding member and configured to include an evaporation film formation heating boat and form a light emitting functional layer on the primary surface side of the substrate by heating a light emitting functional material contained in the heating boat so as to be gasified and ejecting the gasified light emitting functional material toward the primary surface side of the substrate, wherein the another supply source is provided at least on one of an upstream side of the first supply source in the relative movement direction of the substrate held by the holding member and a downstream side of the second supply source in the relative movement direction of the substrate.

5. The electronic device manufacturing apparatus according to claim 1, wherein
the holding member holds the substrate along a circumference thereof, and
the first supply source and the second supply source are disposed along another circumference concentric with the circumference of the holding member.

6. The electronic device manufacturing apparatus according to claim 1, further comprising a film formation chamber that houses the first supply source, the second supply source, and the holding member, and that can be put into a reduced pressure state inside thereof.

* * * * *